(12) United States Patent
Harmon

(10) Patent No.: US 10,529,884 B2
(45) Date of Patent: Jan. 7, 2020

(54) VIRTUAL NEGATIVE BEVEL AND METHODS OF ISOLATING ADJACENT DEVICES

(71) Applicant: LightSpin Technologies Inc., Endicott, NY (US)

(72) Inventor: Eric Harmon, Norfolk, MA (US)

(73) Assignee: LightSpin Technologies Inc., Endicott, NY (US)

( * ) Notice: Subject to any disclaimer, the term of this patent is extended or adjusted under 35 U.S.C. 154(b) by 118 days.

(21) Appl. No.: 15/808,605

(22) Filed: Nov. 9, 2017

(65) Prior Publication Data
US 2019/0140128 A1    May 9, 2019

(51) Int. Cl.
| | | |
|---|---|---|
| H01L 31/00 | (2006.01) | |
| H01L 27/14 | (2006.01) | |
| H01L 31/107 | (2006.01) | |
| H01L 31/18 | (2006.01) | |
| H01L 31/02 | (2006.01) | |
| H01L 27/142 | (2014.01) | |
| H01L 27/146 | (2006.01) | |
| H01L 27/144 | (2006.01) | |
| H01L 31/0352 | (2006.01) | |

(52) U.S. Cl.
CPC ............ *H01L 31/107* (2013.01); *H01L 27/14* (2013.01); *H01L 27/142* (2013.01); *H01L 27/146* (2013.01); *H01L 27/1443* (2013.01); *H01L 31/02027* (2013.01); *H01L 31/035272* (2013.01); *H01L 31/18* (2013.01)

(58) Field of Classification Search
CPC ..... H01L 27/14; H01L 27/146; H01L 27/142; H01L 31/107; H01L 31/18; H01L 27/1443; H01L 31/035272; H01L 31/02027
See application file for complete search history.

(56) References Cited

U.S. PATENT DOCUMENTS

| | | |
|---|---|---|
| 4,173,723 A | 11/1979 | Temes et al. |
| 4,341,570 A | 7/1982 | Landreau et al. |
| 4,403,397 A | 9/1983 | Bottka et al. |
| 4,539,743 A | 9/1985 | Anthony et al. |

(Continued)

FOREIGN PATENT DOCUMENTS

| | | |
|---|---|---|
| EP | 0025749 A1 | 3/1981 |
| EP | 0869561 A2 | 10/1998 |

(Continued)

OTHER PUBLICATIONS

G.E. Bulman et al., "Proton isolated In(0.2)Ga(0.8)As/GaAs strained-layer superlattice avalanche photodiode", Appl. Phys. Lett., Apr. 14, 1986, p. 1015-1017, vol. 48, Issue 15, American Institute of Physics.

(Continued)

*Primary Examiner* — Savitri Mulpuri
(74) *Attorney, Agent, or Firm* — Intrinsic Law Corp.

(57) ABSTRACT

This disclosure is directed to devices and systems and methods comprising virtual negative beveled facets including to isolate adjacent devices from one another. Aspects hereof are directed to integrated photon detectors or photodetector devices incorporating implant isolation mesas and resistors, and in particular to methods and structures for isolating such detectors or devices from neighboring detectors or devices.

11 Claims, 43 Drawing Sheets

(56) References Cited

U.S. PATENT DOCUMENTS

| | | | |
|---|---|---|---|
| 5,204,520 | A | 4/1993 | Green |
| 5,223,704 | A | 6/1993 | Hui et al. |
| 5,329,112 | A | 7/1994 | Mihara |
| 5,349,174 | A | 9/1994 | Van Berkel et al. |
| 5,866,936 | A | 2/1999 | Hasnain et al. |
| 5,914,499 | A | 6/1999 | Hermansson et al. |
| 6,753,214 | B1 | 6/2004 | Brinkmann et al. |
| 7,943,406 | B2 | 5/2011 | Slater, Jr. et al. |
| 8,279,411 | B2 | 10/2012 | Yuan et al. |
| 8,768,211 | B2 * | 7/2014 | Hayashi ............ G03G 15/0121 399/119 |
| 9,029,772 | B2 | 5/2015 | Pavlov |
| 9,076,707 | B2 | 7/2015 | Harmon |
| 9,627,569 | B2 * | 4/2017 | Harmon ............ H01L 27/14643 |
| 2004/0169991 | A1 | 9/2004 | Nagata et al. |
| 2004/0188793 | A1 | 9/2004 | Lindemann et al. |
| 2004/0245592 | A1 | 12/2004 | Harmon et al. |
| 2005/0078725 | A1 | 4/2005 | Wang |
| 2007/0085158 | A1 | 4/2007 | Itzler et al. |
| 2008/0164554 | A1 | 7/2008 | Itzler et al. |
| 2008/0220598 | A1 | 9/2008 | Ben-Michael et al. |
| 2010/0091162 | A1 | 4/2010 | Chuang et al. |
| 2010/0127314 | A1 | 5/2010 | Frach |
| 2011/0024768 | A1 | 2/2011 | Veliadis |
| 2011/0079727 | A1 | 4/2011 | Prescher et al. |
| 2011/0272561 | A1 | 11/2011 | Sanfilippo et al. |
| 2012/0009727 | A1 | 1/2012 | Itzler |
| 2013/0022077 | A1 | 1/2013 | Harmon et al. |
| 2013/0099100 | A1 | 4/2013 | Pavlov |
| 2013/0207217 | A1 | 8/2013 | Itzler |
| 2013/0230339 | A1 | 9/2013 | Ogihara et al. |
| 2014/0312448 | A1 | 10/2014 | Harmon |
| 2015/0270430 | A1 | 9/2015 | Harmon |

FOREIGN PATENT DOCUMENTS

| | | |
|---|---|---|
| JP | 61199675 | 9/1986 |
| WO | WO2011117309 A2 | 9/2011 |
| WO | WO2014172697 A1 | 10/2014 |

OTHER PUBLICATIONS

J.C. Campbell, "Recent Advances in Telecomunications Avalanche Photodiodes", Journal of Lightwave Technology, Jan. 2007, p. 109-121, vol. 25, No. 1, IEEE.

G. Collazuol, "The SiPM Physics and Technology—a Review", PhotoDet, Jun. 2012.

S. Cova et al., "Evolution and prospects for single-photon avalanche diodes and quenching circuits", Journal of Modern Optics, Jun.-Jul. 2004, p. 1267-1288, vol. 51, No. 9-10, Taylor & Francis Group.

I. Danilov et al., "Electrical isolation of InGaP by proton and helium ion irradiation", Journal of Applied Physics, Oct. 15, 2002, p. 4261-4265, vol. 92, No. 8, American Institute of Physics.

T. Frach et al., "The Digital Silicon Photomultiplier—System Architecture and Performance Evaluation", Nov. 13, 2010, p. 1722-1727, IEEE.

Y. Liu et al., "A Planar InP/InGaAs Avalanche Photodiode with Floating Guard Ring and Double Diffused Junction", Journal of Lightwave Technology, Feb. 1992, p. 182-193,vol. 10, No. 2, IEEE.

S.J. Pearton, "Ion Implantation for Isolation of III-V Semiconductors", Materials Science Reports, 1990, p. 313-367, vol. 4, Elsevier Science Publishers B.V., North-Holland, Amsterdam.

I. Sandall et al., "Planar InAs photodiodes fabricated using He ion implantation", Optics Express, Apr. 9, 2012, vol. 20, No. 8, OSA.

S. Seifert et al., "Simulation of Silicon Photomultiplier Signals", IEEE Transactions on Nuclear Science, Dec. 2009, p. 3726-3733, vol. 56, No. 6, IEEE.

A.G. Stewart et al., "Performance of 1-mm(2) Silicon Photomultiplier", IEEE Journal of Quantum Electronics, Feb. 2008, p. 157-164, vol. 44, No. 2, IEEE.

W. Sul et al., "Guard-Ring Structures for Silicon Photomultipliers", IEEE Electron Device Letters, Jan. 2010, p. 41-43, vol. 31, No. 1, IEEE.

S. Tisa et al., "Electronics for single photon avalanche diode arrays", Sensors and Actuators, 2007, p. 113-122, vol. 140, Elsevier B.V.

Q. Zhou et al., "Proton-Implantation-Isolated 4H-SiC Avalanche Photodiodes", IEEE Photonics Technology Letters, Dec. 1, 2009, p. 1734-1736, vol. 21, No. 23, IEEE.

Q. Zhou et al., "Proton-Implantation-Isolated Separate Absorption Charge and Multiplication 4H-SiC Avalanche Photodiodes", IEEE Photonics Technology Letters, Mar. 1, 2011, p. 299-301, vol. 23, No. 5, IEEE.

ISA/US, "International Search Report for App. No. PCT/US14/34762", dated Aug. 22, 2014, WIPO.

V. Saveliev et al., "Silicon avalanche photodiodes on the base of metal-resistor-semiconductor (MRS) Structures", Nuclear Instruments & Methods in Physics Research, 2000, p. 223-229. Section A, No. 442, Elsevier Science B.V.

Z. Y. Sadygov et al., "Avalanche Semiconductor Radiation Detectors", 1996, p. 460-464.

F. Zappa et al., "Impact of Local-Negative-Feedback on the MRS Avalanche Photodiode Operation", IEEE Transactions on Electron Devices, Jan. 1998, p. 91-97, vol. 45, No. 1, IEEE.

A. Khodin et al., "Silicon Avalanche Photodiodes Array for Particle Detector: Modelling and Fabrication", Jun. 2000.

U.S. ISA, "International Search Report—App. No. PCT/US15/29410", dated Sep. 29, 2015, WIPO.

A. Shuja, "Implant Isolation of Gallium Arsenide—Thesis presented to the Dept. of Electronic and Electrical Engineering, University of Surrey", May 2002, University of Surrey.

A. Henkel et al., "Boron Implantation into GaAs/Ga(0.5)In(0.5)P Heterostructures", Jpn. J. Appl. Phys., Jan. 1997, p. 175-180, vol. 36.

S. Daliento et al., "Helium implantation in silicon: detailed experimental analysis of resistivity and lifetime profiles function of the implantation dose and energy", Proceedings of the 18th International Symposium on Power Semiconductor Devices & ICs, Jun. 2006, IEEE.

H. E. M. Peres et al., "High Resistivity Silicon Layers Obtained by Hydrogen Ion Implantation", Brazilian Journal of Physics, Dec. 1997, p. 237-239, vol. 27/A.

C. Carmody et al., "Ultrafast trapping times in ion implanted InP", Journal of Applied Physics, Sep. 2002, p. 2420-23, vol. 92, No. 5, American Institute of Physics.

P. N. K. Deenapanray et al., "Implant isolation of Zn-doped GaAs epilayers: Effects of ion species, doping concentration, and implantation temperature", Journal of Applied Physics, Jun. 2003, p. 9123-29, vol. 93, No. 11, American Institute of Physics.

J. P. De Souza et al., "Electrical isolation in GaAs by light ion irradiation: The role of antisite defects", Appl. Phys. Lett, Jan. 1996, p. 535-537, vol. 68, No. 4, American Institute of Physics.

J. P. De Souza et al., "Thermal stability of the electrical isolation in n-type gallium arsenide layers irradiated with H. He, and B ions", J. Appl. Phys., Jan. 1997, p. 650-655, vol. 81, No. 2, American Institute of Physics.

A. R. Bratschun et al., "A Study of Implant Damage and Isolation Properties in an InGaP HBT Process", CS MANTECH Conference, May 2011.

P. Too et al., "Electrical isolation of n-type InP layers by helium implantation at variable substrate temperatures", Nuclear Instruments and Methods in Physics Research, 2002, p. 205-209, No. B188, Elsevier Science B.V.

C. Huang et al., "Implant Isolation of Silicon Two-Dimensional Electron Gases at 4.2 K", IEEE Electron Device Letters, Jan. 2013, p. 21-23, vol. 34, No. 1, IEEE.

P. Whiting, "Investigation of defects formed by ion implantation of H2+ into silicon", RIT Scholar Works Thesis/Dissertation Collection, 2009, Rochester Institute of Technology.

E. Wendler et al., "Empirical modeling of the cross section of damage formation in ion implanted III-V semiconductors", Appl. Phys. Lett., 2012, 100/192108, American Institute of Physics.

(56) References Cited

OTHER PUBLICATIONS

M. Mikulics et al., "GaAs photodetectors prepared by high-energy and high-dose nitrogen implantation", Applied Physics Letters, Sep. 2006, 89/091103, American Institute of Physics.
S. J. Pearton et al., "Ion implantation doping and isolation of In0.5Ga0.5P", Appl. Phys. Lett., Sep. 1991, p. 1467-69, vol. 59, No. 12, American Institute of Physics.
S. Ahmed et al., "Electrical isolation of n-type GaAs devices by MeV/MeV-like implantation of various ion species", 2002, p. 18-23, IEEE.
S. Ahmed et al., "Implant isolation in GaAs device technology: Effect of substrate temperature", Nuclear Instruments and Methods in Physics Research, 2002, p. 196-200, B188, Elsevier Science B.V.
W. J. Kindt, "A Novel Avalanche Photodiode Array", Nuclear Science Symposium and Medical Imaging Conference, Oct. 30, 1994, pp. 164-167, vol. 1, IEEE, USA.
European Patent Office, "Extended European Search Report—App. No. 14784905.3", dated Dec. 6, 2016, EPO.
C. Veerappan et al., "CMOS SPAD Based on Photo-Carrier Diffusion Achieving PDP >40% From 440 to 580 nm at 4V Excess Bias", IEEE Photonics Technology Letters, Dec. 1, 2015, pp. 2445-2448, vol. 27, No. 23, IEEE.

\* cited by examiner

VIRTUAL NEGATIVE BEVEL AND METHODS OF ISOLATING ADJACENT DEVICES

TECHNICAL FIELD

This disclosure is directed to integrated photon detectors or photodetector devices incorporating implant isolation and resistors, and in particular to methods and structures for isolating such detectors or devices from neighboring detectors or devices, and methods and structures for fabricating the resistors.

BACKGROUND

Avalanche Photodiodes (APDs) are photodetectors that use avalanche multiplication to achieve internal gain. Single photon avalanche photodiodes (SPADs) are a specific class of avalanche photodiodes that are capable of detecting single photons.

Prior art APD arrays have also used various techniques for isolating adjacent APD elements. For example, PN junction isolation and mesa isolation are known in the prior art. PN junction isolation is generally achieved by confining the lateral extent of doping to separate p-type regions (on an n-type substrate) or n-type regions (on a p-type substrate) or both. Edge effects in isolated devices with positive bevel angles often results in electrical field crowding along the perimeter of the APD device, as illustrated in FIG. 43, which would normally cause a non-uniform avalanche gain profile. Edge effects in isolated devices are mitigated through the use of double-diffused structures, guard ring structures, or other approaches well known in the state of the art. See, for example, Y. Liu, S. R. Forrest, J. Hladky, M. J. Lange, G. H. Olsen, and D. E. Ackley, "A Planar InP/InGaAs Avalanche Photodiode with Floating Guard Ring and Double Diffused Junction," J. Lightwave Technology, v. 10(2) February 2991, and Chapter 3: Breakdown Voltage in Power Semiconductor Devices, Pp. 67-127 by B. J. Baliga, PWS Publishing Company, Boston, Mass. 1996, which are hereby incorporated by reference.

Mesa isolation uses etching to remove semiconductor material from either the p-type region, the n-type region, or both regions of the device. Etching can consist of wet chemical etching using acidic or basic solutions, reactive ion etching, polishing, or any other technique that removes a portion of the semiconductor material between devices.

Another approach to isolating adjacent APD elements uses implant isolation to achieve a virtual positive bevel as described in U.S. Pat. No. 9,076,707, which is hereby incorporated by reference. In this case, etching is not used, but rather implant isolation is used to convert the region in the exterior of the virtual mesa from a highly conductive state to a lower conductivity state, as disclosed in U.S. Pat. No. 9,076,707. Implant isolation can be achieved by implanting a compensating dopant (such as implanting n-type dopant ions into a p-type region or implanting p-type dopant ions into a n-type region) or through the introduction of deep levels states. Deep level states can be achieved by the implantation of ions known to form deep level defects (e.g. oxygen into silicon), or by the implantation of neutral atoms (such as $H^+$ or $He^+$), where the implantation process causes crystalline damage to the semiconductor, introducing deep level states. Herein we will use the term implant isolation unless the application requires a specific type of implant isolation (compensating implant vs deep level implant).

For the specific case where the isolated devices operate near the condition of avalanche breakdown, one of the known techniques for isolating adjacent APD elements is to use a positive bevel mesa isolation, where the upper semiconductor layer is lightly doped (e.g., N−) and the lower semiconductor layer is highly doped (e.g., P++). There is a need for techniques to isolate adjacent devices operated near the condition of avalanche breakdown using a negative bevel, in which the upper semiconductor layer is highly doped (e.g., P++) and the lower semiconductor layer is lightly doped (e.g., N−).

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

In an aspect, the invention is directed to a semiconductor device comprising: a substrate layer; a first semiconductor layer doped with a first dopant disposed above said substrate layer and a second semiconductor layer doped with a second dopant, the second semiconductor layer disposed on said first semiconductor layer, said first dopant having a first dopant type opposite to a second dopant type of said second dopant; said first and second semiconductor layers being ion implanted with first ions in selected regions thereof, said first ions forming defined first implant isolated regions, wherein an unimplanted region is disposed between said first implant isolated regions; a first contact disposed above said first implanted regions of said second semiconductor layer; and a second contact disposed to contact said first semiconductor layer or said substrate layer.

In one or more embodiments, said second semiconductor layer is truncated, thereby isolating said semiconductor device from neighboring semiconductor devices. In one or more embodiments, said truncated second semiconductor layer is formed by etching. In one or more embodiments, said truncated second semiconductor layer is formed by implant isolation.

In one or more embodiments, said second semiconductor layer is ion implanted with second ions to form defined second implanted regions in a portion of each first implanted region. In one or more embodiments, each second implanted region is disposed between said unimplanted region and said respective contact. In one or more embodiments, each said second implanted region forms a resistor and a portion of a bypass capacitor, the resistor and bypass capacitor in parallel electrically with each other. In one or more embodiments, said second implanted regions are insulating. In one or more embodiments, a patterned metal or resistor layer is disposed between each contact and said unimplanted region of said second semiconductor layer. In one or more embodiments, said first and second implanted regions in said second semiconductor layer form a guard ring.

In one or more embodiments, said first semiconductor layer comprises an N− material and said second semiconductor layer comprises a P++ material. In one or more embodiments, said first semiconductor layer comprises a P− material and said second semiconductor layer comprises an N++ material. In one or more embodiments, the first implanted regions are implanted at negative bevel angles with respect to a planar bottom surface of said first semiconductor layer, said planar bottom surface proximal to said substrate layer, whereby said unimplanted region forms a virtual negative bevel mesa structure having angled side profiles.

Another aspect of the invention is directed to a semiconductor device comprising: a substrate layer; a first semiconductor layer doped with a first dopant disposed above said substrate layer and a second semiconductor layer doped with a second dopant, the second semiconductor layer disposed on said first semiconductor layer, said first dopant having a first dopant type opposite to a second dopant type of said second dopant; said first semiconductor layer being ion implanted with ions in selected regions thereof, said ions forming defined first and second implanted regions, wherein an unimplanted region is disposed between said first and second implanted regions; said second semiconductor layer being disposed only on said unimplanted region of said first semiconductor layer; a resistor or metal layer disposed on a portion of said second semiconductor layer and a portion of said first implanted region of said first semiconductor layer; and a contact disposed on said resistor or metal layer over said portion of one of said implanted regions of said first semiconductor layer.

In one or more embodiments, a second resistor or metal layer is disposed on a second portion of said second semiconductor layer and a portion of said second implanted region of said first semiconductor layer. In one or more embodiments, (a) said resistor or metal layer disposed on said portion of said first implanted region of said first semiconductor layer and (b) said resistor or metal layer disposed on a sidewall of said second semiconductor layer form a guard ring. In one or more embodiments, said first semiconductor layer comprises an N− material and said second semiconductor layer comprises a P++ material. In one or more embodiments, said first semiconductor layer comprises a P− material and said second semiconductor layer comprises an N++ material. In one or more embodiments, said first and second implanted regions are implanted at negative bevel angles with respect to a planar bottom surface of said first semiconductor layer, said planar bottom surface proximal to said substrate layer, whereby said unimplanted region forms a virtual negative bevel structure having angled side profiles. In one or more embodiments, said semiconductor device comprises said resistor layer, said resistor layer functioning as a resistor and forming a portion of a bypass capacitor, the bypass capacitor and said resistor in parallel electrically with each other.

Another aspect of the invention is directed to a semiconductor device comprising: a substrate layer; a first semiconductor layer doped with a first dopant disposed above said substrate layer and a second semiconductor layer doped with a second dopant, the second semiconductor layer disposed on said first semiconductor layer, said first dopant having a first dopant type opposite to a second dopant type of said second dopant; said first and second semiconductor layers being ion implanted with ions in selected regions thereof, said ions forming defined first and second implanted regions, wherein an unimplanted region is disposed between said first and second implanted regions; a resistor or metal layer disposed on a portion of said unimplanted region of said second semiconductor layer and a portion of said first implanted region of said second semiconductor layer; and a contact disposed on said resistor or metal layer over said portion of one of said first implanted region of said second semiconductor layer.

In one or more embodiments, a second resistor or metal layer is disposed on a second portion of said unimplanted region of said second semiconductor layer and a portion of said second implanted region of said second semiconductor layer. In one or more embodiments, (a) said resistor or metal layer disposed on said portion of said first implanted region of said second semiconductor layer and (b) said second resistor or metal layer disposed on said portion of said second implanted region of said second semiconductor layer form a guard ring. In one or more embodiments, said first semiconductor layer comprises an N− material and said second semiconductor layer comprises a P++ material. In one or more embodiments, said first semiconductor layer comprises a P− material and said second semiconductor layer comprises an N++ material. In one or more embodiments, the implanted regions are implanted at negative bevel angles with respect to a planar bottom surface of said first semiconductor layer, said planar bottom surface proximal to said substrate layer, whereby said unimplanted region forms a virtual negative bevel mesa structure having angled side profiles.

Another aspect of the invention is directed to a semiconductor device comprising: a substrate layer; a semiconductor layer doped with a dopant disposed above said substrate layer; said semiconductor layer being ion implanted with ions in selected regions thereof, said ions forming defined implanted regions, wherein an unimplanted region is disposed between said implanted regions; a metal layer disposed on said unimplanted region and portions of said implanted regions of said semiconductor layer; and a contact disposed on said metal layer over said portions of said implanted regions of said semiconductor layer.

In one or more embodiments, said metal layer and said unimplanted region of said semiconductor layer form a Schottky diode. In one or more embodiments, portions of said metal layer disposed on said implanted regions of said semiconductor layer form a guard ring. In one or more embodiments, said semiconductor layer comprises an N− material having a dopant concentration of about $1 \times 10^{15}$/cc to about $1 \times 10^{18}$/cc. In one or more embodiments, said semiconductor layer comprises a P− material having a dopant concentration of about $1 \times 10^{15}$/cc to about $1 \times 10^{18}$/cc. In one or more embodiments, the implanted regions are implanted at negative bevel angles with respect to a planar bottom surface of said semiconductor layer, said planar bottom surface proximal to said substrate layer, whereby said unimplanted region forms a virtual negative bevel structure having angled side profiles.

Another aspect of the invention is directed to an array of semiconductor pixels disposed on a substrate layer, each pixel comprising: a first semiconductor layer doped with a first dopant disposed above said substrate layer and a second semiconductor layer doped with a second dopant, the second semiconductor layer disposed on said first semiconductor layer, said first dopant having a first dopant type opposite to a second dopant type of said second dopant; said first and second semiconductor layers being ion implanted with first ions in selected regions thereof, said first ions forming defined first implant isolated regions, wherein an unimplanted region is disposed between said first implant isolated regions; said second semiconductor layer being ion implanted with second ions forming defined second implanted regions in a portion of each first implanted region; a first contact disposed above said first implanted regions of said second semiconductor layer at a perimeter of said array; and a second contact disposed to contact said first semiconductor layer or said substrate layer.

In one or more embodiments, each said second implanted region forms a resistor and a portion of a bypass capacitor, the resistor and bypass capacitor in parallel electrically with each other.

BRIEF DESCRIPTION OF THE DRAWINGS

For a fuller understanding of the nature and advantages of the present concepts, reference is made to the following detailed description of preferred embodiments and in connection with the accompanying drawings, in which.

DETAILED DESCRIPTION

Figure 1:
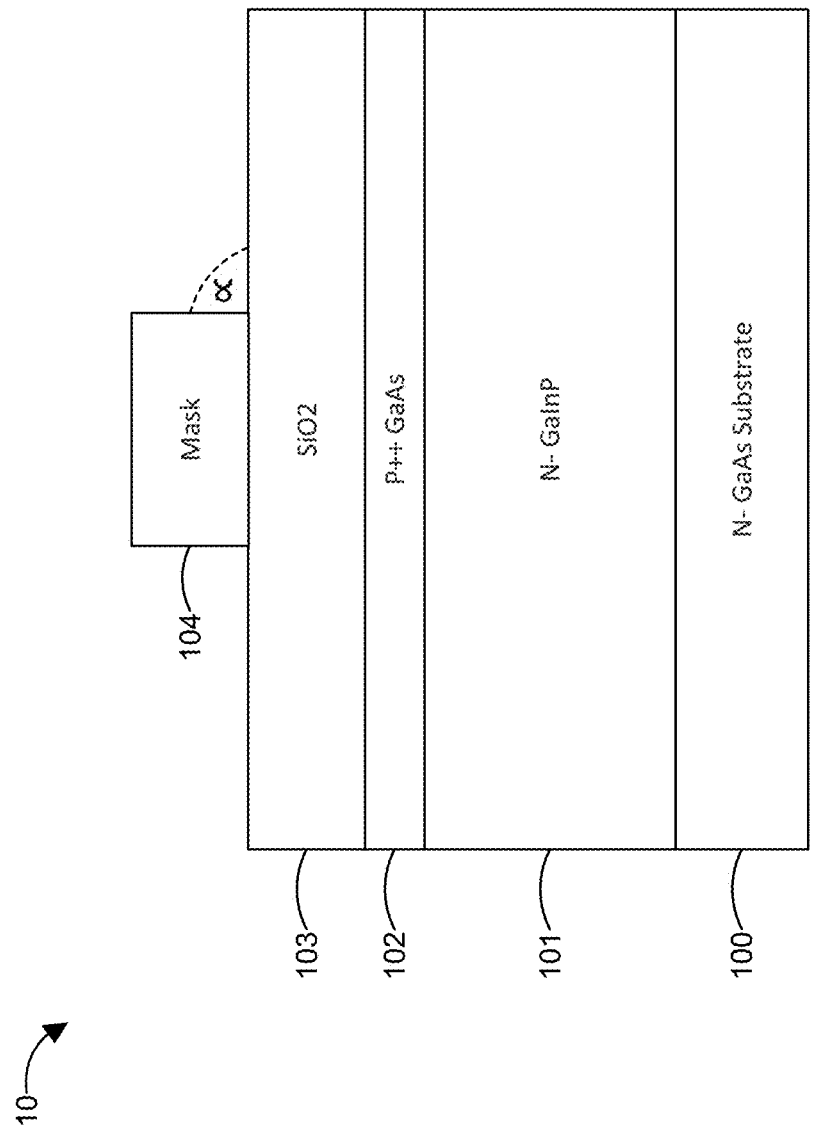
FIG. 1 is a cross section of a semiconductor device to illustrate a first manufacturing step according to a first embodiment.

FIG. 1 is a cross section of a semiconductor device 10 to illustrate a first manufacturing step according to a first embodiment. The semiconductor device 10 includes an N− GaAs substrate layer 100, an N− GaInP layer 101, a P++ GaAs layer 102, an optional amorphous layer 103 (e.g., amorphous $SiO_2$), and a sacrificial masking layer 104. Each of the foregoing layers 100-103 can be deposited by conventional semiconductor fabrication processes, such as chemical vapor deposition or other process. The N− GaInP layer 101 can be about 1,000 nm thick (i.e., in the vertical direction in the FIG. 1 cross section) and can have a dopant concentration of about $1\times10^{15}$/cc to about $1\times10^{18}$/cc, including about $1\times10^{16}$/cc and $1\times10^{17}$/cc, using n-type dopants such as silicon or tin. The P++ GaAs layer 102 can be about 100 nm thick and can have a dopant concentration of about $1\times10^{18}$/cc to about $1\times10^{20}$/cc, including about $1\times10^{19}$/cc, using dopant atoms such as Be, C, or Zn. Thus, in general, the dopant concentration in layer 102 should be greater than the dopant concentration in layer 101, and the thickness of layer 102 can be less than the thickness of layer 101.

In general, the dopant type of layer 102 is opposite to the dopant type of layer 101. For example, as illustrated in FIG. 1, layer 102 includes a P-type dopant (e.g., a P++ layer) and layer 101 includes an N-type dopant (e.g., an N− layer). Similarly, in some embodiments, layer 102 includes an N-type dopant (e.g., an N++ layer) and layer 101 includes a P-type dopant (e.g., a P− layer). The doping in layers 101 and 102 need not be constant, and can be formed through any combination of doping during epitaxy, ion implantation, diffusion doping, or any other means known in the state of the art. For the case of III-V compound semiconductors it is often most convenient to use doping during epitaxial growth of layers 101 and 102, since this approach produces high quality semiconductor material.

In some embodiments, P++ GaAs layer 102 may include a conducting layer, such as a semi-transparent metal layer, having a thickness of about 10 nm. Examples of semi-transparent metals include gold (Au), nickel (Ni), or other semi-transparent metals. In addition or in the alternative, the conducting layer can non-metallic conductors such as graphene, carbon nanotubes, or other non-metallic conductors. In some embodiments, P++ GaAs layer 102 can be replaced with a metal layer to form a Schottky diode with N− GaInP layer 101. As used herein, "about" means plus or minus 10% of the relevant value.

In other embodiments, layer 102 comprises a conducting layer, such as a metal layer, having a thickness greater than about 10 nm. In this case, the metal layer would not be transparent to light, but backside illumination of the diode could be achieved by illuminating the devices through substrate layer 100, provided substrate layer 100 is substantially transparent to the illumination. For example, substrate layer 100 may consist of InP, while layers 101 and 102 consist of InGaAs (lattice matched to InP). Here, InP substrate layer 100 is transparent to wavelengths longer than 950 nm, while InGaAs layers 101 and 102 efficiently absorb light with wavelengths between 950 nm and 1700 nm. Examples of metal layers include gold (Au), aluminum (Al), copper (Cu), nickel (Ni), or other suitable metals. In addition or in the alternative, the conducting layer can include non-metallic conductors such as graphene, carbon nanotubes, or other non-metallic conductors.

Masking layer 104 can be a photoresist layer, a metal, a dielectric (e.g., $SiO_2$, $Si_3N_4$, etc.), a semiconductor layer, or other masking layer known in the art. Masking layer 104 preferably has vertical or substantially vertical sidewalls. In other words, angle $\propto$ is preferably about 90 degrees, such as about 80 degrees to about 100 degrees. The vertical sidewalls of masking layer 104 allow the width of the implanted regions 201 and 202 (see FIG. 2) to be smaller than when the sidewalls of the masking layer 104 are angled (e.g., a 45-degree angle), as described in U.S. Pat. No. 9,076,707 ("the '707 patent"). For example, when the masking layer 104 is 3000 nm thick (in order to provide sufficient stopping power for the incident ions 200), the masking layer 104 can have vertical sidewalls, and the implant depth into layer 101 is 1000 nm, the minimum lateral width of the implanted region 201 can be less than 1000 nm. In contrast, a similar device using the '707 patent and U.S. Patent Application Publication No. 2004/0245592 when the 3000 nm thick masking layer is angled at 45 degrees, the minimum lateral width of the implanted regions is about 6000 nm due to the lateral space needed to provide the 45 degree bevels in the mask. This means embodiments of the invention enable both a higher density of detector elements and a higher fill factor (fraction of active area to total area of pixel).

It is noted that though layers 100-102 are described as comprising GaAs or GaInP, other types of semiconductor layers are possible. Alternative semiconductor layers include AlGaAs, AlGaInP, GaN, InGaN, AlGaN, InAlGaN, InGaAs, InGaAsP, InP, InAlAs, InGaAlAs, Si, SiC, SiGe, InSb, GaSb, AlGaSb, and/or other semiconductor layers.

Figure 2:
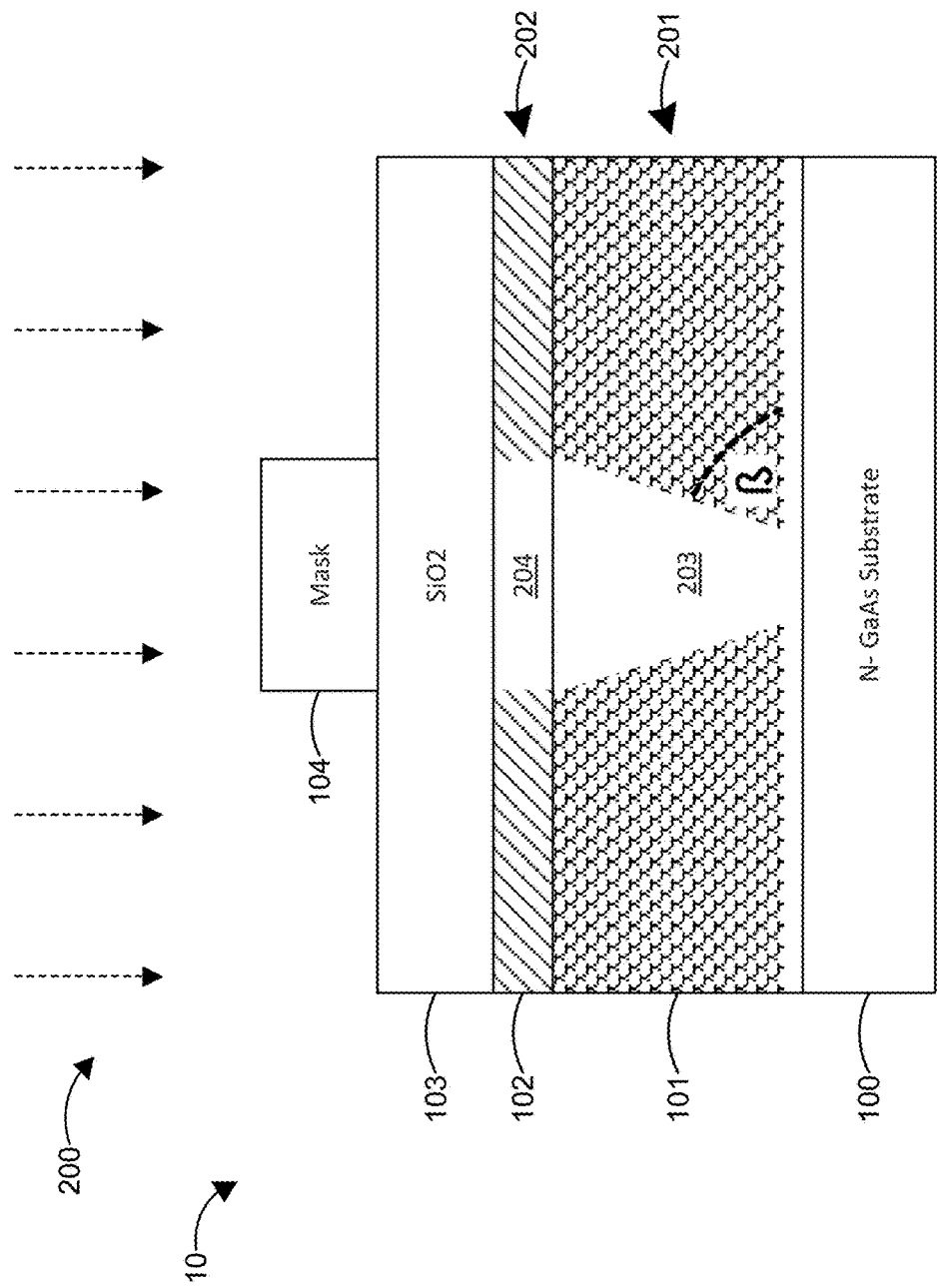
FIG. 2 is a cross section of a semiconductor device to illustrate another manufacturing step according to the first embodiment.

FIG. 2 is a cross section of a semiconductor device 10 to illustrate another manufacturing step according to the first embodiment. In this manufacturing step, ions 200 are implanted into device 10. The implanted ions 200 can include $H^+$, $He^+$, $O^+$, $N^+$, $Ar^+$, $As^+$, $Si^+$, $Be^+$, $Zn^+$, $B^+$, $Al^+$, $Ga^+$, $In^+$, $P^+$, or another ion as known in the semiconductor ion implantation arts, or a combination of any of the foregoing. The ions have sufficient energy such that they pass through optional amorphous layer 103 and into layers 102 and 101. As a result, layer 102 includes an implanted region 202 and layer 101 includes implant isolated regions 201. The implanted regions 201 exhibit a lower net doping concentration than unimplanted region 203 because the implanted ions form defects that compensate the doping in layer 101. These defects may be deep levels or shallow donors/acceptors as long as the effect is a lower net doping density in implant isolated region 201. In some embodiments, implant isolated region 201 can exhibit many orders of magnitude reduction in net free carrier concentration. In alternative embodiments, the reduction in net free carrier concentration may be as small as an order of magnitude. In still other embodiments, the implant may cause the net free carrier type to switch from n-type to p-type, provided that the magnitude of the doping density in implant isolated region 201 remains at least an order of magnitude lower than the magnitude of the doping density in unimplanted region 203. Note that, in general, implant isolated regions 201 do not isolate adjacent diode elements in an array since substrate 100 provides a low resistance path between unimplanted regions 203 that form the cathode connection to the diodes (also referred to as a common cathode connection).

Aspects of this are described in U.S. Patent Application Publication No. 2004/0245592, which is hereby incorporated by reference.

Similarly, implant regions 202 may be implant isolated or conducting, depending on the requirements of the design. By adjusting the energy, dose, and implant species, as well as post implant anneal, implant regions 202 may be made highly insulating, resistive, conducting, or of opposite type compared to unimplanted region 204.

Optional amorphous layer 103 (e.g., amorphous $SiO_2$) functions as a scattering layer that deflects the implanted ions such that they exit amorphous layer 103 at a variety of angles. The result is that ions that pass through amorphous layer 103 no longer impinge on the underlying layers 102 and 101 at a single angle, but rather exhibit a spread in angles that is dependent on the atomic composition of amorphous layer 103, the thickness of amorphous layer 103, the incident ion, and the incident ion energy. The amorphous layer 103 can be used to adjust the effective negative bevel angle β and to prevent excessive ion channeling.

In the case where optional amorphous layer 103 is not used, the lateral straggle of the implanted ions (and the lateral straggle of the ion implantation damage) will cause the virtual beveled edge angle β to be about 71.5 degrees with respect to the planar bottom surface of layer 101, which is sufficient to form a negative bevel. Here we can define a negative bevel angle as any angle β less than 90 degrees as shown in FIG. 2. The negative bevel angle can also be defined as the angle of the virtual beveled edge with respect to a normal to layer 101, which would be 90 degrees−β. The inclusion of optional amorphous layer 103 can be used to decrease the negative bevel angle β, with the amount of reduction in negative bevel angle β being dependent on the atomic composition of amorphous layer 103, the thickness of amorphous layer 103, the ion species used for implantation 200, and the energy or energies used for implant 200. In some embodiments, the optional amorphous layer 103 can include a crystalline, polycrystalline, or microcrystalline layer.

The bevel edge angle β of implanted regions 201 causes the unimplanted region 203 to form a virtual negative beveled mesa structure having a wider cross-sectional width at the top surface of layer 101 proximal to layer 102 and a narrower cross-sectional width at the bottom surface of layer 101 proximal to substrate 100.

In the case where optional amorphous layer 103 is not used, or in the case where layer 103 is crystalline or in the case where layer 103 is thin (e.g. less than 100 nm), it may be necessary to implant ions 200 at an angle with respect to the crystalline lattice direction to reduce ion channeling as is well known in the state of the art.

In all cases, it is not necessary to rotate device 10 during ion implantation. Amorphous layer 103 may be an amorphous dielectric layer ($SiO_2$, $Si_3N_4$, amorphous Si, etc.), or a substantially amorphous metal layer such as gold, copper, aluminum, palladium, etc., or even a polycrystalline or crystalline layer as described above.

The masking layer 104 protects regions 204 and 203 from the implant and, thus, their doping remains undisturbed. Due to the scattering caused by optional amorphous layer 103 as well as scattering in layers 102 and 101 the implanted ions exhibit a lateral straggle that introduces defects and/or dopants underneath masking layer 104 in layer 101, forming a negative bevel defined by angle β.

For the case of ion implantation to provide counter doping, the ion implantation 200 may provide a greater concentration of implanted ions in implanted region 201 than in implanted region 202, or the concentration of implanted ions in region 201 and 202 can be approximately the same, or the concentration of implanted ions in region 201 can be larger than in layer 202, depending on the series of implantation energies and implantation dose used. Similarly, for the case of implant isolation using ion implantation damage, the ion implantation 200 may provide a greater concentration of damage in implanted region 201 than in implanted region 202, or the concentration of damage in regions 201 and 202 can be approximately the same, or the concentration of damage in regions 201 can be larger than in layer 202, depending on the series of implantation energies and implantation doses used.

In one example, implanted region 202 in P++ GaAs layer 102 can have an initial (pre-implantation 200) dopant concentration of about $1 \times 10^{19}$/cc of implanted ions while implanted region 201 in N− GaInP layer 101 can have an initial (pre-implantation 200) dopant concentration of about $1 \times 10^{17}$/cc. As discussed above, the ion implantation 200 causes defects to form in implanted regions 201, 202. Each implanted region 201, 202 can have about the same concentration of defects. For example, the ion implantation can cause about $1 \times 10^{18}$/cc of compensating defects in regions 201 and 202, which would cause region 201 to exhibit a compensating defect density of $1 \times 10^{18}$/cc against a background of $1 \times 10^{17}$ cc doping, while region 202 exhibits a compensating defect density of $1 \times 10^{18}$/cc against a background doping of $1 \times 10^{19}$/cc. This means that layer 201 is dominated by the defect density, which is an order of magnitude larger than the initial background doping density, while layer 202 exhibits only a modest effect because to the defect density is only 10% of the initial background doping density. A subsequent (post implant 200) anneal may cause a reduction in the defect density, particularly in regions 201, where the subsequent anneal may be tuned to provide a close match between the initial doping density and the defect density, providing near perfect compensation of the regions 201, rendering them resistive, highly resistive, or insulating. For example, the subsequent anneal may cause the compensating defect density to be in the range of $0.9999 \times 10^{17}$/cc and $1.0001 \times 10^{17}$/cc, resulting in a net doping density between $-0.0001 \times 10^{17}$/cc and $+0.0001 \times 10^{17}$/cc (where the negative sign represents a change in type from n-type to p-type or from p-type to n-type), effectively reducing the net doping density to below $1 \times 10^{13}$/cc.

In alternative embodiments, the implant isolation can use dopant atoms to either reduce the net free electron concentration in region 201, or to cause regions 201 to convert to p-type (from the initial n-type doping in layer 101), provided the net p-type doping density in implant isolated regions 201 is smaller in magnitude than the initial doping density in p-type GaInP layer 102.

Figure 3:
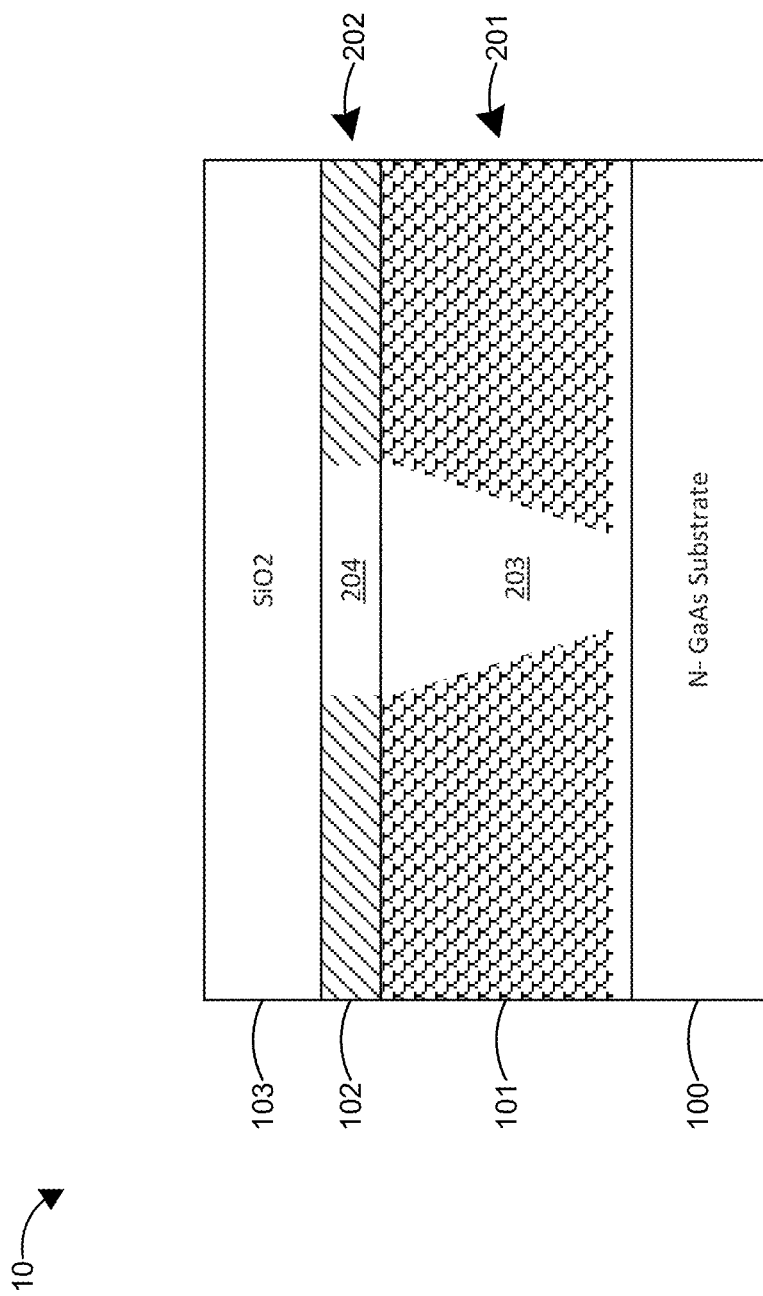
FIG. 3 is a cross section of a semiconductor device to illustrate another step according to the first embodiment.

FIG. 3 is a cross section of a semiconductor device 10 to illustrate another manufacturing step according to the first embodiment. In FIG. 3, masking layer 104 has been removed. Prior to or following the removal of masking layer 104, device 10 can be annealed. When layers 100-102 comprise group III-V semiconductors, the anneal can be at a temperature of about 300° C. to about 600° C. for about 60 seconds. When layers 100-102 comprise group IV semiconductors, the anneal can be about 600° C. to about 2,000° C. for about 1 second to about 1,000 seconds. The anneal can reduce the damage and/or defects caused by the ion implantation 200, which can cause unwanted currents near the perimeter of the diode, as well as to activate shallow dopant atoms. The anneal can also be used to provide a better balance between the initial doping in layer 101 (pre-implantation 200 doping) and the effective density of defects post implantation 200 to provide a lower net doping concentration in regions 201, or to convert regions 201 to the opposite type from regions 203.

Figure 4:
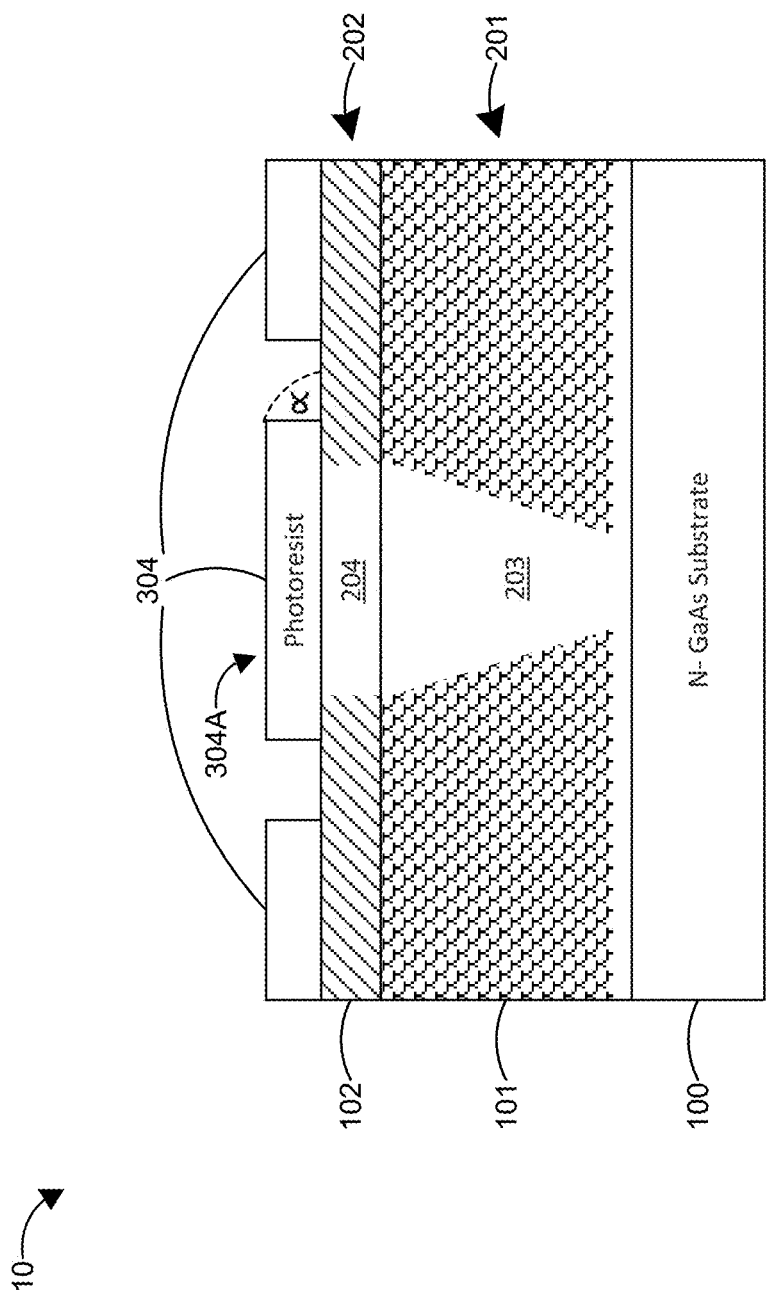
FIG. 4 is a cross section of a semiconductor device to illustrate another manufacturing step according to the first embodiment.

FIG. 4 is a cross section of a semiconductor device 10 to illustrate another manufacturing step according to the first embodiment. In FIG. 4, the amorphous layer 103 is removed and a photoresist layer 304 is deposited and patterned on P++ GaAs layer 102. It is noted that the lateral extent of photoresist portion 304A is greater (e.g., wider) than the sacrificial masking layer 104 illustrated in FIGS. 1 and 2. The photoresist layer 304 can have vertical or angled sidewalls. In other words, angle ∝ can range from about 30 degrees to about 150 degrees. An example method for forming angled sidewalls (e.g., a beveled edge) in a masking layer is disclosed in U.S. Pat. No. 9,076,707, titled "Integrated Avalanche Photodiode Arrays," which is hereby incorporated by reference.

Figure 5:
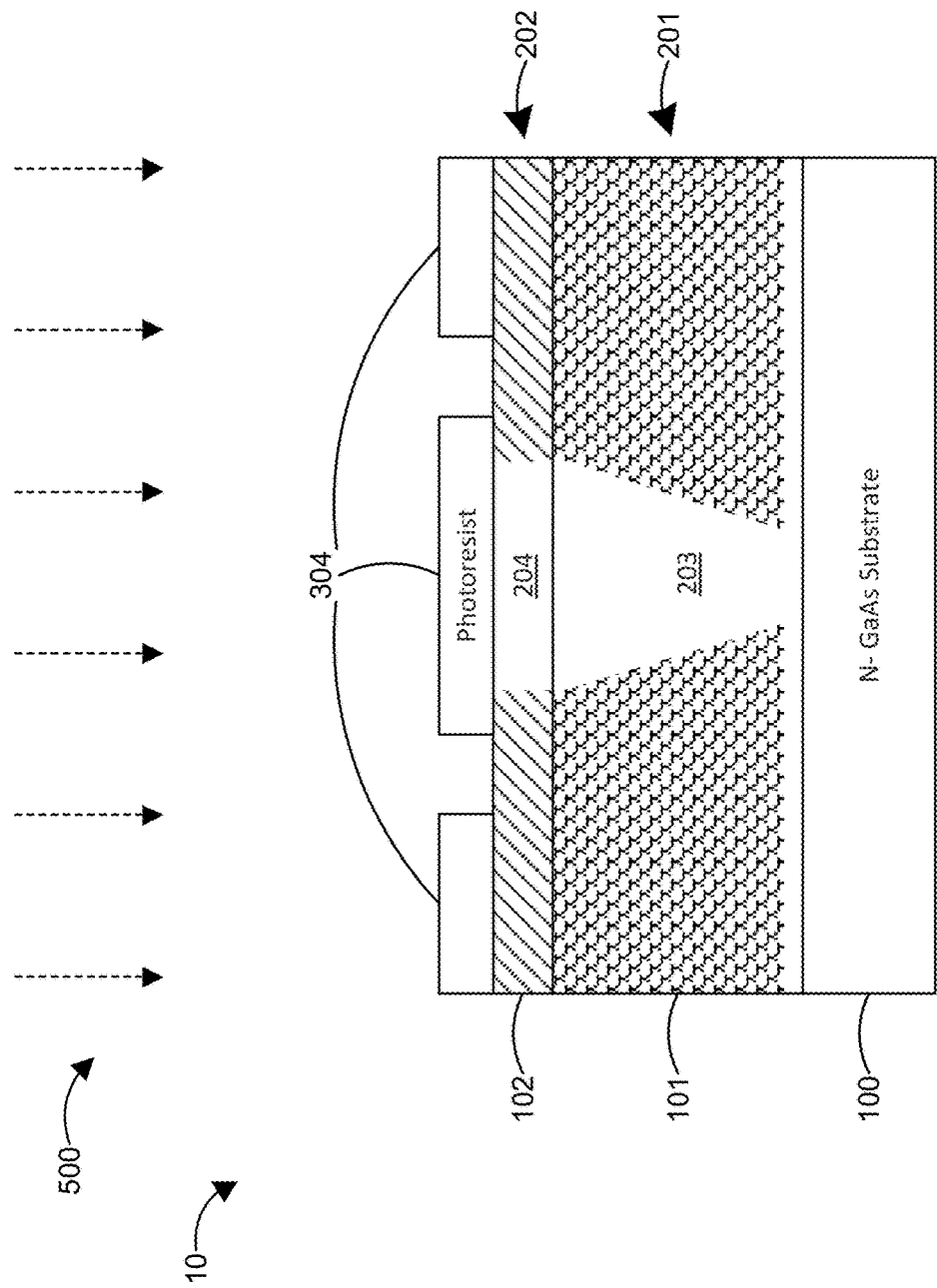
FIG. 5 is a cross section of a semiconductor device to illustrate another manufacturing step according to the first embodiment.

After the photo resist layer 304 is deposited and patterned, a second ion implant 500 is performed, as illustrated in FIG. 5. The ions deposited in the second ion implant 500 can include $H^+$, $He^+$, $O^+$, $N^+$, $As^+$, $P^+$, $Sb^+$, $C^+$, $Si^+$, $Ge^+$, $B^+$, $Al^+$, $Ga^+$, $In^+$, $Be^+$, or any other ions well known in the state of the art to provide either a compensating dopant or implant isolation compensating defects.

Figure 6:
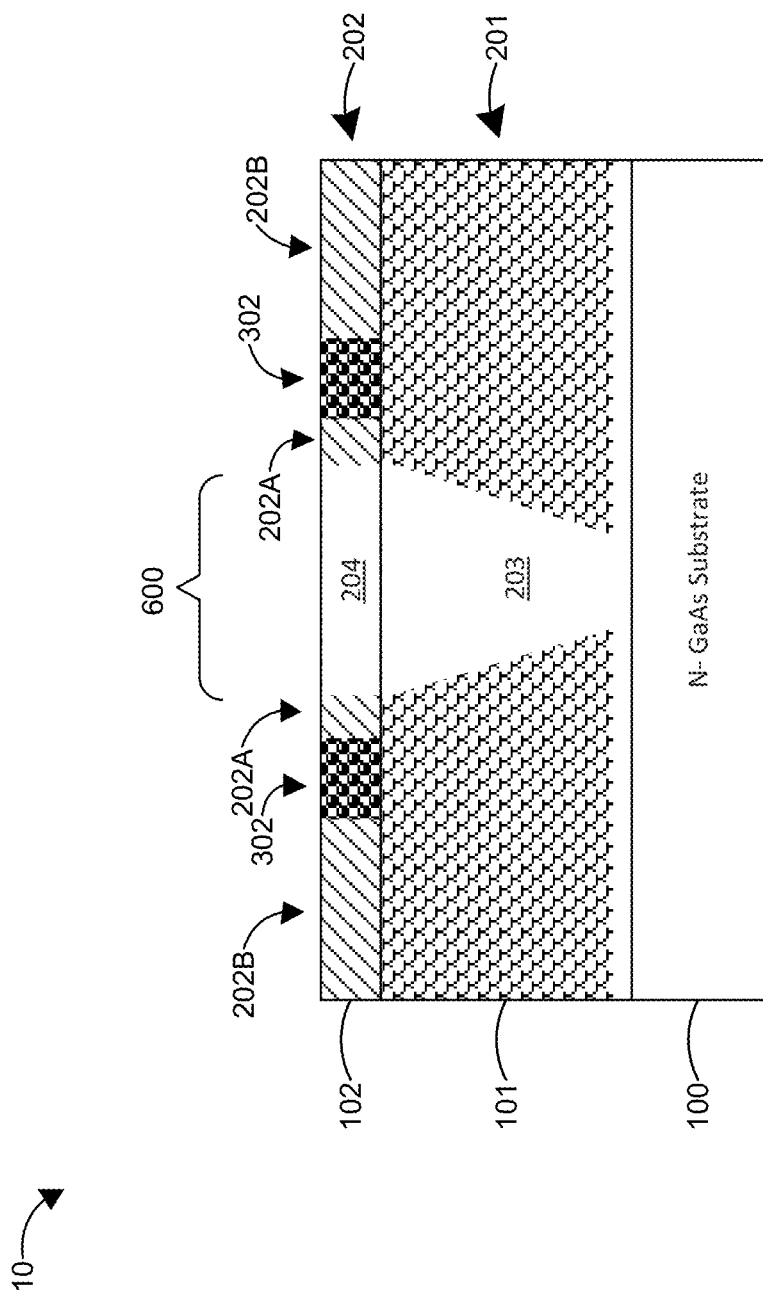
FIG. 6 is a cross section of a semiconductor device to illustrate another manufacturing step according to the first embodiment.

The second ion implant 500 forms second implanted regions 302 in P++ GaAs layer 102, as illustrated in FIG. 6. The second implanted region 302 can form an insulator or a resistor depending on the concentration of ions implanted therein. Resistors can be formed by either underimplanting or overimplanting the region. Underimplanting causes regions 302 to be slightly under compensated, such that the net doping density in at least a portion of region 302 is less than about $1\times10^{17}$/cc, preferably less than about $1\times10^{16}$/cc. The thickness of this portion of region 302 is typically less than 100 nm, giving a net charge density less than about $1\times10^{12}$/cm$^2$, enabling formation of a resistor. Overimplanting causes regions 302 to be highly defective, such that hopping conduction occurs between defect sites, also forming a resistive layer. In the case where the implant uses deep level defects as the compensating defect, annealing can be used to adjust the resistivity of the layer as desired. For a typical application in a passively quenched SPAD device, the desired quench resistance is in the range of about 10 kOhm to about 1,000 kOhm, and therefore a suitable sheet resistance for regions 302 is in the range of about 1 kOhm/square to about 10,000 kOhm/square. The high value of the sheet resistance can enable very small resistors to be achieved, which reduces the chip area needed for the device. At very small dimensions, the parasitic capacitance across the resistor may be large enough to provide the bypass capacitor described in the '707 patent. Accordingly, the semiconductor device 10 can have a resistor-bypass capacitor configuration where second implanted region 302 can form a resistor in addition to forming a portion of a bypass capacitor, the bypass capacitor comprising inner implanted region 202A, second implanted region 302, and outer implanted region 202B. The resistor and bypass capacitor are in parallel electrically with each other.

For the case where layer 102 is P++ GaAs doped at about $1\times10^{19}$/cc, underimplanting may be achieved using a $He^+$ implant with an energy of about 30 keV and a dose of about $1\times10^{12}$/cm$^2$ (nominal implant dose range of about $1\times10^{11}$/cm$^2$ to about $1\times10^{13}$/cm$^2$). For the same case, overimplanting may be achieved using an $O^+$ implant with an energy of about 20 keV and a dose of about $2\times10^{14}$/cm$^2$ (nominal implant dose range of about $1\times10^{14}$/cm$^2$ to about $1\times10^{15}$/cm$^2$). When the second implanted region 302 is a resistor, it can equalize the voltage across the top of device 10 (e.g., across P++ GaAs layer 102). The resistor can isolate or connect pixel 600 with adjacent pixels. Note that resistor regions 302 will also exhibit a parasitic capacitance across the ends of the resistor, which can be used to provide a bypass capacitor in a passive quench circuit (see Harmon, E. S., Naydenkov, M., and Hyland, J. T. "Compound Semiconductor SPAD arrays," Proc. SPIE v. 9113, paper 911305, which is hereby incorporated by reference). An inner implanted region 202A formed during the first implant may be disposed between second implanted region 302 and unimplanted region 204.

Figure 7:
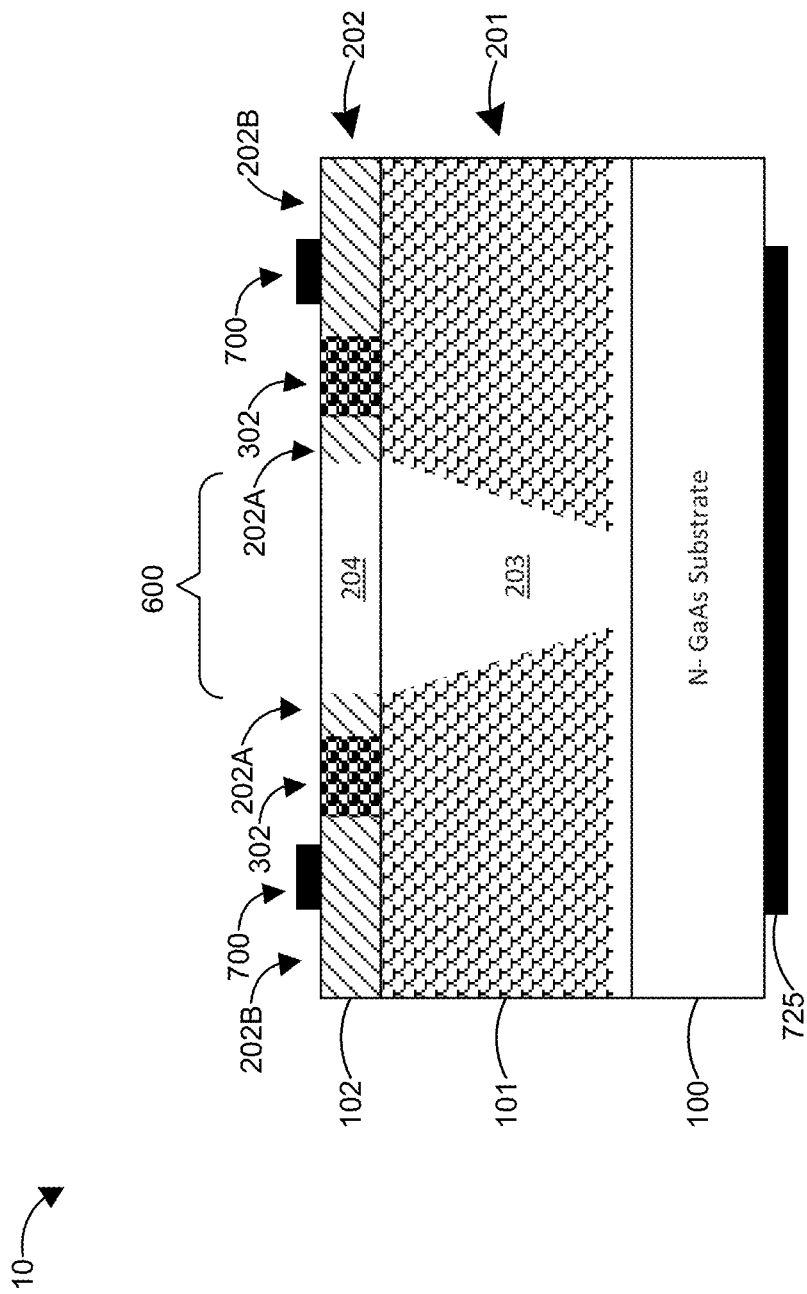
FIG. 7 is a cross section of a semiconductor device to illustrate another manufacturing step according to the first embodiment.

FIG. 7 is a cross section of a semiconductor device 10 to illustrate another manufacturing step according to the first embodiment. In FIG. 7, a P-type contact layer 700 is deposited and patterned on P++ GaAs layer 102. P-type contact layer 700 can be formed using e-beam evaporation of a multilayer structure, which can include about 30 nm of Ti (in contact with P++ GaAs layer 102, followed by the deposition of about 40 nm of Pt and about 300 nm of Au. Those skilled in the art will recognize that a wide range of metallization schemes can be used to form an Ohmic contact to P++ layer 107. The P-type contact layer 700 can provide a readout connection for pixel 600. In some embodiments, regions 302, 202A, 204, and 201 form a diode. An n-type contact layer 725 is deposited and patterned on N– GaAs substrate 100. The device can be flipped upside down and an Ohmic n-type GaAs contact layer deposited on the backside of substrate 100. The Ohmic n-type GaAs contact layer can include an alloyed AuGe contact as is well known in the state of the art.

Figure 8:
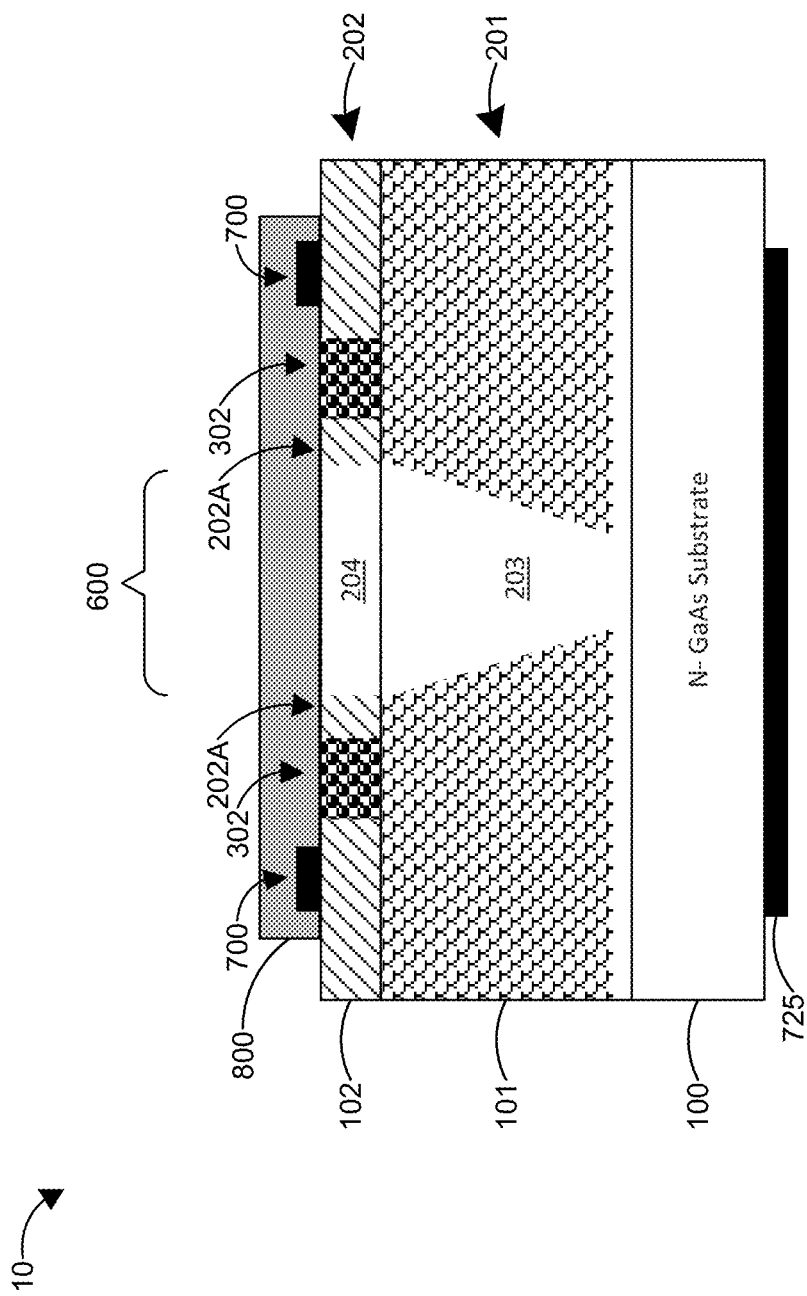
FIG. 8 is a cross section of a semiconductor device to illustrate another manufacturing step according to the first embodiment.

FIG. 8 is a cross section of a semiconductor device 10 to illustrate another manufacturing step according to the first embodiment. In FIG. 8, a masking layer 800 is deposited and patterned on P++ GaAs layer 102 and p-type contact layer 700. Masking layer 800 can include one or more of the same materials as masking layer 104.

Figure 9:
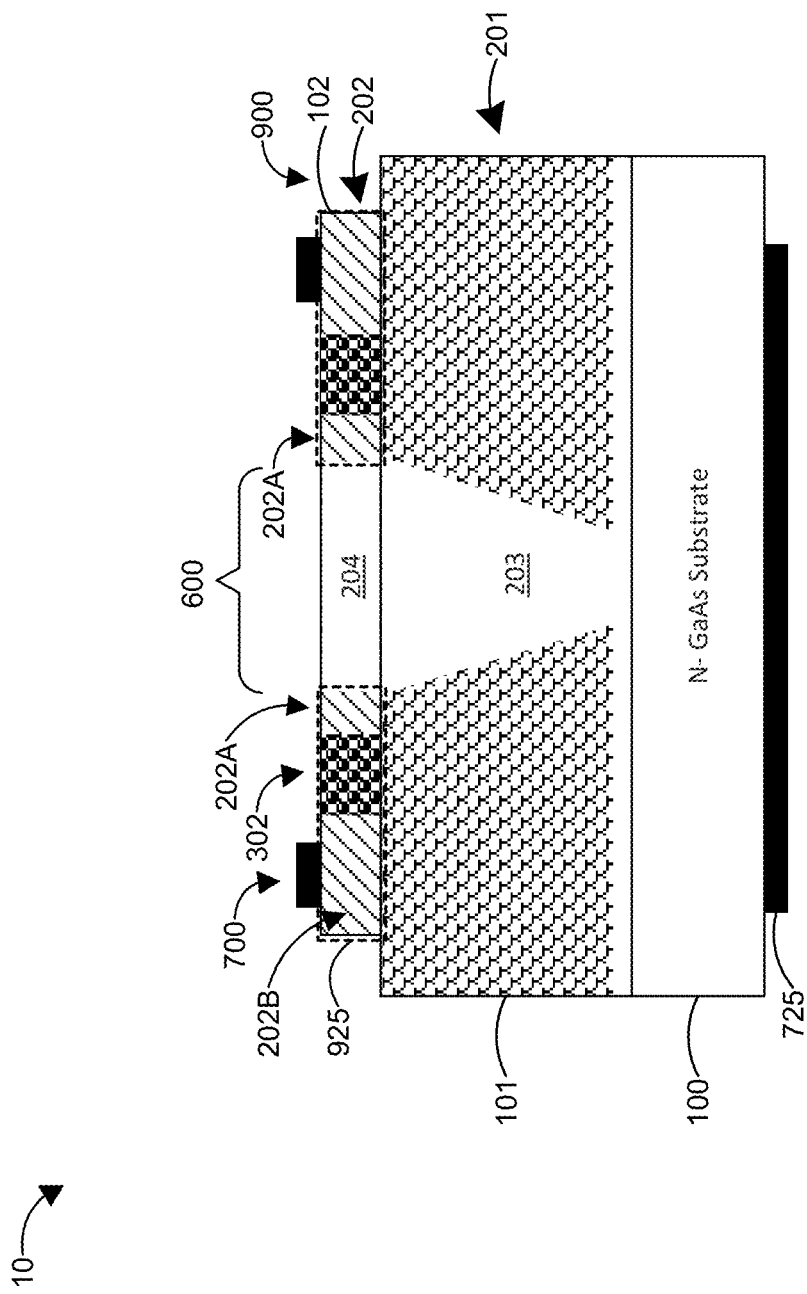
FIG. 9 is a cross section of a semiconductor device to illustrate another manufacturing step according to the first embodiment.

FIG. 9 is a cross section of a semiconductor device 10 to illustrate another manufacturing step according to the first embodiment. In FIG. 9, the exposed portions of P++ GaAs layer 102 are removed (e.g., etched), leaving a gap 900. After the exposed portions of P++ GaAs layer 102 are removed, masking layer 800 is removed. The gap 900 provides electrical isolation of the P++ GaAs layer 102 between the anode of pixel 600 and a corresponding anode in an adjacent pixel, thereby allowing each pixel 600 to be electrically isolated and readout separately (or read out simultaneously as described in U.S. Pat. No. 9,076,707). Implanted region 202 and second implanted region 302 form a guard ring 925, as indicated by the dashed line. The guard ring 925 provides a means of isolating pixel 600 (or an array of pixels 600) from anything in the exterior of the guard ring. In addition, P-type contact layer 700, outer implanted region 202B, second implanted region 302, inner implanted region 202A, unimplanted region 204, and N-type contact layer 725 form a metal to resistor/capacitor to P+/N– diode to metal contact.

Figure 10:
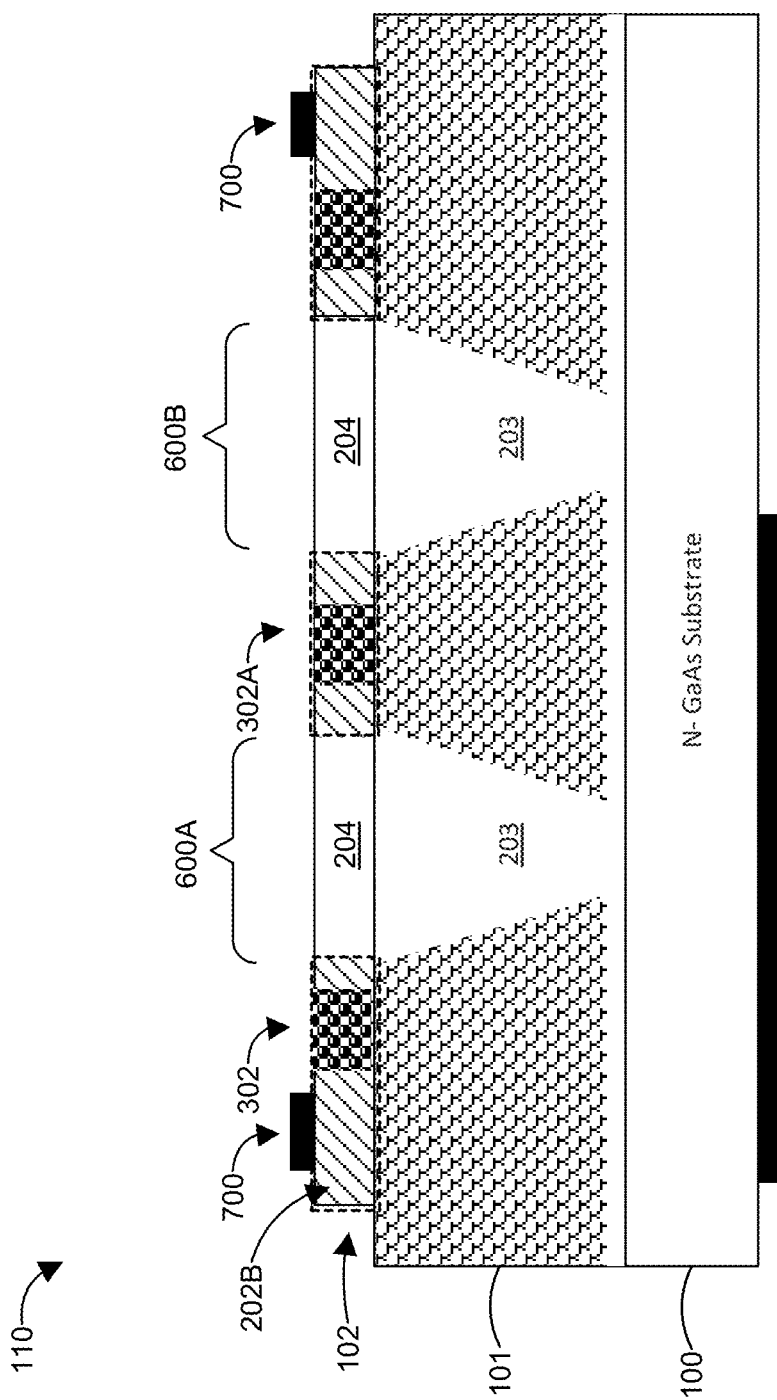
FIG. 10 illustrates an array comprising first and second pixels.

FIG. 10 illustrates an embodiment of an array 110 comprising first and second pixels 600A, 600B. The P-type contact layers 700 are disposed at the perimeter of array 110, and are not disposed between the first and second pixels 600A, 600B. A central second implanted region 302A is disposed between the first and second pixels 600A, 600B. As discussed above, the second implanted region 302, including the central second implanted region 302A, can form an insulator or a resistor depending on the concentration of ions implanted therein. The insulator or resistor formed by the central second implanted region 302A serves to isolate the unimplanted regions 203, 204 from adjacent pixels 600A, 600B. By forming the insulator or resistor from the central second implanted region 302A, disposed in the portion of layer 102 that defines and isolates the pixels 600A, 600B, significant semiconductor real estate can be conserved thus allowing for a higher density array of photodetector pixels.

Figure 11:
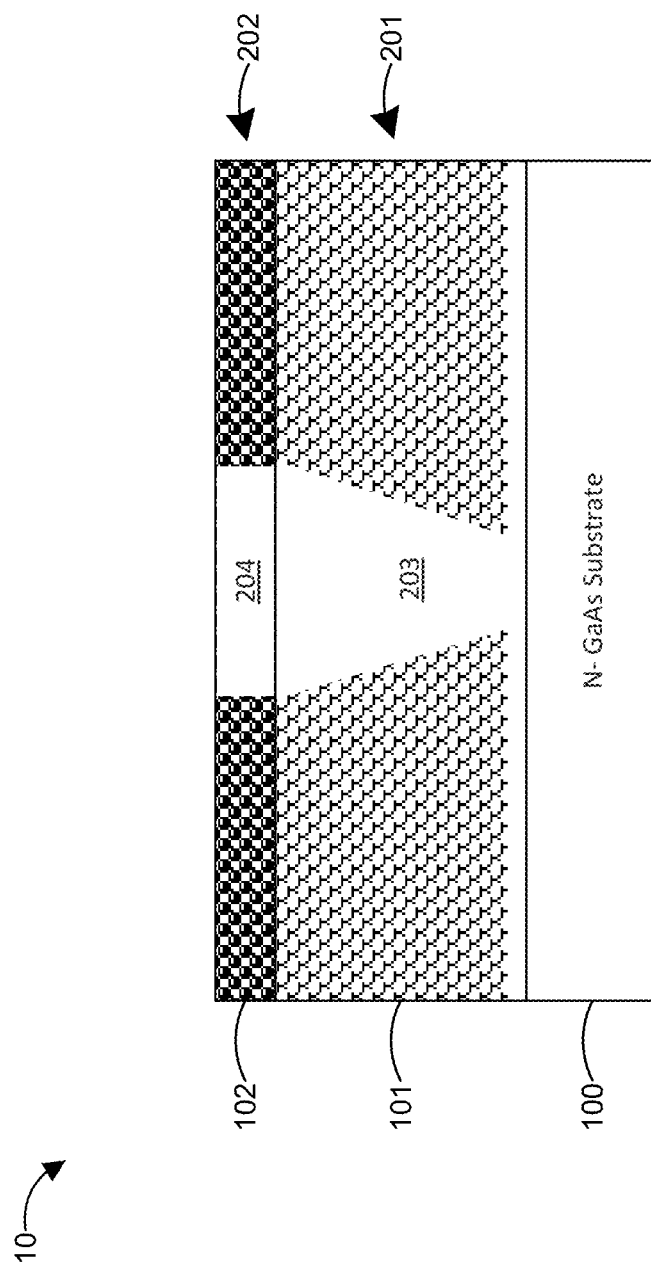
FIG. 11 is a cross section of a semiconductor device to illustrate an alternative manufacturing step according to the first embodiment.

In some embodiments, the guard ring 925 can be metal. To form a metal guard ring, the second implant 500 can be performed after the first implant 200 using the same mask 104. The ions for the second implant are implanted in layer 102, as illustrated in FIG. 11. Next, a metal layer is deposited to surround the device 10, the metal layer functioning as a guard ring. The ions for the second implant can be deposited in a sufficient concentration to form either an insulator or a resistor, as discussed above. In some embodiments, the P++ GaAs layer 102 can be omitted and replaced by a metal region, resulting in a metal Schottky diode.

In an alternative embodiment, the P-type contact layers 700 can be disposed between each pixel (e.g., between first and second pixels 600A, 600B) in array 110.

Figure 12:
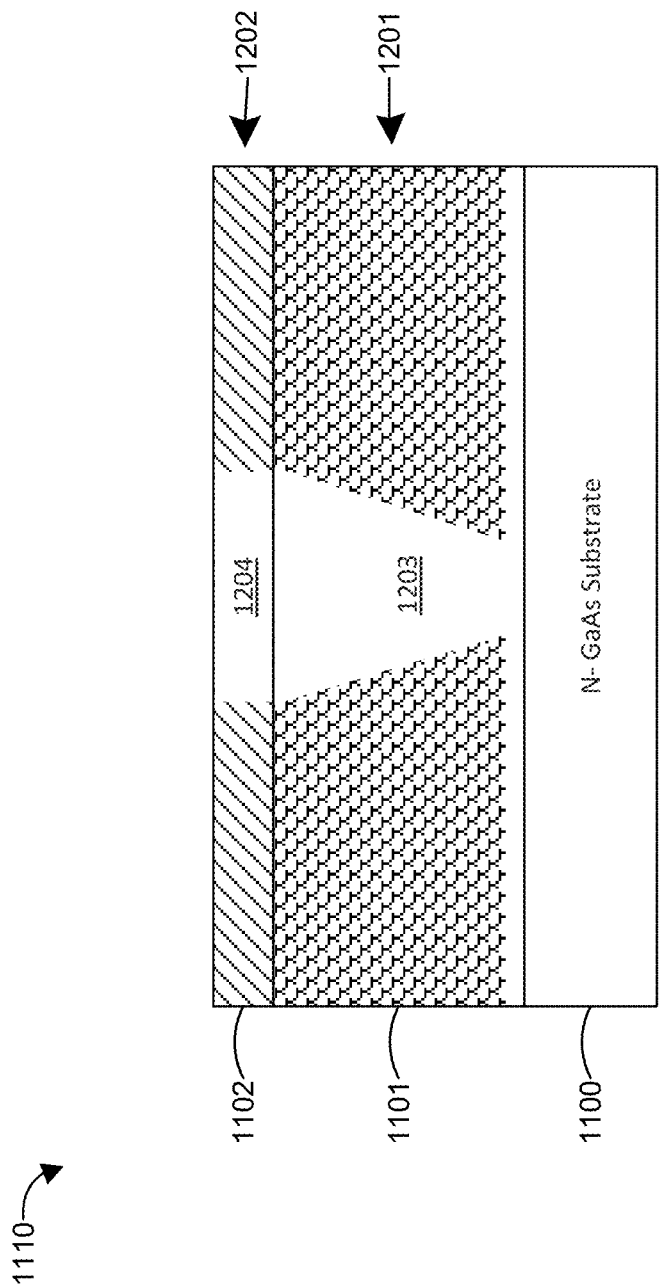
FIG. 12 is a cross section of a semiconductor device to illustrate a manufacturing step according to a second embodiment.

FIG. 12 is a cross section of a semiconductor device 1110 to illustrate a manufacturing step according to a second embodiment. Semiconductor device 1110 is manufactured in the same or substantially the same way as semiconductor device 10, as described above with respect to FIGS. 1-6 but with the second ion implant 500 being combined with the first implant 200, and therefore co-registered since only a single mask layer is used. Thus, layers and regions 1100-1102 and 1201-1204 correspond to layers and regions 100-102 and 201-204. The semiconductor device 1110 can be annealed, for example in the manner described above with respect to FIG. 3.

Figure 13:
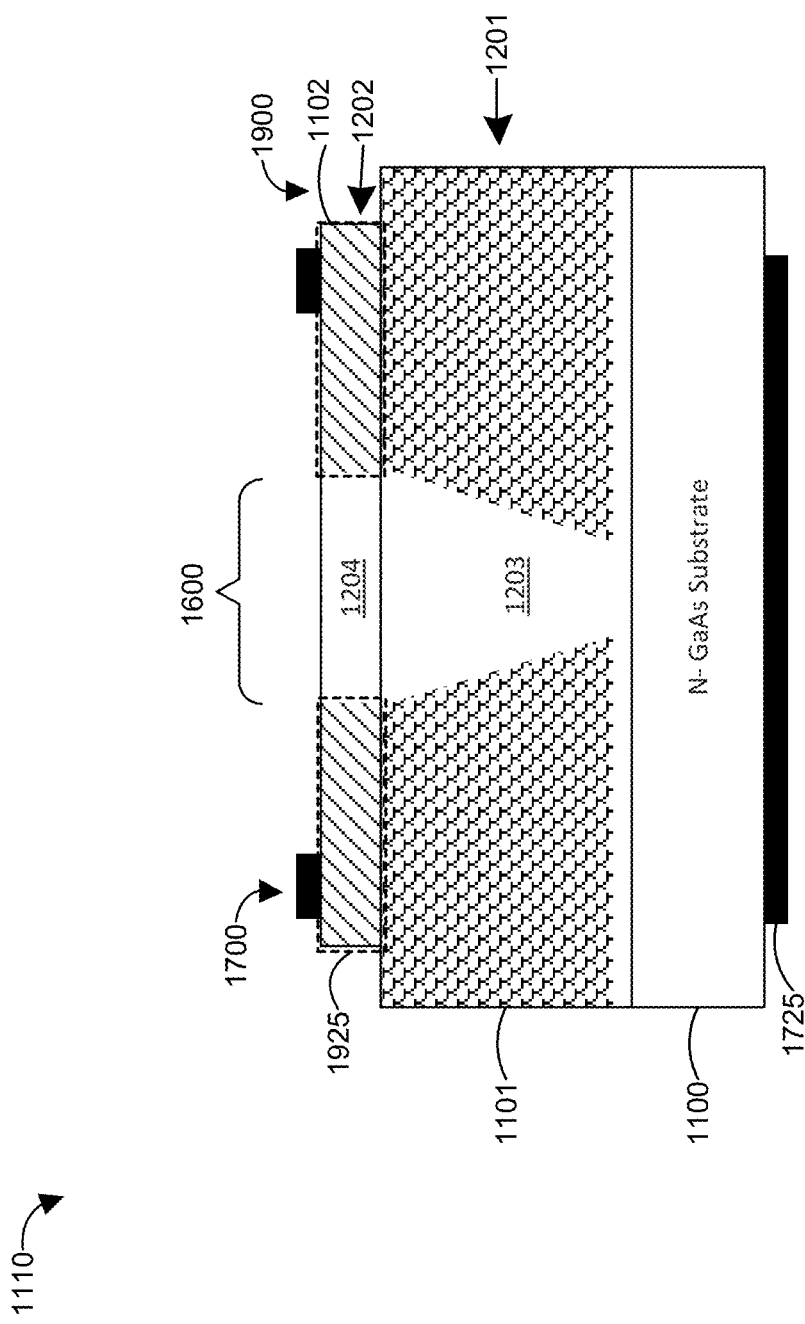
FIG. 13 is a cross section of a semiconductor device to illustrate another manufacturing step according to the second embodiment.

FIG. 13 is a cross section of a semiconductor device 1110 to illustrate another manufacturing step according to the second embodiment. The semiconductor device 110 is manufactured in the same or substantially the same way as semiconductor device 10, as described above with respect to FIGS. 7-9. Thus, semiconductor device 1010 is the same or substantially the same as semiconductor device 10 with the resistor regions 1202 being formed during the second implant co-registered with the first implant. The advantage of this embodiment is that it does not require a second masking and a second implant step, and therefore simplifies the process, reduces manufacturing costs and time, and reduces the likelihood of manufacturing defects.

In FIG. 13, as in all figures, like reference numbers refer to like things. Thus, layers, regions, and structures 1600, 1700, 1725, 1900, and 1925 correspond to layers, regions, and structures 600, 700, 725, 900, and 925, respectively. It is noted that an array of semiconductor devices 1110 can be formed in the same N− GaAs substrate 1100 according to the methods described herein.

Figure 25:
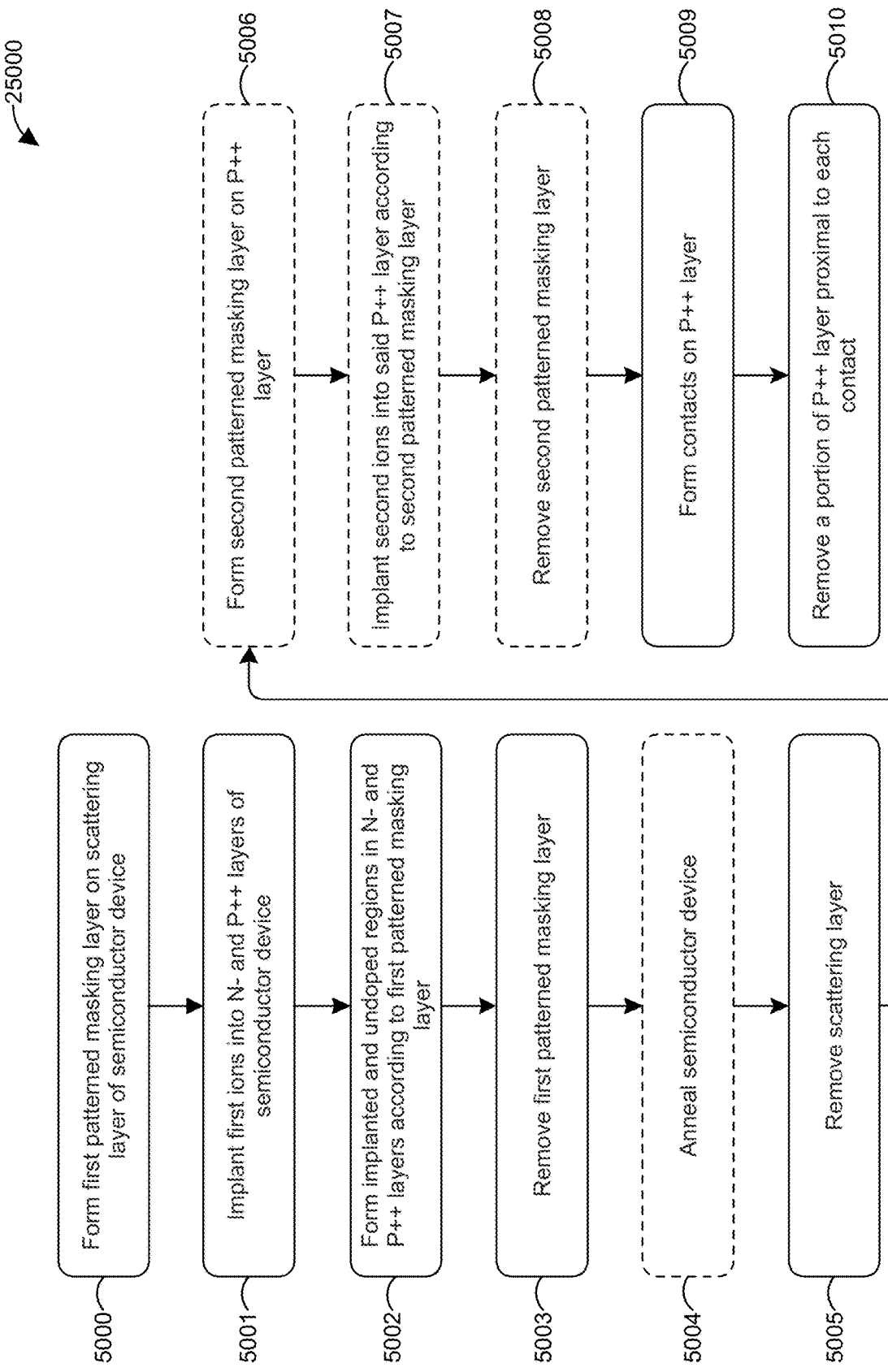
FIG. 25 is a flow chart of a method for manufacturing a semiconductor device according to the first and/or second embodiment.

FIG. 25 is a flow chart 25000 of a method for manufacturing a semiconductor device according to the first and/or second embodiment(s). The flow chart can be performed according to any of FIGS. 1-13, discussed above. In step 5000, a first patterned masking layer is formed on a scattering layer of a semiconductor device, the semiconductor device comprising an N− substrate, an N− layer disposed on the N− substrate, a P++ layer disposed on the N− layer, a scattering layer disposed on the P++ layer, and a first patterned masking layer disposed on the scattering layer. The first patterned masking layer can be a photoresist layer, a metal, a dielectric (e.g., the $SiO_2$, $Si_3N_4$, etc.), a semiconductor layer, or other masking layer known in the art. The first patterned masking layer preferably has vertical or substantially vertical sidewalls, as described above. The first patterned masking layer protects at least one region of the underlying N− and P++ layers.

In step 5001, ions are implanted into the N− and P++ layers of the semiconductor device. In step 5002, the ions form implanted and unimplanted regions in the N− and P++ layers according to the first patterned masking layer. The implanted and unimplanted regions in the N− and P++ layers define a virtual mesa structure. In step 5003, the first patterned masking layer is removed (e.g., etched). In optional step 5004, the semiconductor device is annealed, for example as described above with respect to FIG. 3. In step 5005, the scattering layer is removed (e.g., etched) to expose the P++ layer.

In optional step 5006, a second patterned masking layer is formed on the exposed P++ layer. A portion of the second patterned masking layer covers (protects) the unimplanted regions in the P++ layer (and N− layer). Optional second portions of the second patterned masking layer can cover a portion of the implanted region in the P++ layer (and N− layer). In optional step 5007, second ions are implanted into the P++ layer according to the second patterned masking layer. The second ions form second implanted regions in the P++ layer. The second implanted regions form resistors, which operate as a quench resistor and/or bypass capacitor structure. Examples of a quench resistor bypass structure are disclosed in U.S. Pat. No. 9,076,707 and U.S. Patent Application Publication No. 2016/0329369, titled "Integrated Avalanche Photodiode Arrays," which are hereby incorporated by reference. In the case where optional steps 5006, 5007, and 5008 are not used, the quench resistor and/or bypass capacitor structure may be formed using steps 5001, 5002, and 5003, with the resistor being co-registered with the first implant, and using fewer processing steps.

In optional step 5008, the second patterned masking layer is removed (e.g., etched). In step 5009, contacts are formed on the P++ layer, each second implanted region disposed between the unimplanted region of the P++ layer and each contact. In step 5010, a portion of the P++ layer proximal to each contact is removed to isolate the pixel.

Figure 14:
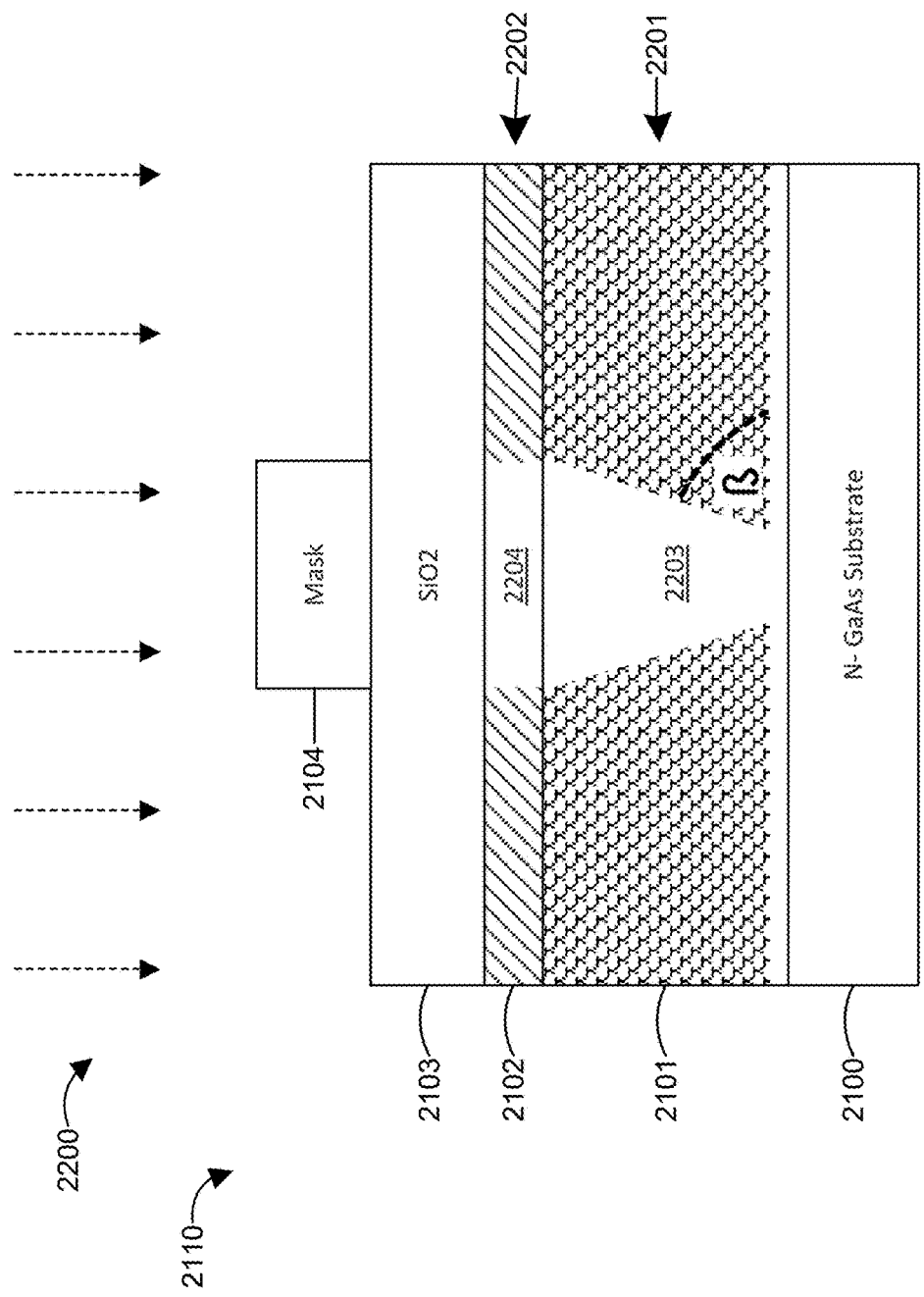
FIG. 14 is a cross section of a semiconductor device to illustrate a manufacturing step according to a third embodiment.

FIG. 14 is a cross section of a semiconductor device 2110 to illustrate a manufacturing step according to a third embodiment. The semiconductor device 2110 is manufactured in the same or substantially the same way as semiconductor device 10, as described above with respect to FIGS. 1-2. Thus, layers, regions, and structures 2100-2104 and 2200-2204 correspond to layers, regions, and structures 100-104 and 200-204.

Figure 15:
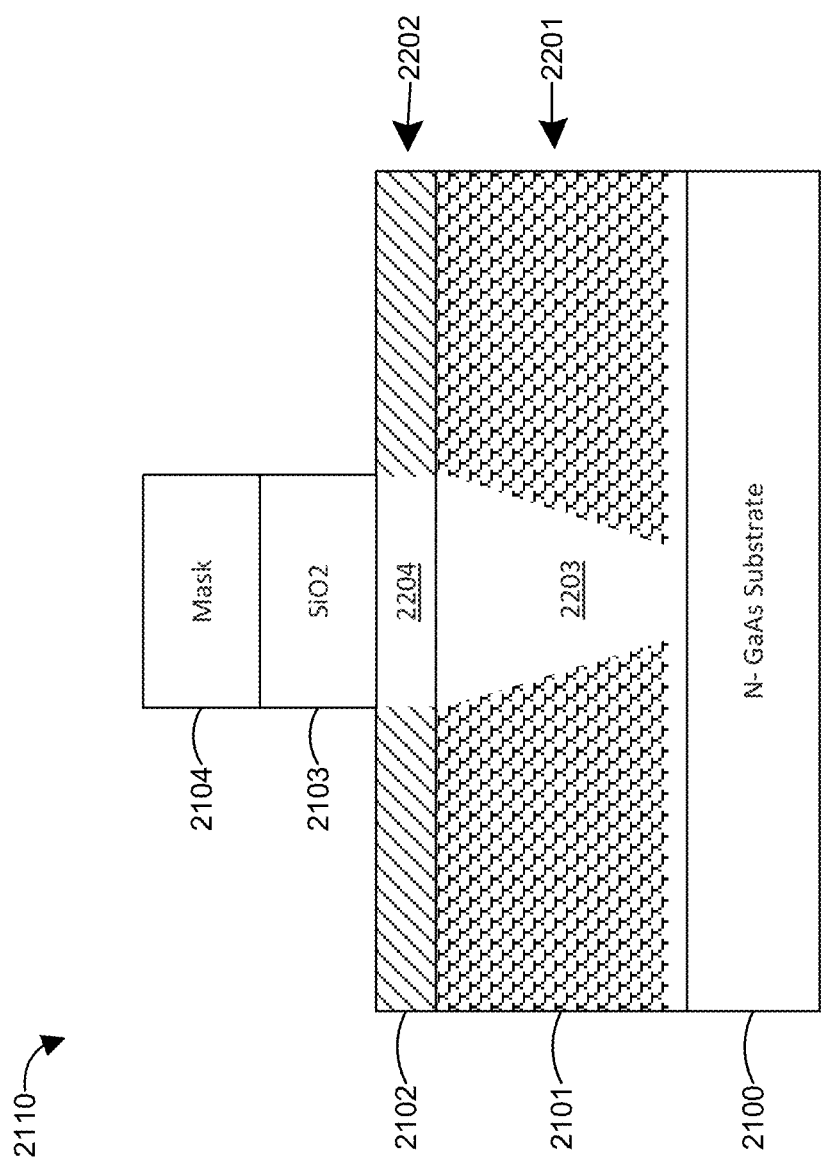
FIG. 15 is a cross section of a semiconductor device to illustrate another manufacturing step according to the third embodiment.

FIG. 15 is a cross section of a semiconductor device 2110 to illustrate another manufacturing step according to the third embodiment. In FIG. 15, a portion of amorphous layer 2103 (e.g., amorphous $SiO_2$) is removed (e.g., etched) according to the dimensions of masking layer 2104.

Figure 16:
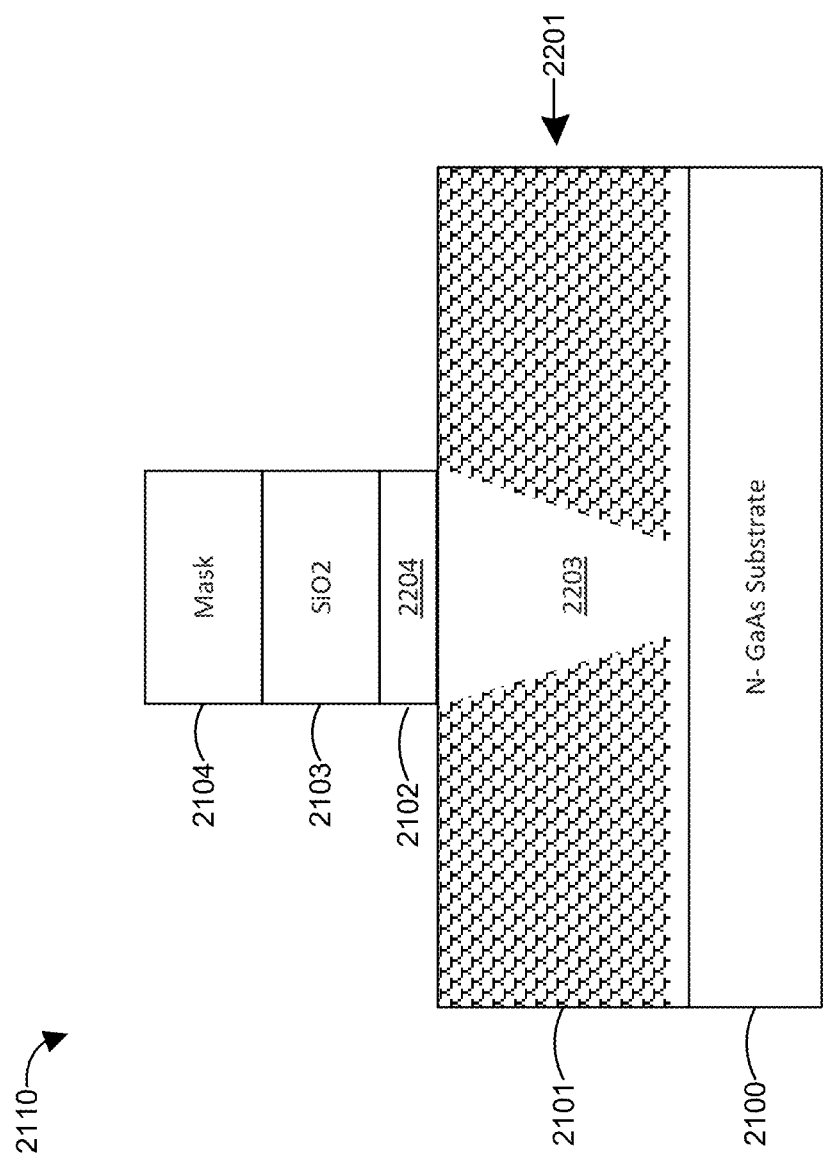
FIG. 16 is a cross section of a semiconductor device to illustrate another manufacturing step according to the third embodiment.

FIG. 16 is a cross section of a semiconductor device 2110 to illustrate another manufacturing step according to the third embodiment. In FIG. 16, the implanted regions 2202 of P++ GaAs layer 102 are removed (e.g., etched) according to the dimensions of the amorphous layer 2103 and masking layer 2104. Unimplanted region 2204 of P++ GaAs layer 2102 remains below amorphous layer 2103.

Figure 17:
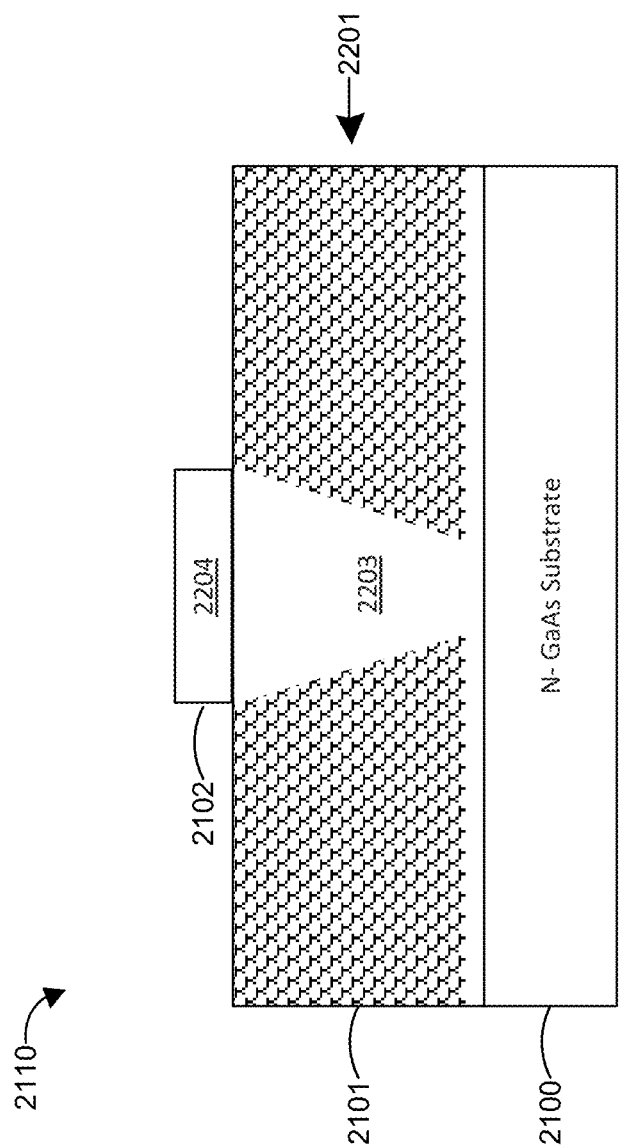
FIG. 17 is a cross section of a semiconductor device to illustrate another manufacturing step according to the third embodiment.

FIG. 17 is a cross section of a semiconductor device 2110 to illustrate another manufacturing step according to the third embodiment. In FIG. 17, the amorphous layer 2103 and masking layer 2104 are removed (e.g., etched), leaving unimplanted region 2204 of P++ GaAs layer 2102 exposed.

Figure 18:
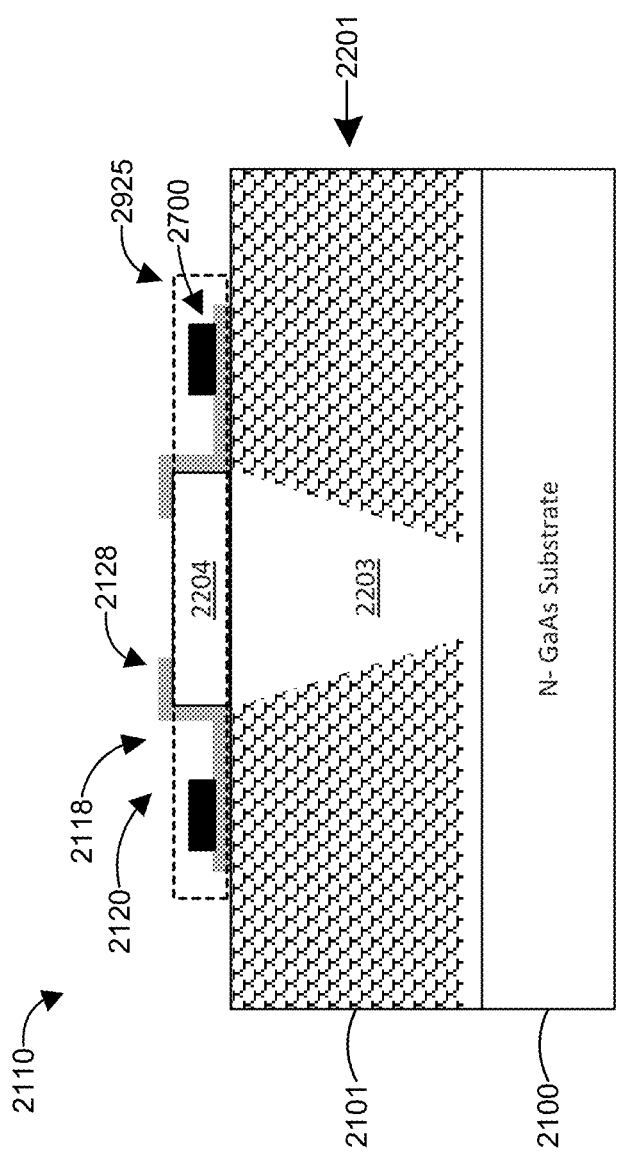
FIG. 18 is a cross section of a semiconductor device to illustrate another manufacturing step according to the third embodiment.

FIG. 18 is a cross section of a semiconductor device 2110 to illustrate another manufacturing step according to the third embodiment. In FIG. 18, a conductive or resistive layer 2118 is deposited and patterned on unimplanted region 2204 and implanted region 2201. If layer 2118 is conductive, it may consist of metal layers such as Au or Al. If layer 2118 is resistive, it may consist of thin metal layers (for example 5 nm of Au), doped amorphous silicon, doped polysilicon, or ZnO/Al$_2$O$_3$ alloy layers (see, for example: J. W. Elam, A. D. Routkevitch, and S. M. George, "Properties of ZnO/Al$_2$O$_3$ Alloy Films Grown Using Atomic Layer Deposition Techniques," Journal of The Electrochemical Society, v. 150 (6) pp. G339-G347 (2003), which is hereby incorporated by reference). A first portion 2128 of layer 2118 is disposed on the top surface of unimplanted region 2204. The portion 2120 of layer 2118 on the sidewall of unimplanted region 2204 and on implanted region 2201 functions as a guard ring 2925, as indicated by the dashed line in FIG. 18. A p-type metal contact 2700 is then deposited and patterned on portion 2120 of layer 2118.

Semiconductor device 2110 can have a resistor-bypass capacitor configuration where layer 2118 forms a resistor in addition to forming a portion of a bypass capacitor. The bypass capacitor comprises metal contact 2700, layer 2118 (e.g., portion 2120), and unimplanted region 2204. The resistor (when layer 2118 functions as a resistor) and bypass capacitor are in parallel electrically with each other.

It is noted that an array of semiconductor devices 2110 can be formed in the same N− GaAs substrate 2100 according to the methods described herein.

Figure 26:
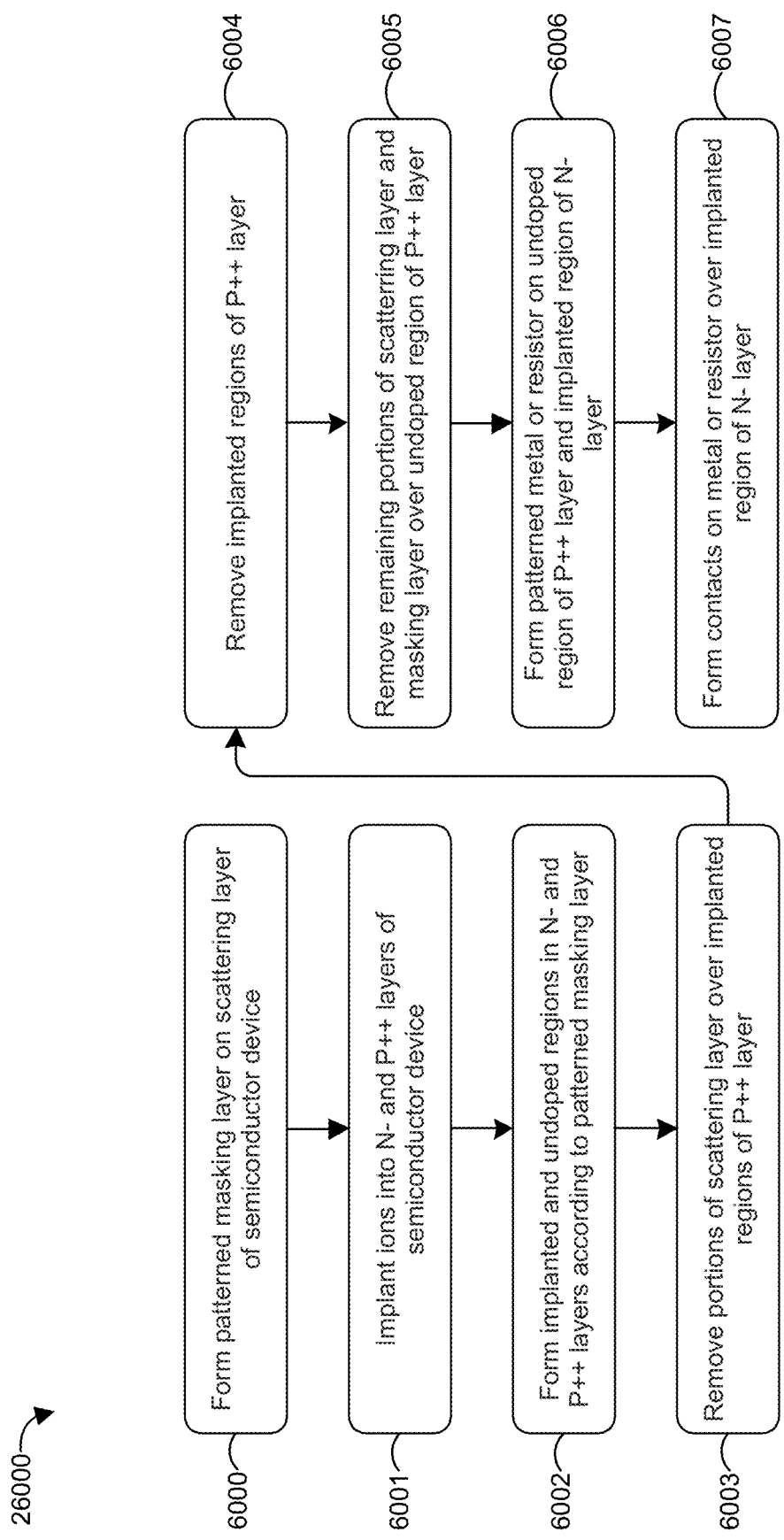
FIG. 26 is a flow chart of a method for manufacturing a semiconductor device according to the third embodiment.

FIG. 26 is a flow chart 26000 of a method for manufacturing a semiconductor device according to the third embodiment. The flow chart 26000 can be performed according to any of FIGS. 14-18, discussed above. In step 6000, a patterned masking layer is formed on a scattering layer of a semiconductor device, the semiconductor device comprising an N− substrate, an N− layer disposed on the N− substrate, a P++ layer disposed on the N− layer, an amorphous or polycrystalline scattering layer disposed on the P++ layer, and a patterned masking layer disposed on the scattering layer. The patterned masking layer can be a photoresist layer, a metal, a dielectric (e.g., the SiO$_2$, Si$_3$N$_4$, etc.), a semiconductor layer, or other masking layer known in the art. The patterned masking layer preferably has vertical or substantially vertical sidewalls, as described above. The patterned masking layer protects at least one region of the underlying N− and P++ layers.

In step 6001, ions are implanted into the N− and P++ layers of the semiconductor device. In step 6002, the ions form implanted and unimplanted regions in the N− and P++ layers according to the patterned masking layer. The implanted and unimplanted regions in the N− and P++ layers define a virtual mesa structure.

In step 6003, the portions of the scattering layer covering the implanted regions of the P++ layer are removed according to the patterned masking layer. As a result of step 6003, the implanted regions of the P++ layer are exposed. In step 6004, the implanted regions of the P++ layer are removed. As a result of step 6004, the implanted regions of the N− layer are exposed. In step 6005, the remaining portions of the scattering layer and the masking layer, both disposed above the unimplanted region of the P++ layer, are removed to expose the unimplanted region of the P++ layer. In step 6006, a patterned metal or resistor is formed on the unimplanted region of the P++ layer and on the implanted region of the N− layer. In some embodiments, a first patterned metal or resistor is formed on a first side of the P++ layer and on a first implanted region of the N− layer, and a second patterned metal or resistor is formed on a second side of the P++ layer and on a second implanted region of the N− layer, for example as illustrated in FIG. 18. In step 6007, contacts are formed on the portion of the patterned metal(s) or resistor(s) disposed over one or both of the implanted region(s) of the N− layer.

Figure 19:
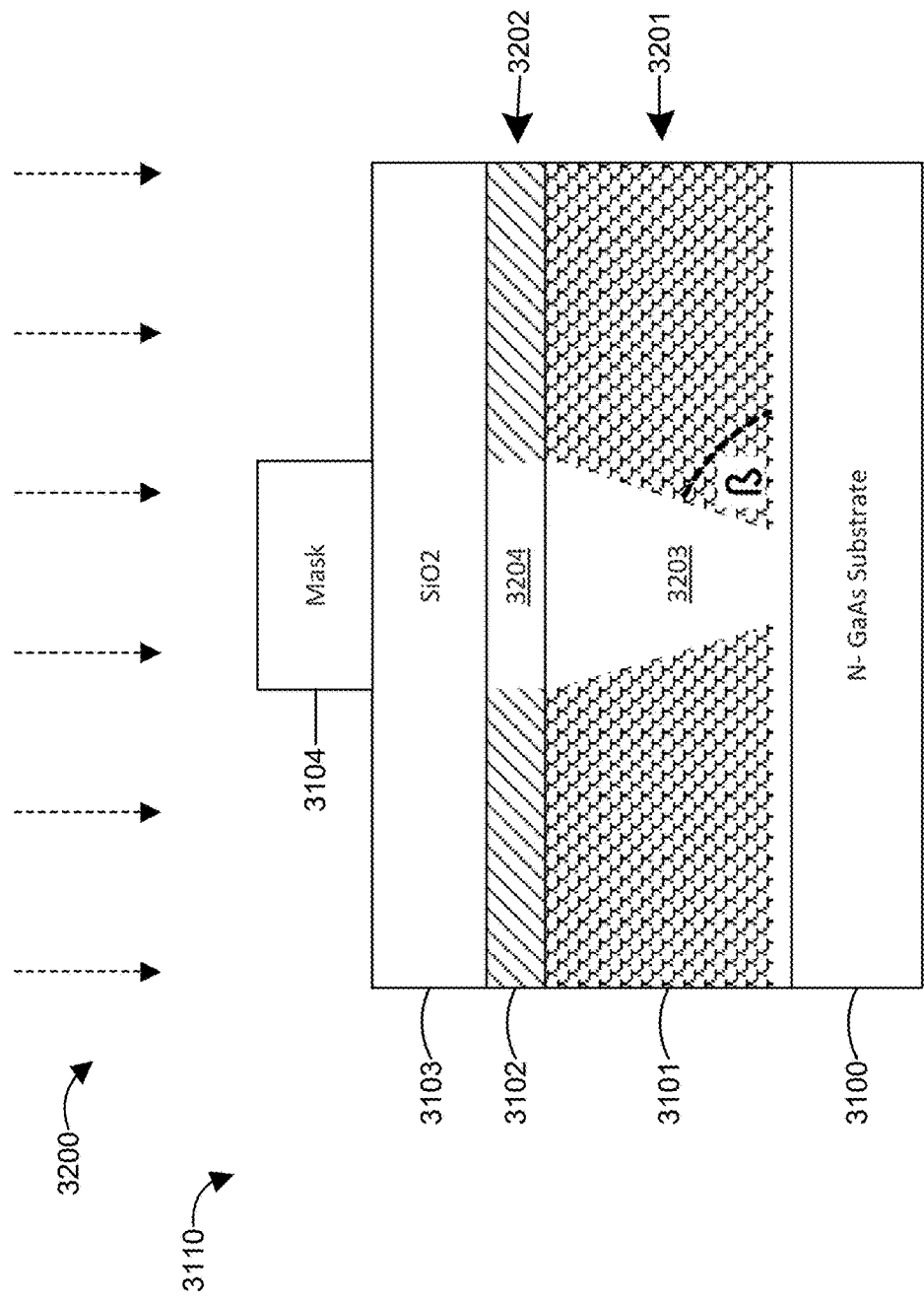
FIG. 19 is a cross section of a semiconductor device to illustrate a manufacturing step according to a fourth embodiment.

FIG. 19 is a cross section of a semiconductor device 3110 to illustrate a manufacturing step according to a fourth embodiment. The semiconductor device 2110 is manufactured in the same or substantially the same way as semiconductor device 10, as described above with respect to FIGS. 1-2, with the exception that scattering layer 3103 is substantially thicker than layer 103. For example, scattering layer 3103 may be as thick as 1000 nm. To maintain the penetration depth of the ions, said ions are implanted 3200 at a higher energy than the ions are implanted 200 in FIG. 2. For example, in FIG. 2, to produce an implantation depth of around 1000 nm in layer 101 using He$^+$ implantation requires an implantation energy of about 200 keV. In FIG. 19 with layer 3103 consisting of SiO$_2$ with a thickness of 1000 nm, producing an implantation depth in layer 3101 using He$^+$ implantation requires and implantation energy of about 325 keV (in other words, about 125 keV of energy is lost in the 1000 nm thickness of SiO$_2$ layer 3103, with the advantageous property that the He$^+$ ions that penetrate through the SiO$_2$ layer 3103 into layers 3102 and 3101 have a broadened distribution of incident angles, producing additional undercut underneath mask 3104 and increasing the bevel angle β. Otherwise, layers, regions, and structures 2100-2104 and 2200-2204 correspond to layers, regions, and structures 100-104 and 200-204. The semiconductor device 3110 can be annealed, for example in the manner described above with respect to FIG. 3.

Figure 20:
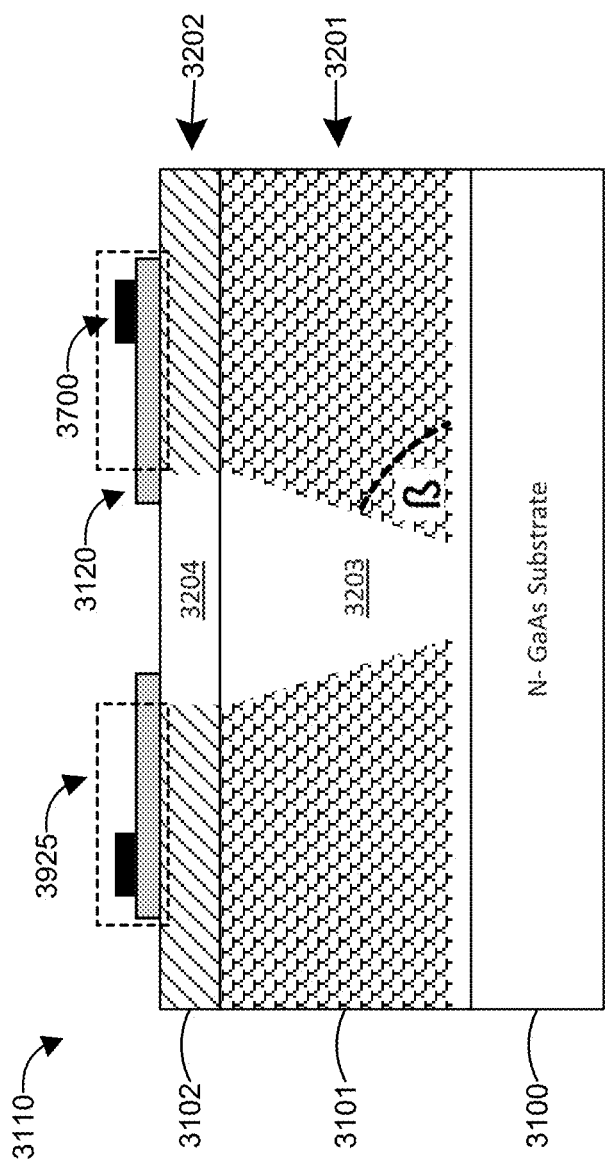
FIG. 20 is a cross section of a semiconductor device to illustrate another manufacturing step according to the fourth embodiment.

FIG. 20 is a cross section of a semiconductor device 3110 to illustrate another manufacturing step according to the fourth embodiment. In FIG. 20, the masking layer 3104 and the amorphous SiO$_2$ layer 3103 have been removed (e.g., etched) and the semiconductor device 1110 has been annealed. A conductive (e.g., metal) or resistive layer 3120 is then deposited and patterned on implanted regions 3202 and unimplanted region 3204 of P++ GaAs layer 3102. The portion of layer 3120 on the implanted regions 3202 functions as a planar guard ring 3925, as indicated by the dashed line in FIG. 20. A p-type metal contact 3700 is then deposited and patterned on layer 3120 over each implanted region 3202.

It is noted that an array of semiconductor devices 3110 can be formed in the same N− GaAs substrate 3100 according to the methods described herein.

Figure 27:
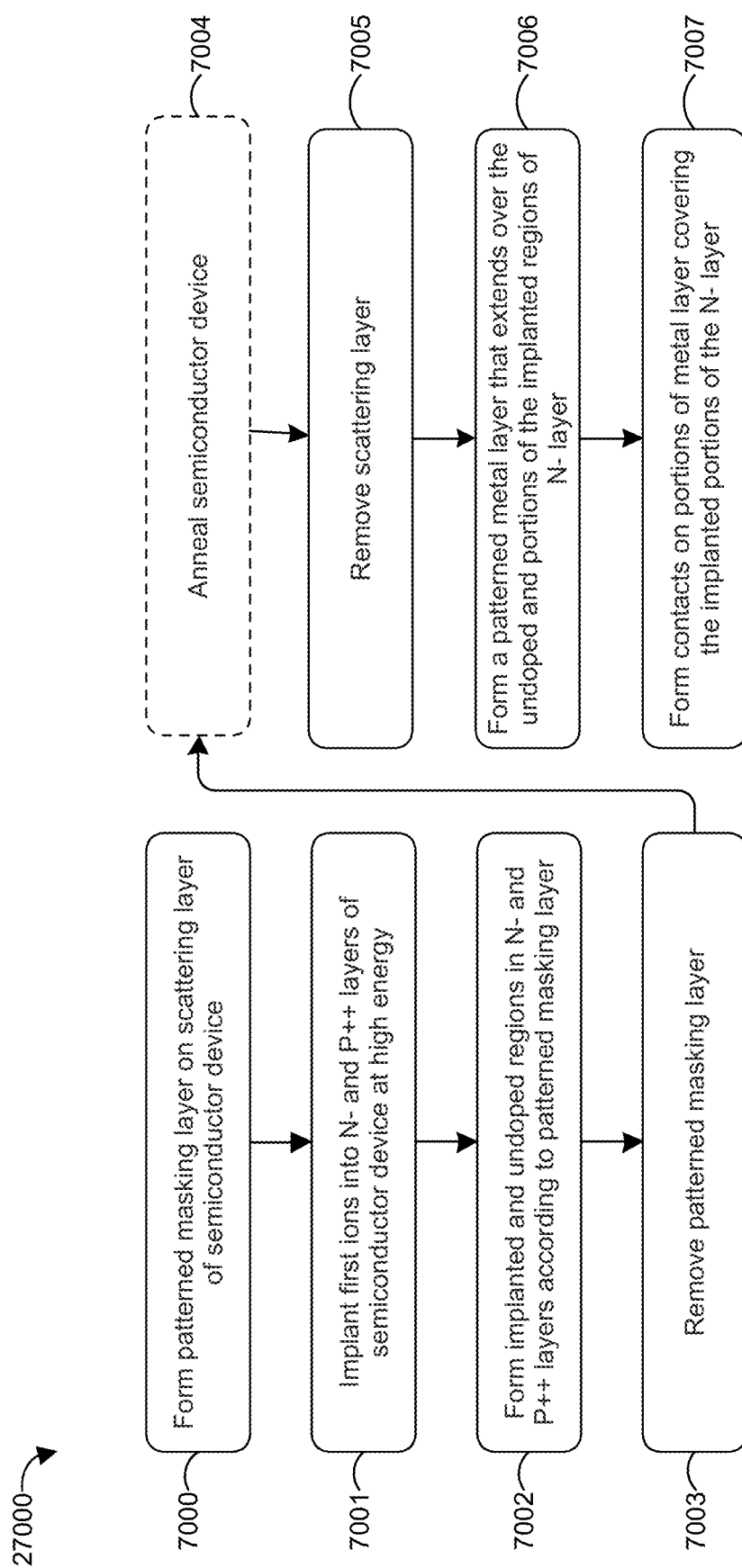
FIG. 27 is a flow chart of a method for manufacturing a semiconductor device according to the fourth embodiment.

FIG. 27 is a flow chart 27000 of a method for manufacturing a semiconductor device according to the fourth embodiment. The flow chart 27000 can be performed according to any of FIGS. 19-20, discussed above. In step 7000, a patterned masking layer is formed on a scattering layer of a semiconductor device, the semiconductor device comprising an N− substrate, the N− layer disposed on the N− substrate, the P++ layer disposed on the N− layer, a scattering layer disposed on the P++ layer, and a patterned masking layer disposed on the scattering layer. The patterned masking layer can be a photoresist layer, a metal, a dielectric (e.g., the SiO$_2$, Si$_3$N$_4$, etc.), a semiconductor layer, or other masking layer known in the art. The patterned masking layer preferably has vertical or substantially vertical sidewalls, as described above. The patterned masking layer protects at least one region of the underlying N− and P++ layers.

In step 7001, ions are implanted at a high energy into N– and P++ layers of the semiconductor device. In step 7002, the ions form implanted and unimplanted regions in the N– and P++ layers according to the patterned masking layer. The implanted and unimplanted regions in the N– and P++ layers define a virtual mesa structure. The ions are deposited at a sufficient energy that the implanted regions in the N-layer such that it converts the implanted regions to insulators.

In step 7003, the patterned masking layer is removed (e.g., etched). In optional step 7004, the semiconductor device is annealed, for example as described above with respect to FIG. 3. In step 7005, the scattering layer is removed (e.g., etched) to expose the P++ layer. In step 7006, a patterned metal or resistor on portions of the unimplanted region and the implanted regions of the P++ layer, for example as illustrated in FIG. 20. In step 7007, contacts are formed on the portion of the patterned metal or resistor disposed over one or both of the implanted region(s) of the P++ layer.

Figure 21:
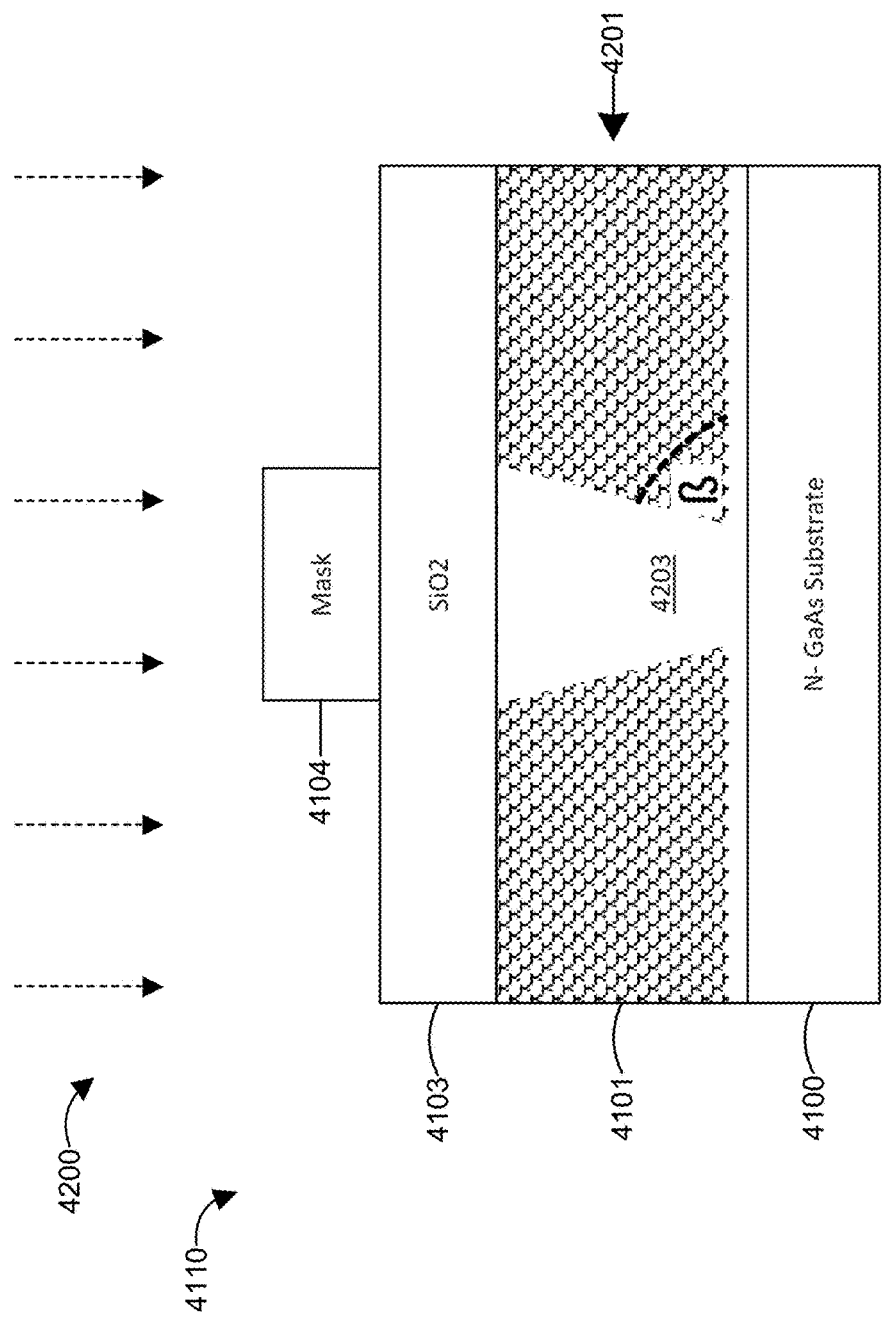
FIG. 21 is a cross section of a semiconductor device to illustrate a manufacturing step according to the fifth embodiment.

FIG. 21 is a cross section of a semiconductor device 4110 to illustrate a manufacturing step according to a fifth embodiment. This manufacturing step is the same or similar to that described with respect to FIG. 19 (e.g., high-energy ion implantion) but without P++ GaAs layer 3102. Thus, the ions are implanted through amorphous $SiO_2$ layer 4103 to N– GaInP layer 4101. Otherwise, layers 4100-4101, 4103-4104, and 4200-4201 correspond to layers 3100-3101, 3103-3104, and 3200-3201, respectively.

Figure 22:
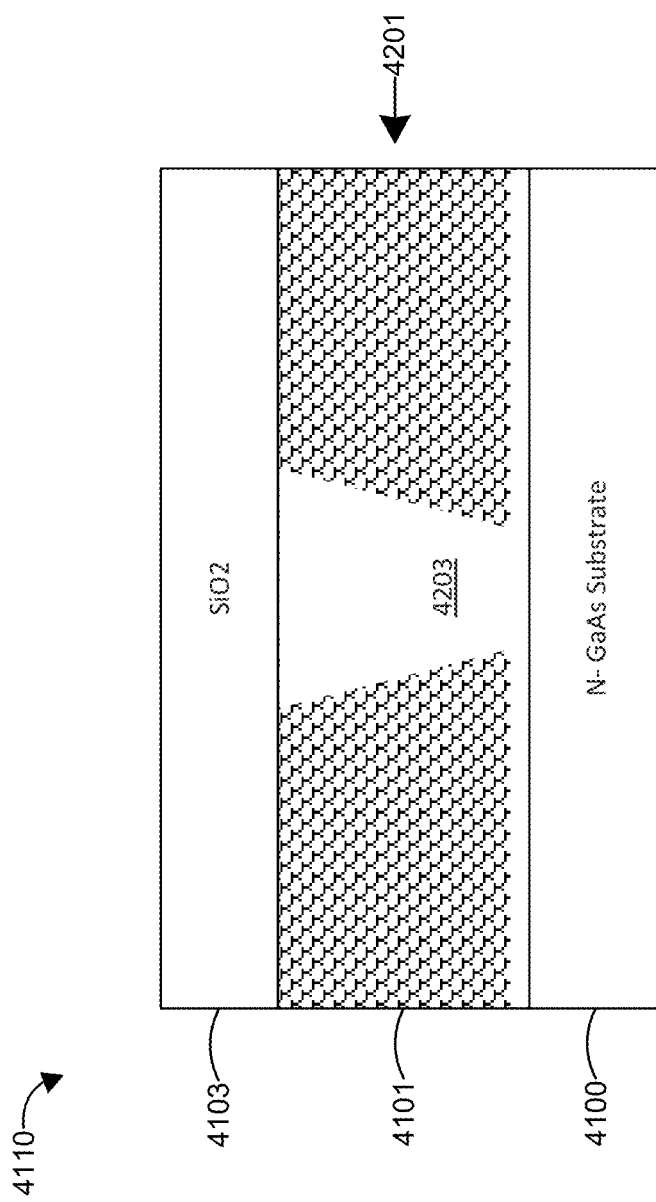
FIG. 22 is a cross section of a semiconductor device to illustrate another manufacturing step according to the fifth embodiment.

FIG. 22 is a cross section of a semiconductor device 4110 to illustrate another manufacturing step according to the fifth embodiment. In FIG. 22, the masking layer 4104 has been removed (e.g., etched) and then the device 4110 is annealed (e.g., as described above with respect to FIG. 3).

Figure 23:
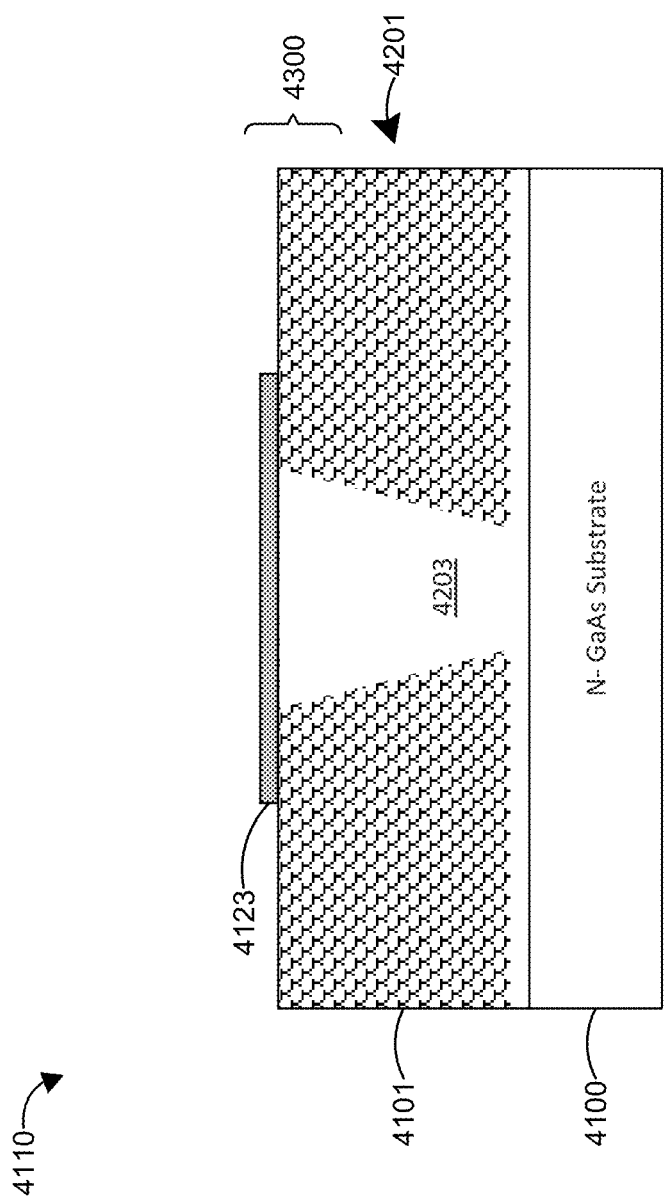
FIG. 23 is a cross section of a semiconductor device to illustrate another manufacturing step according to the fifth embodiment.

FIG. 23 is a cross section of a semiconductor device 4110 to illustrate another manufacturing step according to the fifth embodiment. In FIG. 23, the amorphous $SiO_2$ layer 4103 has been removed (e.g., etched) and then a metal layer 4123 is deposited and patterned on the N– GaInP layer 4101 including on the unimplanted region 4203 and on implanted regions 4201. In some embodiments, metal layer 4123 is semitransparent as described above. In other embodiments, backside illumination through the substrate can be used, so metal layer 4123 does not need to be transparent in these cases. Metal layer 4123 functions as the metal side of Schottky diode 4300. The unimplanted region 4203 of N– GaInP layer 4101 functions as the semiconductor side of Schottky diode 4300.

Figure 24:
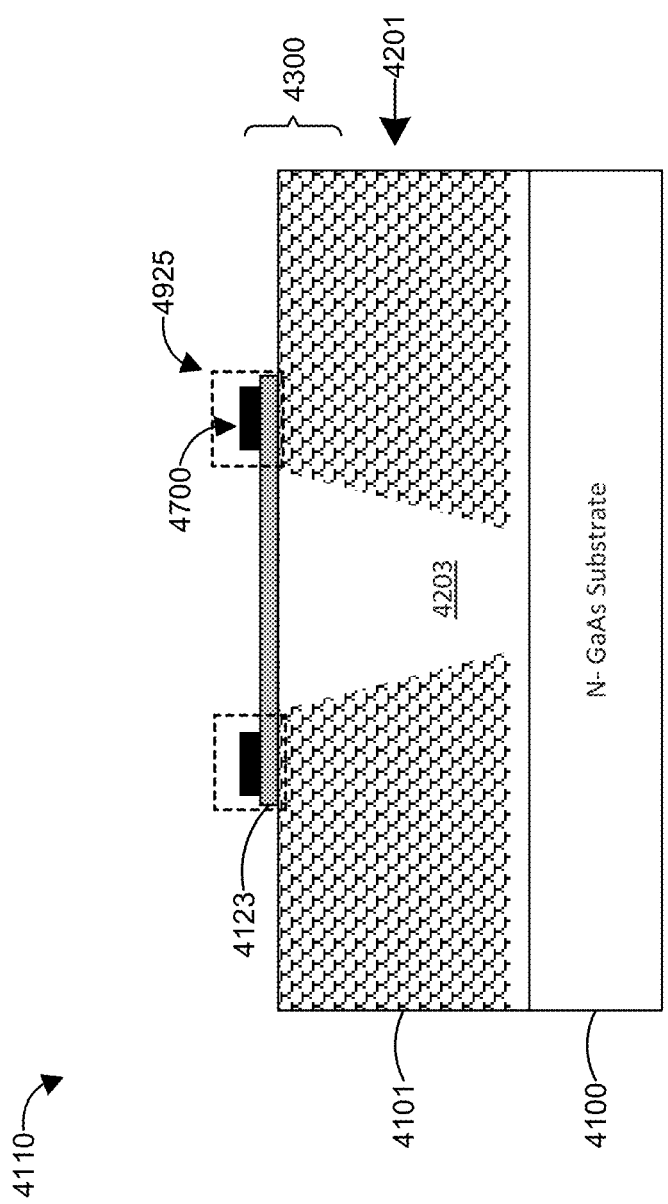
FIG. 24 is a cross section of a semiconductor device to illustrate another manufacturing step according to the fifth embodiment.

FIG. 24 is a cross section of a semiconductor device 4110 to illustrate another manufacturing step according to the fifth embodiment wherein metal layer 4123 is semitransparent. A thicker P-type metal contact 4700 is deposited and patterned on layer 4123 over each implanted region 4201. The portion of layer 4123 on each implanted region 4201 functions as a guard ring 3925, as indicated by the dashed line in FIG. 24.

It is noted that an array of semiconductor devices 3110 can be formed in the same N– GaAs substrate 3100 according to the methods described herein.

It is noted that the foregoing exemplary embodiments are described as having a P++ layer (e.g., P++ GaAs layer 102) deposited on an N– layer (e.g., N– GaInP layer 101). However, the same principles would also apply for a device having an N++ layer deposited on a P– layer. Thus, P++ layers 102, 2102, and/or 3102 can be N++ layers, and N– layers 101, 2101, 3101, and/or 4101 can be P– layers.

Figure 28:
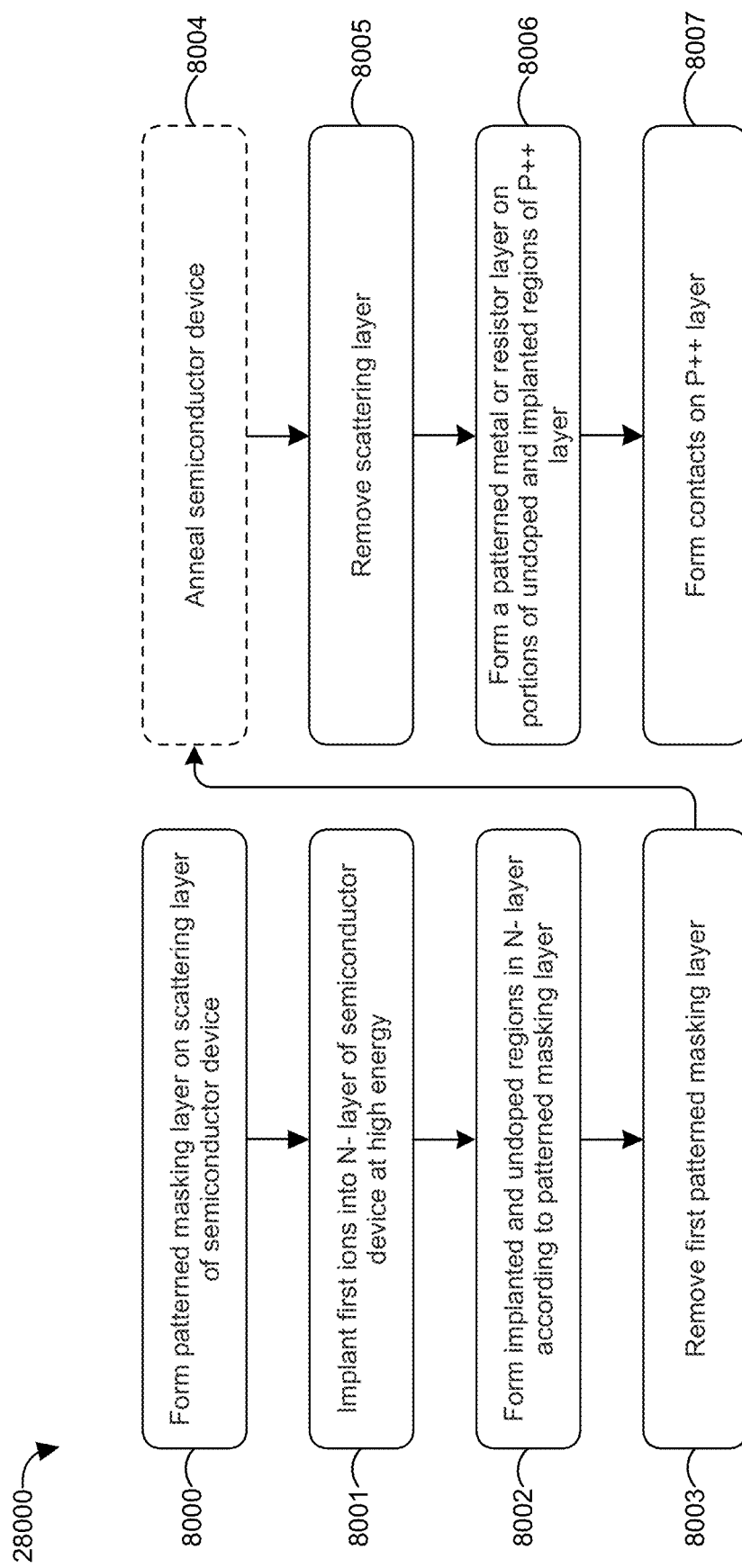
FIG. 28 is a flow chart of a method for manufacturing a semiconductor device according to the fifth embodiment.

FIG. 28 is a flow chart 28000 of a method for manufacturing a semiconductor device according to the fifth embodiment. The flow chart 28000 can be performed according to any of FIGS. 21-24, discussed above. In step 7000, a patterned masking layer is formed on a scattering layer of a semiconductor device, the semiconductor device comprising an N– substrate, an N– layer disposed on the N– substrate, a scattering layer disposed on the N– layer, and a patterned masking layer disposed on the scattering layer. The patterned masking layer can be a photoresist layer, a metal, a dielectric (e.g., the $SiO_2$, $Si_3N_4$, etc.), a semiconductor layer, or other masking layer known in the art. The patterned masking layer preferably has vertical or substantially vertical sidewalls, as described above. The patterned masking layer protects at least one region of the underlying N– layer.

In step 8001, ions are implanted into an N– layer of the semiconductor device. In step 8002, the ions form implanted and unimplanted regions in the N– layer according to the patterned masking layer. The implanted and unimplanted regions in the N– layer defines a virtual mesa structure.

In step 7003, the patterned masking layer is removed (e.g., etched). In optional step 7004, the semiconductor device is annealed, for example as described above with respect to FIG. 3. In step 7005, the scattering layer is removed (e.g., etched) to expose the P++ layer. In step 7006, a patterned metal layer is deposited on the N– layer. The patterned metal extends over the unimplanted region and portions of the implanted regions of the N– layer, for example as illustrated in FIGS. 23 and 24, thereby forming a Schottky diode. In step 7007, contacts are formed on the portions of the patterned metal layer disposed over the implanted regions of the N– layer.

Figure 29:
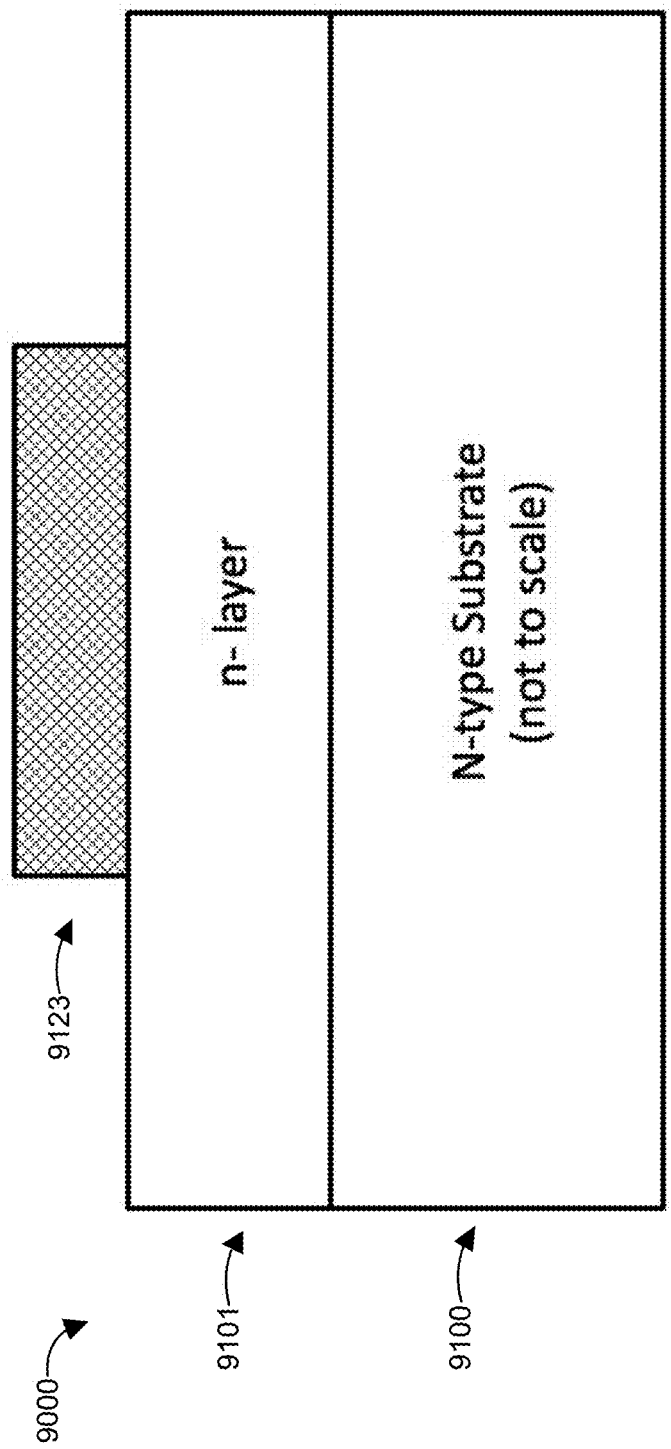
FIG. 29 is a cross section of a semiconductor device to illustrate a first manufacturing step according to a sixth embodiment.

FIG. 29 is a cross section of a semiconductor device 9000 to illustrate a first manufacturing step according to a sixth embodiment. The semiconductor device 9000 includes an N-type substrate layer 9100 and an N– layer 9101. N-type substrate layer 9100 and an N– layer 9101 can be the same as or similar to N– GaAs substrate layer 100 and N– GaInP layer 101, respectively, discussed above. A metal layer 9123 is deposited and patterned on the N– layer 9101, as illustrated. Each of the foregoing layers 9100, 9101, and 9123 can be deposited by conventional semiconductor fabrication processes. For example, layers 9100 and 9101 can be formed epitaxially or by ion implantation. Metal layer 9123 can be deposited by physical vapor deposition, chemical vapor deposition, and/or electroplating.

Figure 30:
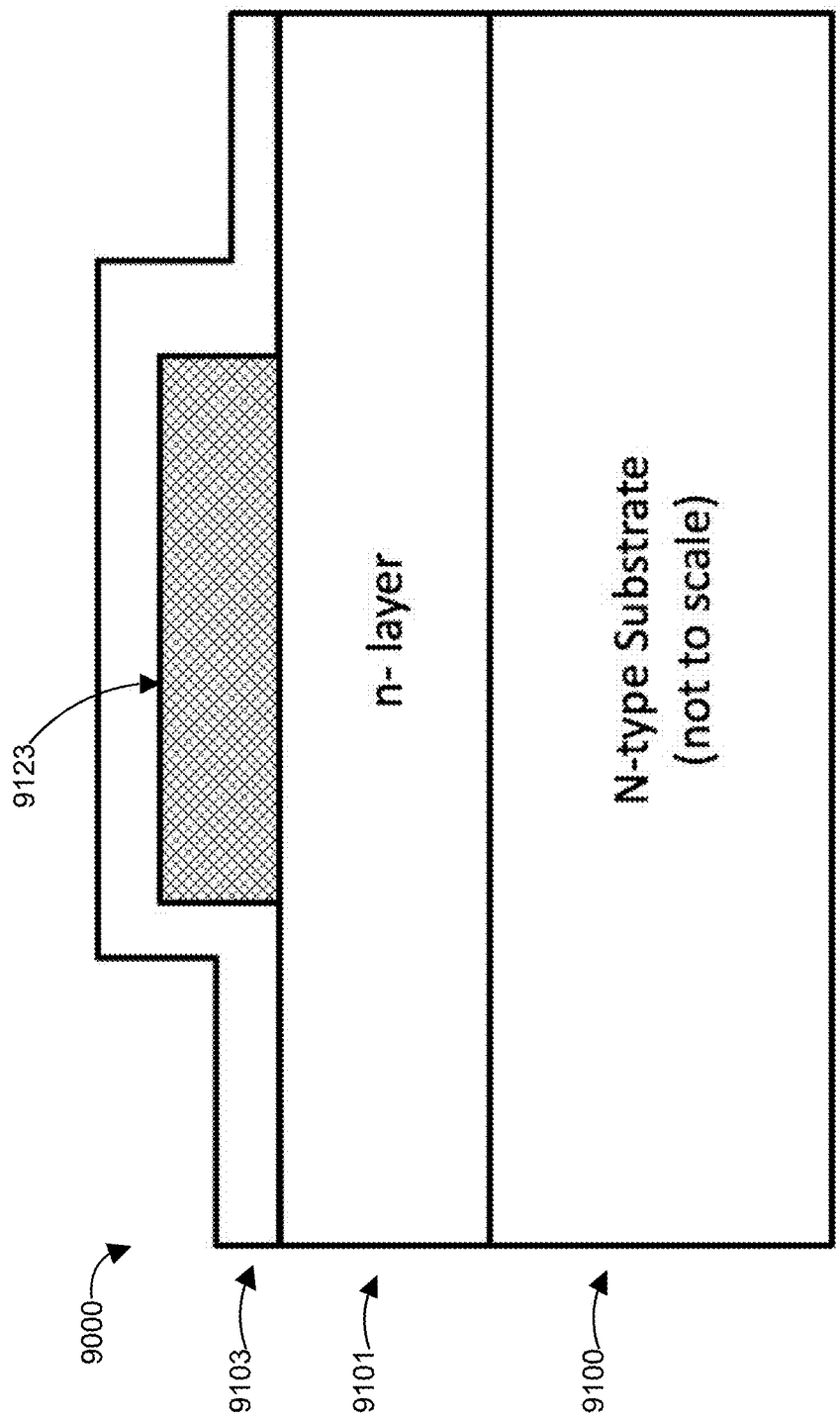
FIG. 30 is a cross section of the semiconductor device to illustrate another manufacturing step according to the sixth embodiment.

FIG. 30 is a cross section of the semiconductor device 9000 to illustrate another manufacturing step according to the sixth embodiment. As illustrated in FIG. 30, an optional amorphous layer 9103 (e.g., amorphous $SiO_2$) is deposited on N– layer 9101 and on metal layer 9123. Optional amorphous layer 9103 can be the same as or similar to optional amorphous layer 103, discussed above.

Figure 31:
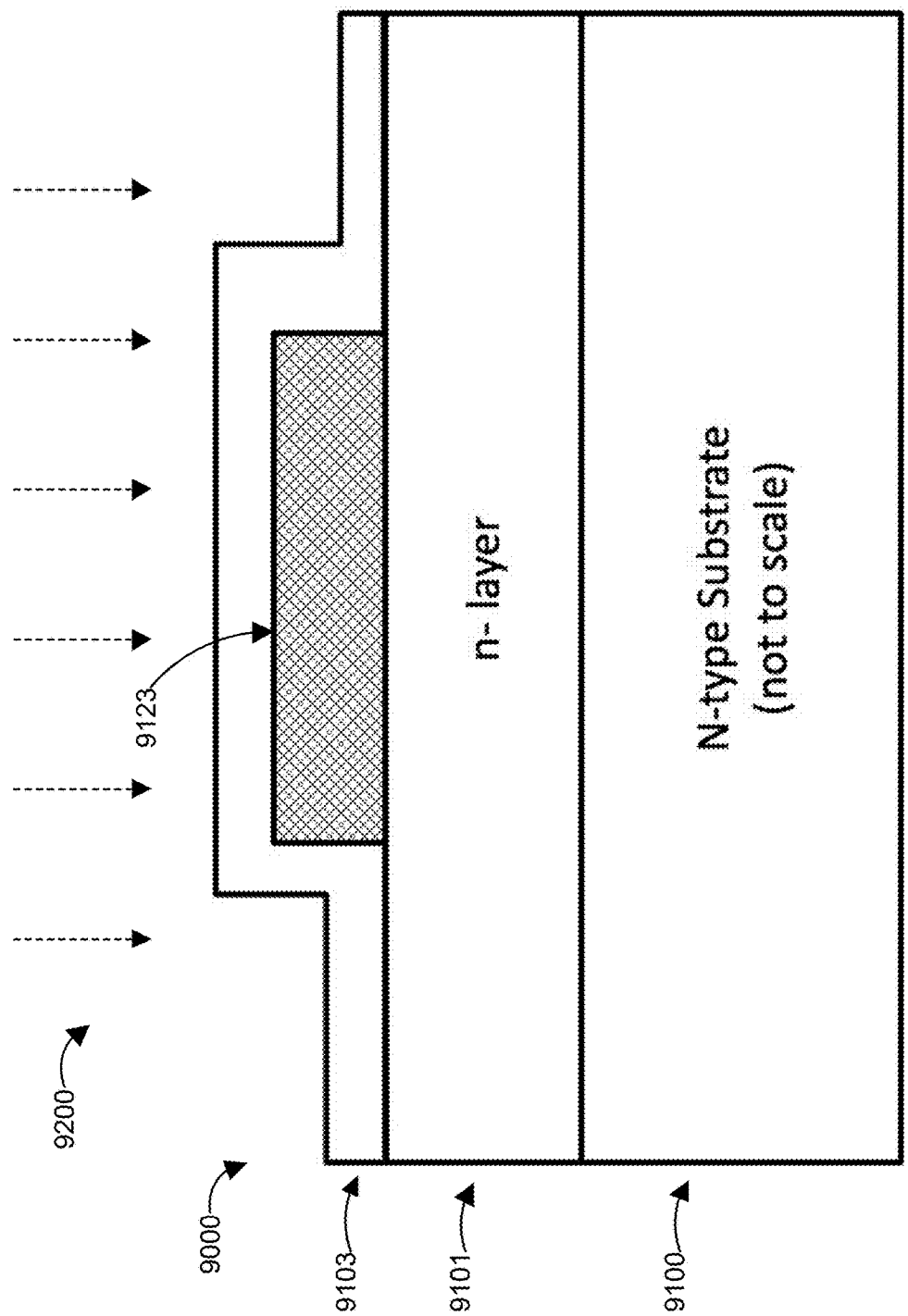
FIG. 31 is a cross section of the semiconductor device to illustrate another manufacturing step according to the sixth embodiment.

FIG. 31 is a cross section of the semiconductor device 9000 to illustrate another manufacturing step according to the sixth embodiment. In this manufacturing step, ions 9200 are implanted into device 9000. The implanted ions 9200 can include $H^+$, $He^+$, $O^+$, $N^+$, $Ar^+$, $As^+$, $Si^+$, $Be^+$, $Zn^+$, $B^+$, $Al^+$, $Ga^+$, $In^+$, $P^+$, or another ion as known in the semiconductor ion implantation arts, or a combination of any of the foregoing. The ions have sufficient energy such that they pass through optional amorphous layer 9103 and into layer 9101.

Figure 32:
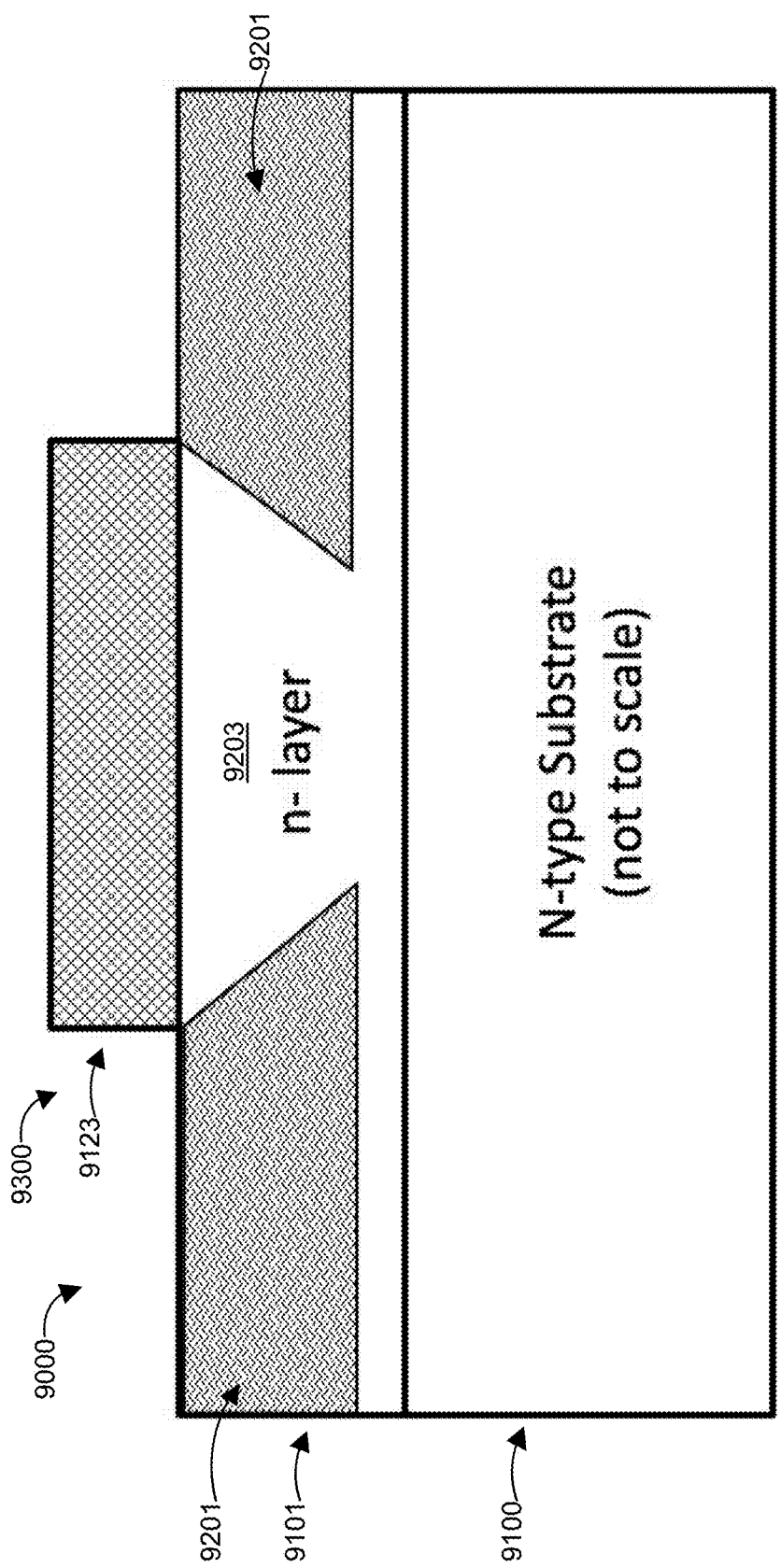
FIG. 32 is a cross section of the semiconductor device to illustrate another manufacturing step according to the sixth embodiment.

FIG. 32 is a cross section of the semiconductor device 9000 to illustrate another manufacturing step according to the sixth embodiment. As a result of the ion implantation illustrated in FIG. 31, layer 9101 includes implant isolated regions 9201. The implanted regions 9201 exhibit a lower net doping concentration than unimplanted region 9203 because the implanted ions form defects that compensate the doping in layer 9101. These defects may be deep levels or shallow donors/acceptors as long as the effect is a lower net doping density in implant isolated region 9201. In some embodiments, implant isolated region 9201 can exhibit many orders of magnitude reduction in net free carrier concentration. In alternative embodiments, the reduction in net free carrier concentration may be as small as an order of magnitude. In still other embodiments, the implant may cause the net free carrier type to switch from n-type to p-type, provided that the magnitude of the doping density in implant isolated region 9201 remains at least an order of magnitude lower than the magnitude of the doping density in unimplanted region 9203. Note that, in general, implant isolated regions 9201 do not isolate adjacent diode elements in an array, since substrate 9100 provides a low resistance path between unimplanted regions 203 that form the cathode connection to the diodes (also referred to as a common cathode connection). Aspects of this are described in U.S. Patent Application Publication No. 2004/0245592, as discussed above. Metal layer 9123 functions as the metal side of a Schottky diode 9300. The unimplanted region 9203 of N− layer 9101 functions as the semiconductor side of Schottky diode 9300.

Figure 33:
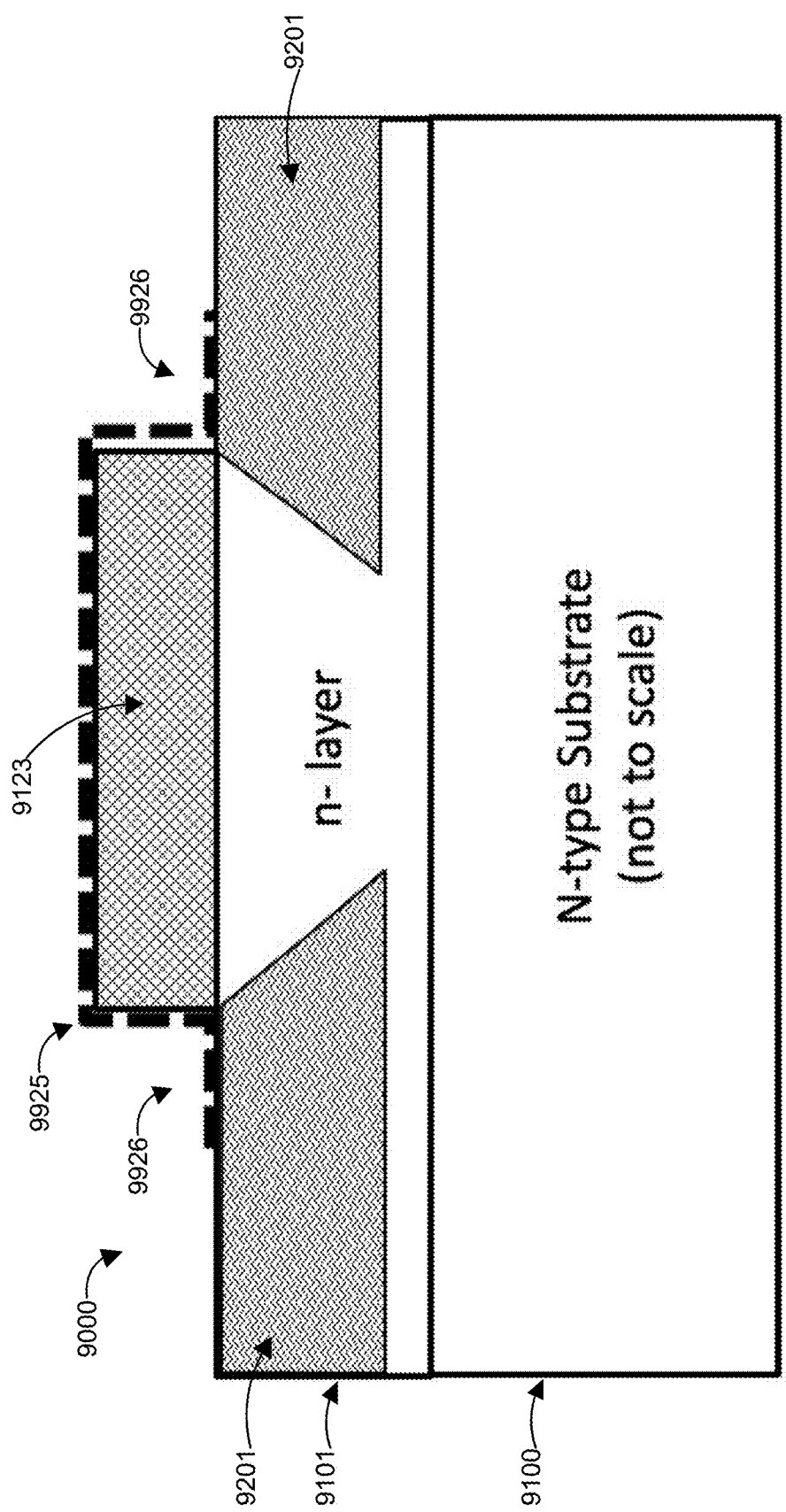
FIG. 33 is a cross section of the semiconductor device to illustrate another manufacturing step according to the sixth embodiment.

FIG. 33 is a cross section of the semiconductor device 9000 to illustrate another manufacturing step according to the sixth embodiment. Metal layer 9925 is deposited on top of metal layer 9123 and on top of a portion of implanted region 9201 to form a guard ring 9926 over the implant isolated regions 9201.

It is noted that an array of semiconductor devices 9000 can be formed in the same N− GaAs substrate 9100 according to the methods described herein.

Figure 34:
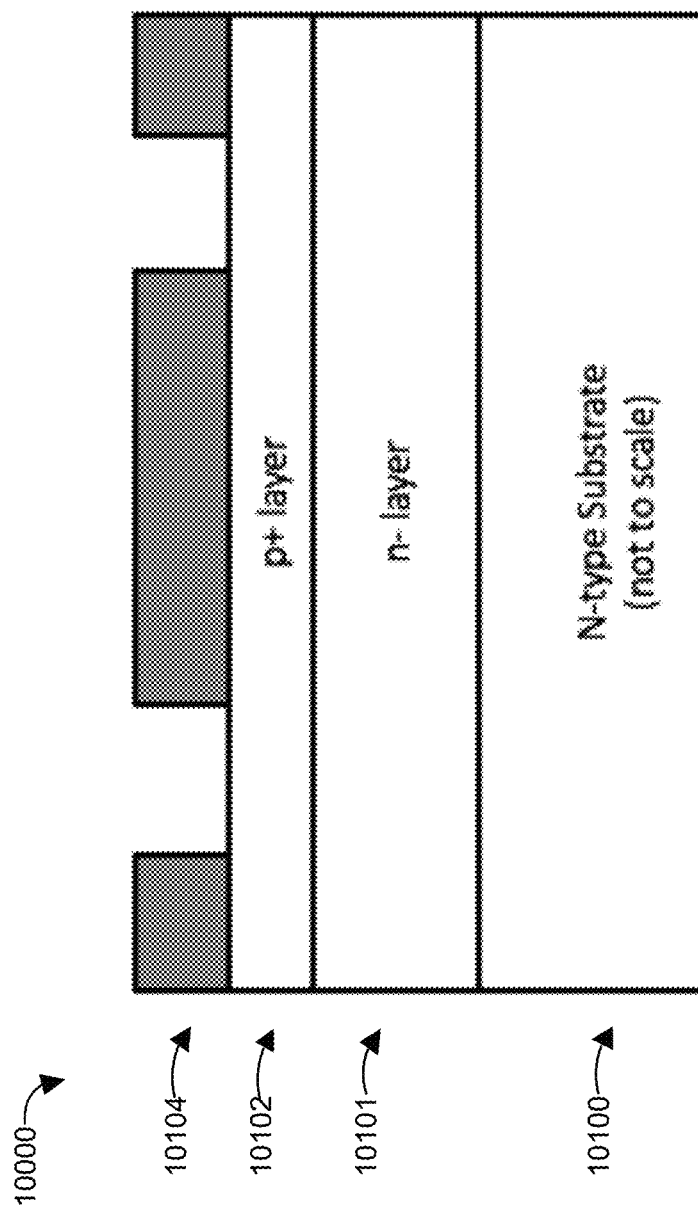
FIG. 34 is a cross section of a semiconductor device to illustrate a first manufacturing step according to a seventh embodiment.

FIG. 34 is a cross section of a semiconductor device 10000 to illustrate a first manufacturing step according to a seventh embodiment. The semiconductor device 10000 includes an N-type substrate layer 10100, an N− layer 10101, and a P+ layer 10102. N-type substrate layer 10100, N− layer 10101, and P+layer 10102 can be the same as or similar to N− GaAs substrate layer 100, N− GaInP layer 101, and P++ GaAs layer 102, respectively, discussed above. A masking layer 10104 is deposited and patterned on the P+ layer 10102, as illustrated. Masking layer 10104 can be the same as or similar to masking layer 104, discussed above. Each of the foregoing layers 10100, 10101, 10102, and 10104 can be deposited by conventional semiconductor fabrication processes. For example, layers 10100, 10101, and 10102 can be formed epitaxially or by ion implantation. Masking layer 10104 can be deposited by physical vapor deposition or chemical vapor deposition, and/or by spinning on.

Figure 35:
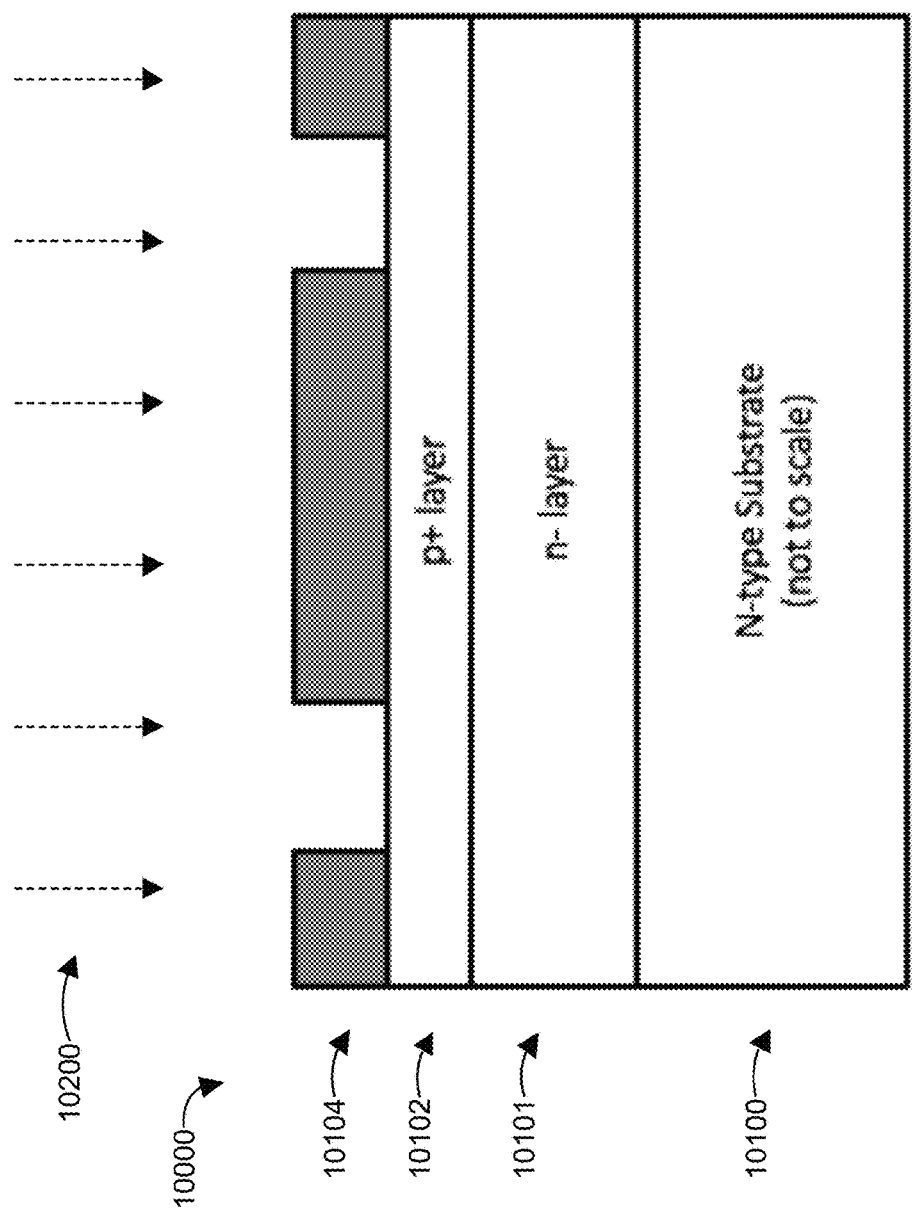
FIG. 35 is a cross section of the semiconductor device to illustrate another manufacturing step according to the seventh embodiment.

FIG. 35 is a cross section of the semiconductor device 10000 to illustrate another manufacturing step according to the seventh embodiment. In this manufacturing step, ions 10200 are implanted into device 10000. The implanted ions 10200 can include $H^+$, $He^+$, $O^+$, $N^+$, $Ar^+$, $As^+$, $Si^+$, $Be^+$, $Zn^+$, $B^+$, $Al^+$, $Ga^+$, $In^+$, $P^+$, or another ion as known in the semiconductor ion implantation arts, or a combination of any of the foregoing. The ions have sufficient energy such that they pass through layer 10102 and into N− layer 10101.

Figure 36:
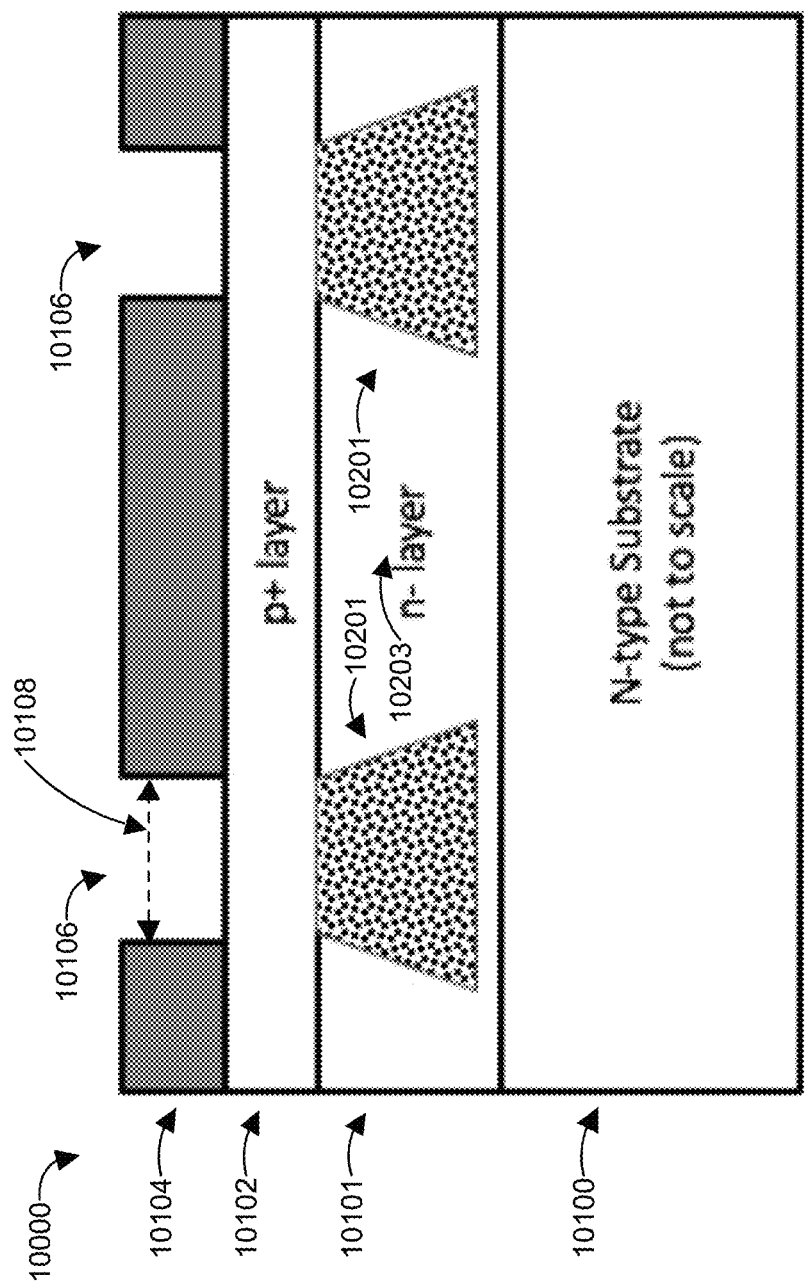
FIG. 36 is a cross section of the semiconductor device to illustrate another manufacturing step according to the seventh embodiment.

FIG. 36 is a cross section of the semiconductor device 10000 to illustrate another manufacturing step according to the seventh embodiment. In this manufacturing step, implanted-isolated regions 10201 are formed in N− layer 10101 and correspond to the cross-sectional width 10108 and position of gaps 10106 in the masking layer 10104. The remaining portions of N− layer 10101 are unimplanted regions 10203. The magnitude of the doping density in implant-isolated regions 10201 is at least an order of magnitude lower than the magnitude of the doping density in unimplanted regions 10204. The relative magnitudes of the doping density in implant-isolated regions 10201 and in unimplanted regions 10204 can cause the net free carrier type of the implanted-isolated regions 10201 to convert from n-type to p-type. The unimplanted regions 10204 remain n-type.

Figure 37:
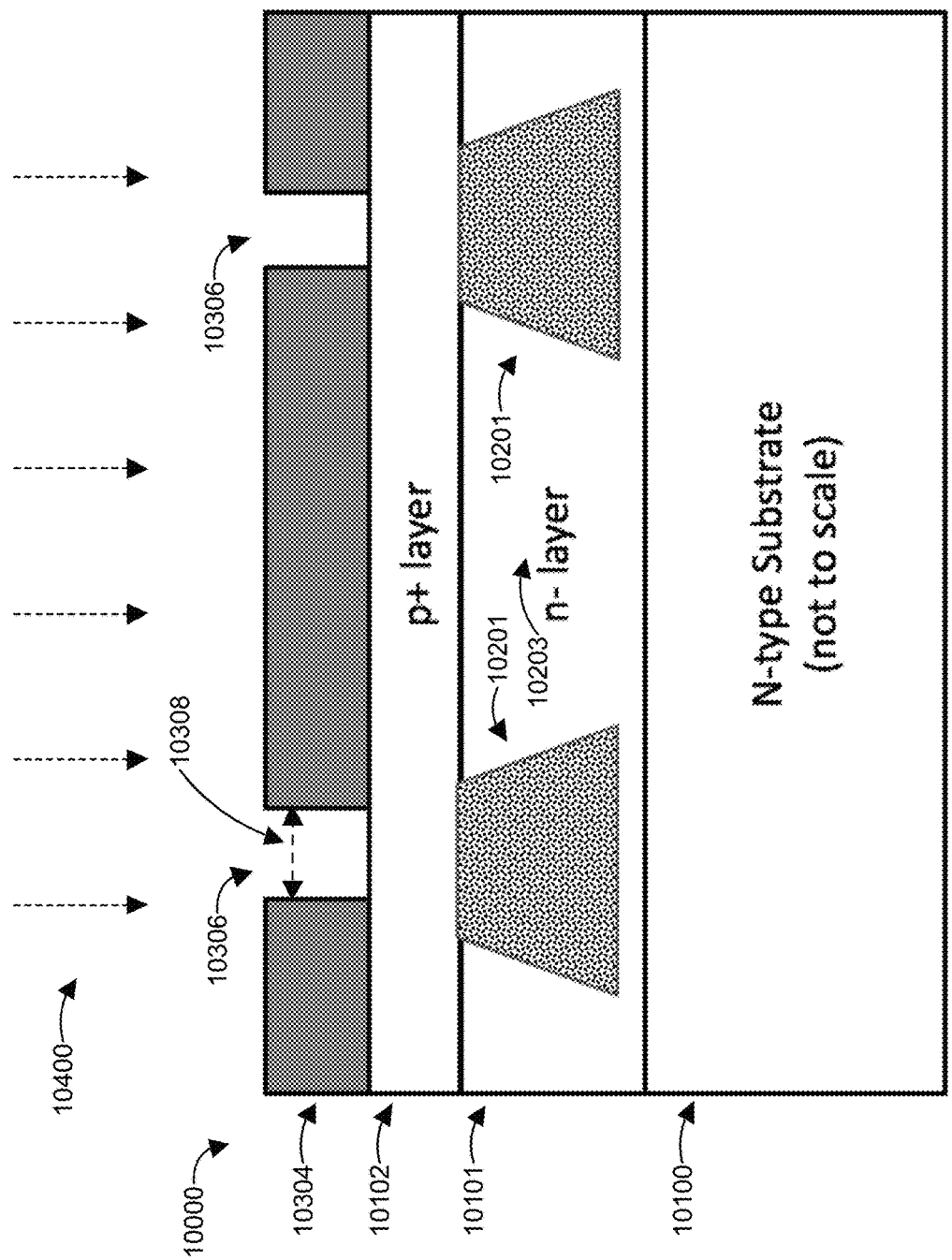
FIG. 37 is a cross section of the semiconductor device to illustrate another manufacturing step according to the seventh embodiment.

FIG. 37 is a cross section of the semiconductor device 10000 to illustrate another manufacturing step according to the seventh embodiment. In this manufacturing step, the masking layer 10104 is removed and replaced with a second masking layer 10304, which is patterned to have gaps 10306 having a cross-sectional width 10308. Second ions 10400 are implanted into the device 10000. The second ions 10400 can be the same or different than the implanted ions 10200.

Figure 38:
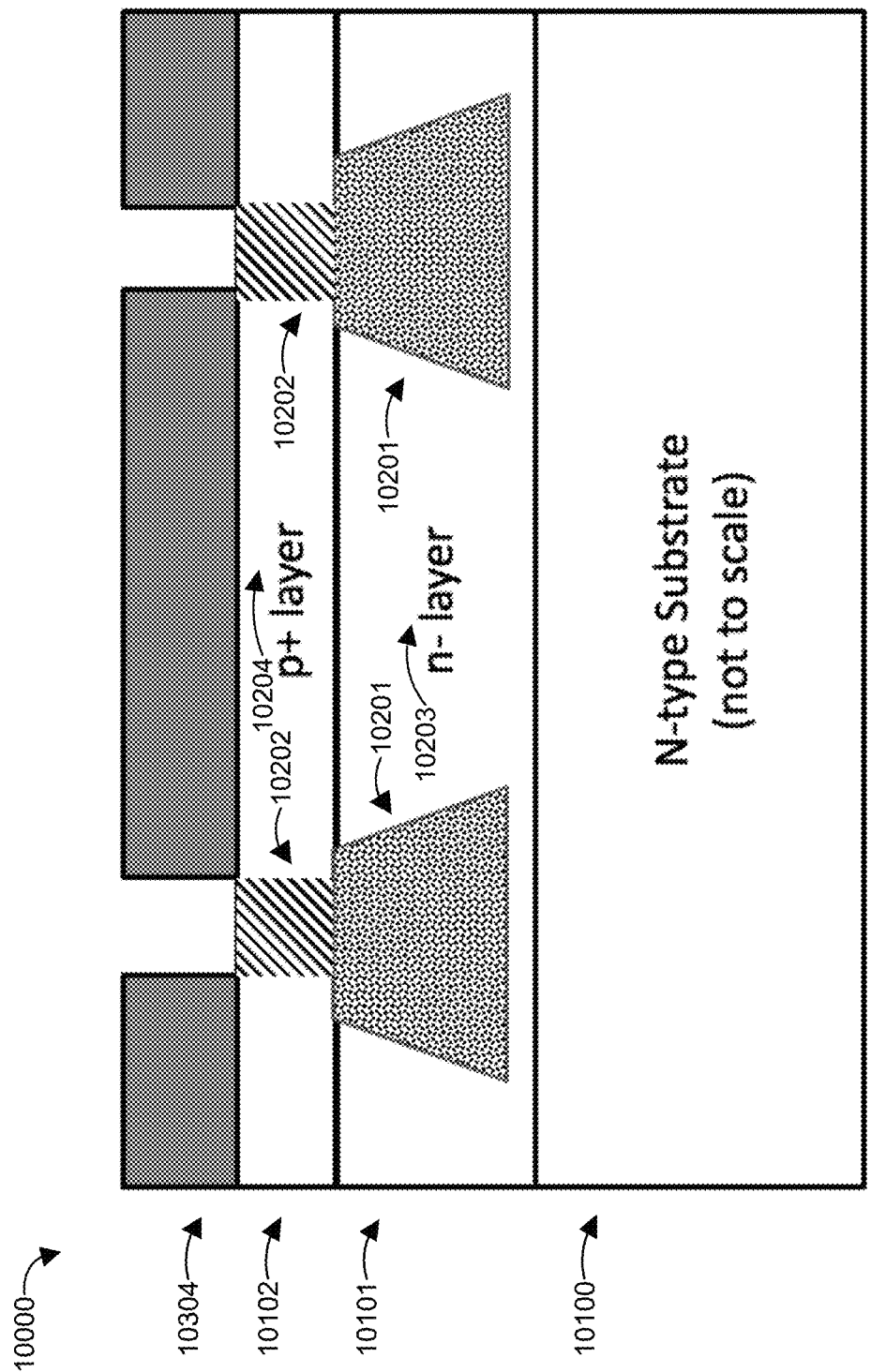
FIG. 38 is a cross section of the semiconductor device to illustrate another manufacturing step according to the seventh embodiment.

FIG. 38 is a cross section of the semiconductor device 10000 to illustrate another manufacturing step according to the seventh embodiment. In this manufacturing step, second implanted-isolated regions 10202 are formed in P+ layer 10102 and correspond to the cross-sectional width 10308 and position of the gaps 10306 in the second masking layer 10304. The remaining portions of P+ layer 10102 are unimplanted regions 10204. The second implanted regions 10202 can form an insulator or a resistor depending on the concentration of ions implanted therein (e.g., as discussed above with respect to FIG. 6).

Figure 39:
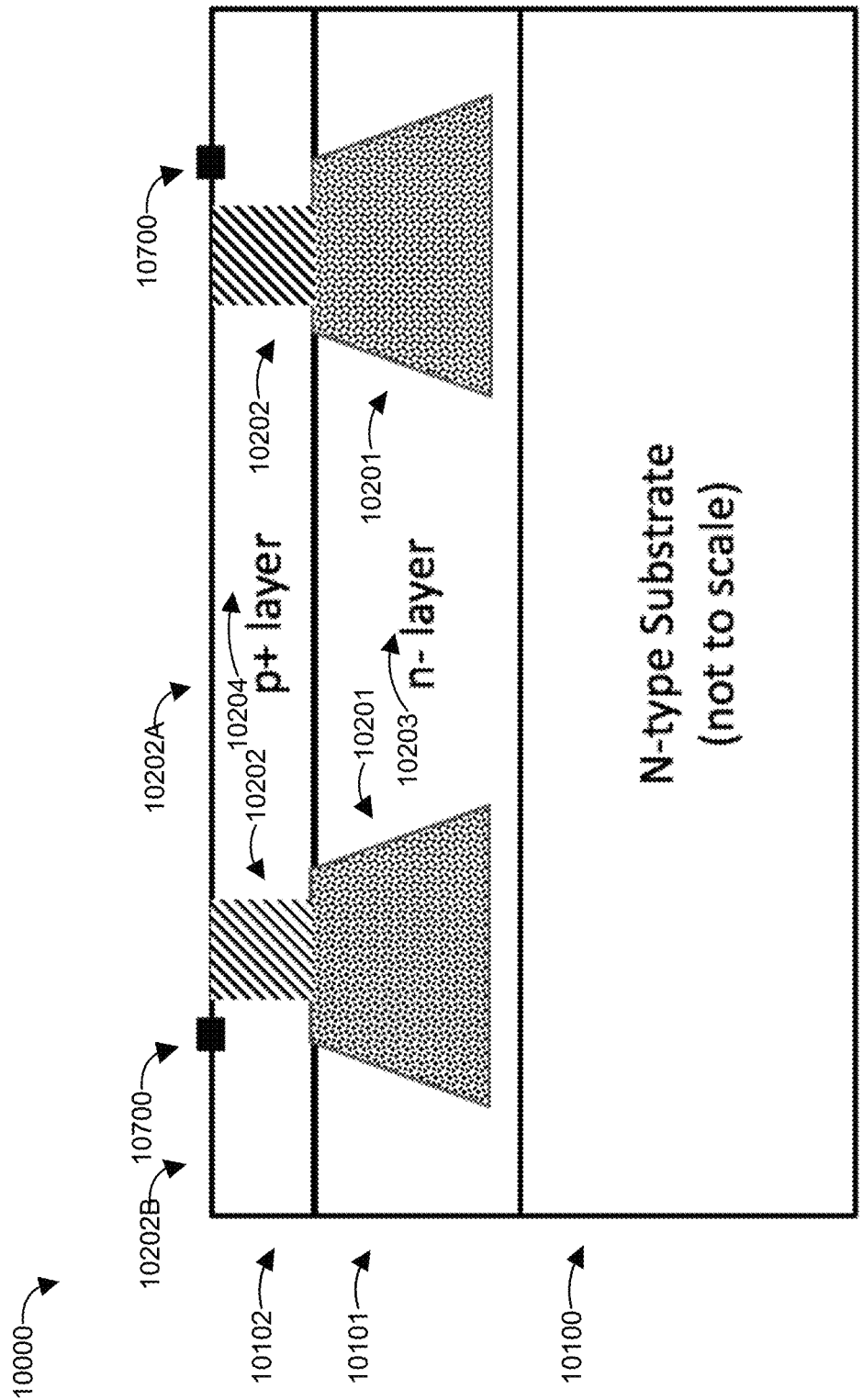
FIG. 39 is a cross section of the semiconductor device to illustrate another manufacturing step according to the seventh embodiment.

FIG. 39 is a cross section of the semiconductor device 10000 to illustrate another manufacturing step according to the seventh embodiment. In this manufacturing step, the second masking layer 10304 is removed and p-type metal contacts 10700 are deposited and patterned on P+ layer 10102 adjacent to second implanted-isolated regions 10202. When second implanted region 10202 is an insulator, a capacitor is formed by P-type contact 10700, outer unimplanted region 10202B, second implanted region 10202, and middle unimplanted region 10202B.

Figure 40:
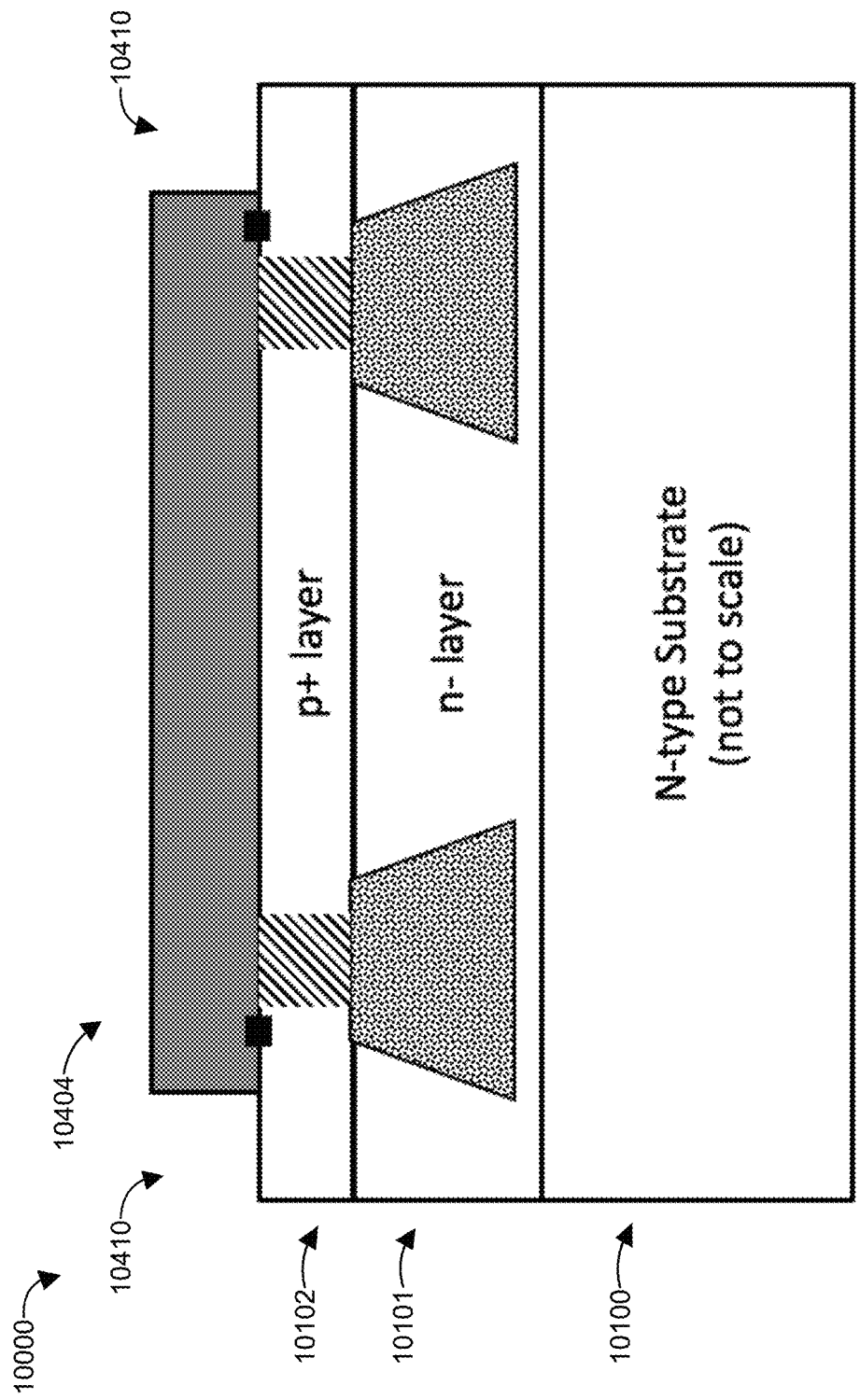
FIG. 40 is a cross section of the semiconductor device to illustrate another manufacturing step according to the seventh embodiment.

FIG. 40 is a cross section of the semiconductor device 10000 to illustrate another manufacturing step according to the seventh embodiment. In this manufacturing step, a third masking layer 10404 is deposited and patterned on P+ layer 10102. The third masking layer 10404 is defined such that outer regions 10410 of P+ layer 10102 are exposed for subsequent removal.

Figure 41:
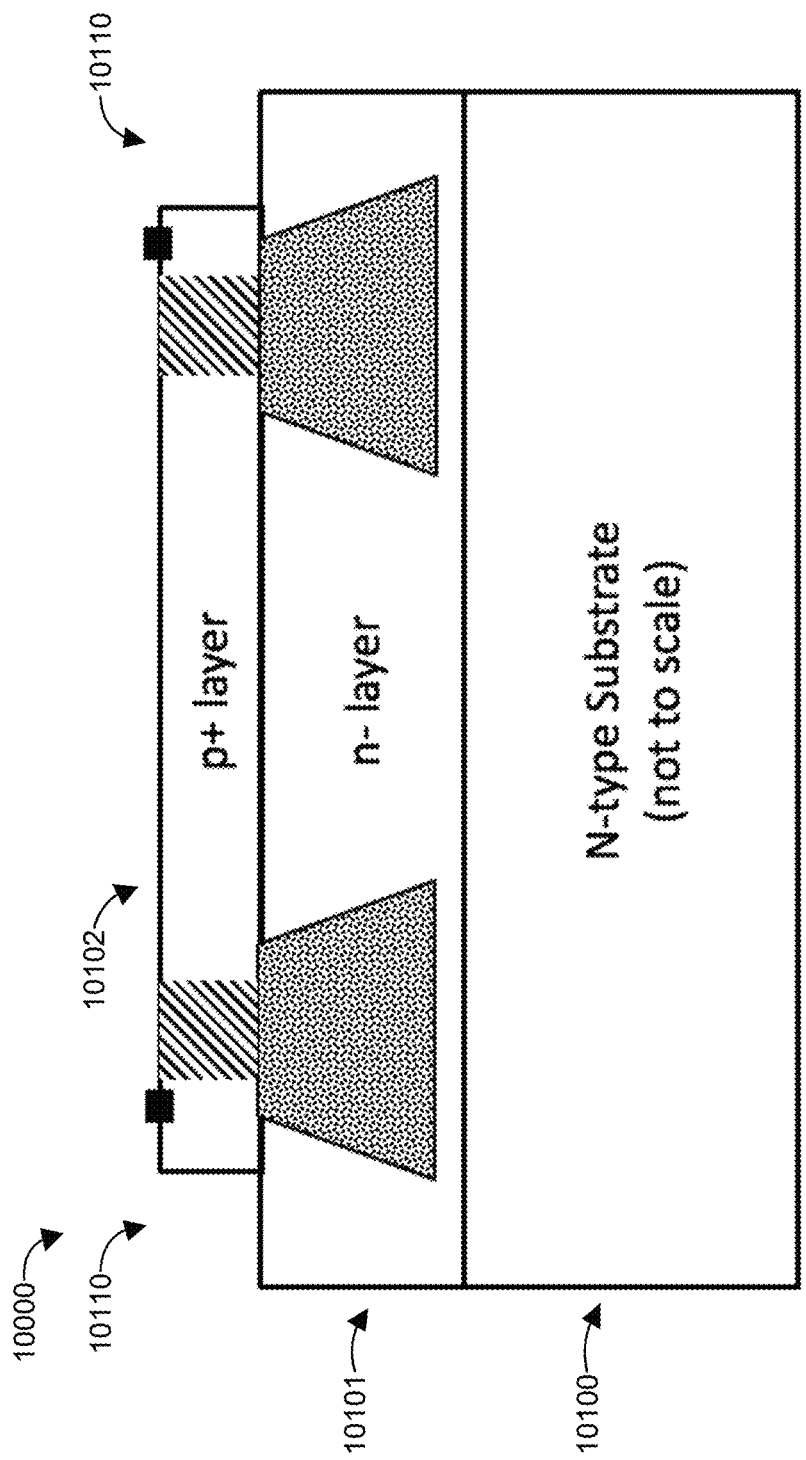
FIG. 41 is a cross section of the semiconductor device to illustrate another manufacturing step according to the seventh embodiment.

FIG. 41 is a cross section of the semiconductor device 10000 to illustrate another manufacturing step according to the seventh embodiment. In this manufacturing step, the outer portions of P+ layer 10102 are removed (e.g., etched) leaving gaps 10110. The gaps 10110 provide electrical isolation of the P+ layer 10102 and adjacent structures (e.g., adjacent semiconductor devices, which can be formed on the same N− substrate 10100). After the gaps 10110 are formed, the third masking layer 10404 is removed.

It is noted that an array of semiconductor devices 10000 can be formed in the same N− GaAs substrate 10100 according to the methods described herein.

Figure 42:
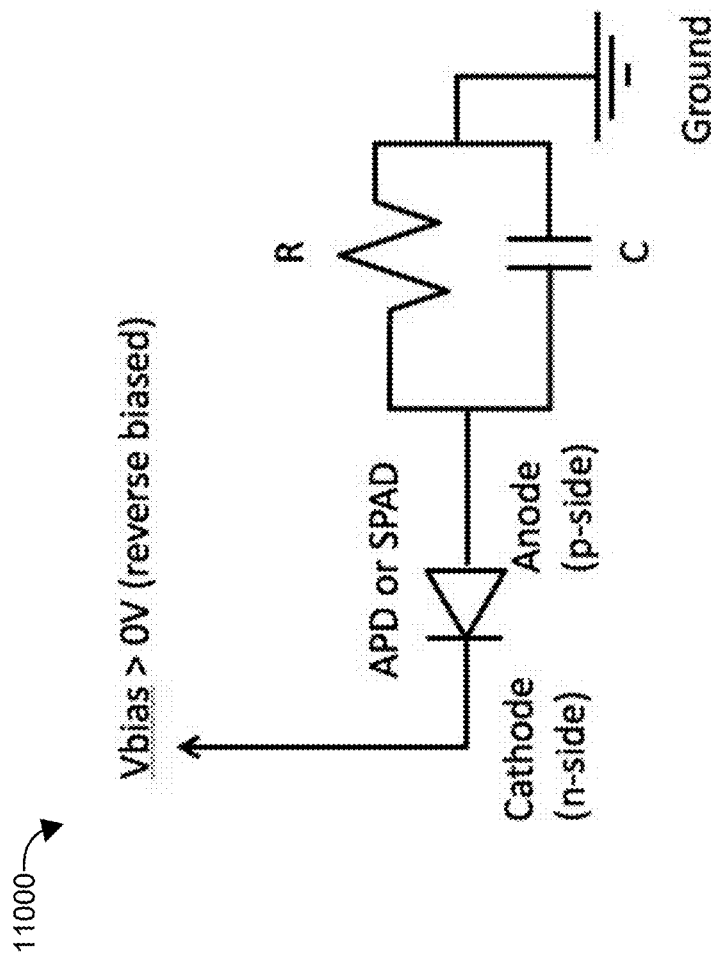
FIG. 42 is a circuit diagram that corresponds to one or more of the foregoing structures.
Figure 43:
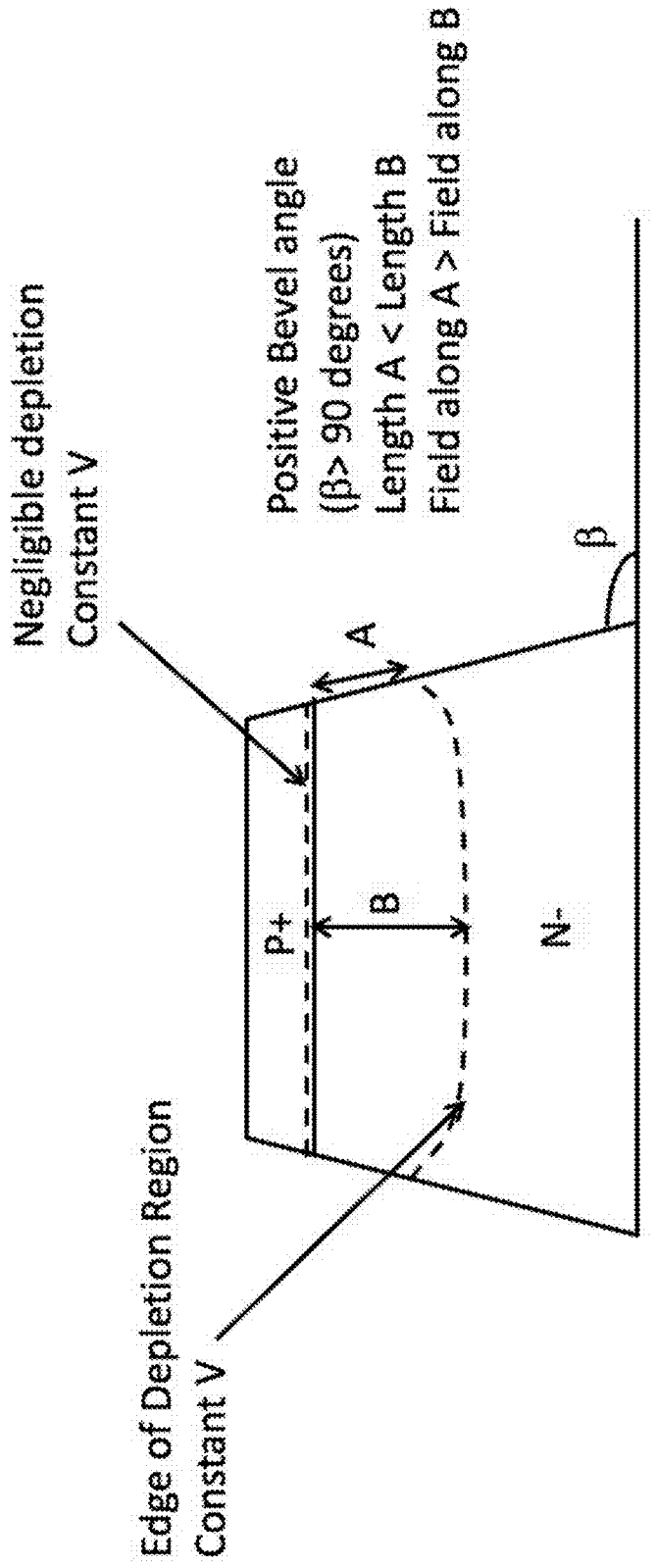
FIG. 43 illustrates an APD device according to the prior art.

FIG. 42 is a circuit diagram 11000 that corresponds to one or more of the foregoing structures. When the device operates as a SPAD, the resistor R can be between about 1 MOhm and 10 kOhm. In addition, the bypass capacitor C can be in the range of less than or equal to about twice the SPAD capacitance and greater than or equal to about 10% of the SPAD capacitance. In some embodiments, the bypass capacitor C can be 1% or smaller of the SPAD capacitance including 0% of the SPAD capacitance (i.e., the bypass capacitor C can be omitted in some embodiments). When the device is operated as a SPAD, Vbias is greater than the avalanche breakdown voltage. When the device operates as a linear mode APD, Vbias is less than the avalanche breakdown voltage. In addition, the resistor R and the bypass capacitor C can have a wider range of acceptable values when the device is designed for linear mode APD operation than when designed for SPAD operation.

While this disclosure describes individual semiconductor devices, it is noted that an array of such semiconductor devices can be formed (e.g., in the same substrate) according to the methods and structures described herein.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be apparent to those skilled in the art to which the present invention is directed upon review of the present disclosure. The claims are intended to cover such modifications and equivalents.

What is claimed is:

1. A semiconductor device comprising:
   a substrate layer;
   a first semiconductor layer doped with a first dopant disposed above said substrate layer and a second semiconductor layer doped with a second dopant, the second semiconductor layer disposed on said first semiconductor layer, said first dopant having a first dopant type opposite to a second dopant type of said second dopant;
   said first and second semiconductor layers being ion implanted with first ions in selected regions thereof, said first ions forming defined first implant isolated regions, wherein an unimplanted region is disposed between said first implant isolated regions;
   a first contact disposed above said first implanted regions of said second semiconductor layer; and
   a second contact disposed to contact said first semiconductor layer or said substrate layer;
   wherein said second semiconductor layer is truncated, thereby isolating said semiconductor device from neighboring semiconductor devices; and
   wherein the first implanted regions are implanted at negative bevel angles with respect to a planar bottom surface of said first semiconductor layer, said planar bottom surface proximal to said substrate layer, whereby said unimplanted region forms a virtual negative bevel mesa structure having angled side profiles.

2. The device of claim 1, wherein said truncated second semiconductor layer is formed by etching.

3. The device of claim 1, wherein said truncated second semiconductor layer is formed by implant isolation.

4. The semiconductor device of claim 1, wherein said second semiconductor layer is ion implanted with second ions to form defined second implanted regions in a portion of each first implanted region.

5. The semiconductor device of claim 4, wherein each second implanted region is disposed between said unimplanted region and said respective contact.

6. The semiconductor device of claim 5, wherein each said second implanted region forms a resistor and a portion of a bypass capacitor, the resistor and bypass capacitor in parallel electrically with each other.

7. The semiconductor device of claim 5, wherein said second implanted regions are insulating.

8. The semiconductor device of claim 7, further comprising a patterned metal or resistor layer disposed between each contact and said unimplanted region of said second semiconductor layer.

9. The semiconductor device of claim 4, wherein said first and second implanted regions in said second semiconductor layer form a guard ring.

10. The semiconductor device of claim 1, wherein said first semiconductor layer comprises an N– material and said second semiconductor layer comprises a P++ material.

11. The semiconductor device of claim 1, wherein said first semiconductor layer comprises a P– material and said second semiconductor layer comprises an N++ material.

* * * * *